United States Patent
Millington

(10) Patent No.: US 9,733,892 B2
(45) Date of Patent: Aug. 15, 2017

(54) OBTAINING CONTENT BASED ON CONTROL BY MULTIPLE CONTROLLERS

(71) Applicant: Sonos, Inc, Santa Barbara, CA (US)

(72) Inventor: Nicholas A. J. Millington, Santa Barbara, CA (US)

(73) Assignee: Sonos, Inc., Santa Barbara, CA (US)

( * ) Notice: Subject to any disclaimer, the term of this patent is extended or adjusted under 35 U.S.C. 154(b) by 0 days.

(21) Appl. No.: 15/088,906

(22) Filed: Apr. 1, 2016

(65) Prior Publication Data

US 2016/0216939 A1 Jul. 28, 2016

Related U.S. Application Data

(63) Continuation of application No. 13/864,249, filed on Apr. 17, 2013, which is a continuation of application
(Continued)

(51) Int. Cl.
*G06F 15/16* (2006.01)
*G06F 3/16* (2006.01)
(Continued)

(52) U.S. Cl.
CPC .............. *G06F 3/165* (2013.01); *G05B 15/02* (2013.01); *G06F 1/00* (2013.01); *G06F 1/12* (2013.01);
(Continued)

(58) Field of Classification Search
CPC ...... G06F 3/167; G06F 17/00; G06F 17/3074; G06F 3/048; G06F 3/0482; G06F 3/0484;
(Continued)

(56) References Cited

U.S. PATENT DOCUMENTS 3,956,591 A   5/1976   Gates, Jr.
4,105,974 A   8/1978   Rogers
(Continued)

FOREIGN PATENT DOCUMENTS

CA   2320451 A1   3/2001
CN   1598767 A    3/2005
(Continued)

OTHER PUBLICATIONS

Advisory Action mailed on Jun. 9, 2016, issued in connection with U.S. Appl. No. 13/871,795, filed Apr. 25, 2013, 14 pages.
(Continued)

*Primary Examiner* — Oleg Survillo
(74) *Attorney, Agent, or Firm* — McDonnell Boehnen Hulbert & Berghoff LLP

(57) ABSTRACT

A system is described for maintaining synchrony of operations among a plurality of devices that have independent clocking arrangements. The system includes a task distribution device that distributes tasks to a synchrony group comprising a plurality of devices that are to perform the tasks distributed by the task distribution device in synchrony. The task distribution device distributes each task to the members of the synchrony group over a network. Each task is associated with a time stamp that indicates a time, relative to a clock maintained by the task distribution device, at which the members of the synchrony group are to execute the task. Each member of the synchrony group periodically obtains from the task distribution device an indication of the current time indicated by its clock, determines a time differential between the task distribution device's clock and its respective clock and determines therefrom a time at which, according to its respective clock, the time stamp indicates that it is to execute the task.

20 Claims, 5 Drawing Sheets

Related U.S. Application Data

No. 13/297,000, filed on Nov. 15, 2011, now Pat. No. 9,182,777, which is a continuation of application No. 10/816,217, filed on Apr. 1, 2004, now Pat. No. 8,234,395.

(60) Provisional application No. 60/490,768, filed on Jul. 28, 2003.

(51) Int. Cl.

| | | |
|---|---|---|
| *G05B 15/02* | (2006.01) | |
| *G06F 1/00* | (2006.01) | |
| *G06F 1/12* | (2006.01) | |
| *G06F 3/048* | (2013.01) | |
| *G06F 3/0482* | (2013.01) | |
| *G06F 3/0484* | (2013.01) | |
| *G06F 17/00* | (2006.01) | |
| *G06F 17/30* | (2006.01) | |
| *G11B 20/10* | (2006.01) | |
| *H03G 3/00* | (2006.01) | |
| *H03G 3/20* | (2006.01) | |
| *H04H 20/10* | (2008.01) | |
| *H04H 20/26* | (2008.01) | |
| *H04J 3/06* | (2006.01) | |
| *H04L 12/28* | (2006.01) | |
| *H04L 29/06* | (2006.01) | |
| *H04L 29/08* | (2006.01) | |
| *H04N 5/04* | (2006.01) | |
| *H04N 9/79* | (2006.01) | |
| *H04N 21/43* | (2011.01) | |
| *H04N 21/436* | (2011.01) | |
| *H04R 3/12* | (2006.01) | |
| *H04R 27/00* | (2006.01) | |
| *H04W 56/00* | (2009.01) | |
| *H04W 84/20* | (2009.01) | |

(52) U.S. Cl.
CPC ............ *G06F 3/048* (2013.01); *G06F 3/0482* (2013.01); *G06F 3/0484* (2013.01); *G06F 3/04842* (2013.01); *G06F 3/04847* (2013.01); *G06F 3/16* (2013.01); *G06F 3/162* (2013.01); *G06F 3/167* (2013.01); *G06F 17/00* (2013.01); *G06F 17/3074* (2013.01); *G06F 17/30749* (2013.01); *G06F 17/30761* (2013.01); *G11B 20/10527* (2013.01); *H03G 3/00* (2013.01); *H03G 3/20* (2013.01); *H04H 20/103* (2013.01); *H04H 20/26* (2013.01); *H04J 3/0664* (2013.01); *H04L 12/2854* (2013.01); *H04L 65/1069* (2013.01); *H04L 65/4069* (2013.01); *H04L 65/4076* (2013.01); *H04L 65/4084* (2013.01); *H04L 65/4092* (2013.01); *H04L 65/60* (2013.01); *H04L 65/601* (2013.01); *H04L 65/80* (2013.01); *H04L 67/1095* (2013.01); *H04L 67/12* (2013.01); *H04L 67/26* (2013.01); *H04L 69/28* (2013.01); *H04N 5/04* (2013.01); *H04N 9/7904* (2013.01); *H04N 21/4307* (2013.01); *H04N 21/43615* (2013.01); *H04R 3/12* (2013.01); *H04R 27/00* (2013.01); *H04W 56/0015* (2013.01); *G11B 2020/10592* (2013.01); *H04H 2201/20* (2013.01); *H04R 2227/003* (2013.01); *H04R 2227/005* (2013.01); *H04W 84/20* (2013.01)

(58) Field of Classification Search
CPC . G06F 3/126; G06F 3/16; H04L 65/60; H04L 12/2812

USPC ......................................... 709/219, 220, 231
See application file for complete search history.

(56) References Cited

U.S. PATENT DOCUMENTS

| | | |
|---|---|---|
| D260,764 S | 9/1981 | Castagna et al. |
| 4,296,278 A | 10/1981 | Cullison et al. |
| 4,306,114 A | 12/1981 | Callahan |
| 4,509,211 A | 4/1985 | Robbins |
| D279,779 S | 7/1985 | Taylor |
| 4,530,091 A | 7/1985 | Crockett |
| 4,696,037 A | 9/1987 | Fierens |
| 4,701,629 A | 10/1987 | Citroen |
| 4,712,105 A | 12/1987 | Koehler |
| D293,671 S | 1/1988 | Beaumont |
| 4,731,814 A | 3/1988 | Becker et al. |
| 4,816,989 A | 3/1989 | Finn et al. |
| 4,824,059 A | 4/1989 | Butler |
| D301,037 S | 5/1989 | Matsuda |
| 4,845,751 A | 7/1989 | Schwab |
| D304,443 S | 11/1989 | Grinyer et al. |
| D313,023 S | 12/1990 | Kolenda et al. |
| D313,398 S | 1/1991 | Gilchrist |
| D313,600 S | 1/1991 | Weber |
| 4,994,908 A | 2/1991 | Kuban et al. |
| D320,598 S | 10/1991 | Auerbach et al. |
| D322,609 S | 12/1991 | Patton |
| 5,086,385 A | 2/1992 | Launey et al. |
| D326,450 S | 5/1992 | Watanabe |
| D327,060 S | 6/1992 | Wachob et al. |
| 5,151,922 A | 9/1992 | Weiss |
| 5,153,579 A | 10/1992 | Fisch et al. |
| D331,388 S | 12/1992 | Dahnert et al. |
| 5,182,552 A | 1/1993 | Paynting |
| D333,135 S | 2/1993 | Wachob et al. |
| 5,185,680 A | 2/1993 | Kakubo |
| 5,198,603 A | 3/1993 | Nishikawa et al. |
| 5,237,327 A | 8/1993 | Saitoh et al. |
| 5,239,458 A | 8/1993 | Suzuki |
| 5,272,757 A | 12/1993 | Scofield et al. |
| 5,299,266 A | 3/1994 | Lumsden |
| D350,531 S | 9/1994 | Tsuji |
| D350,962 S | 9/1994 | Reardon et al. |
| 5,361,381 A | 11/1994 | Short |
| 5,372,441 A | 12/1994 | Louis |
| D354,059 S | 1/1995 | Hendricks |
| D354,751 S | 1/1995 | Hersh et al. |
| D356,093 S | 3/1995 | McCauley et al. |
| D356,312 S | 3/1995 | Althans |
| D357,024 S | 4/1995 | Tokiyama et al. |
| 5,406,634 A | 4/1995 | Anderson et al. |
| 5,430,485 A | 7/1995 | Lankford et al. |
| 5,440,644 A | 8/1995 | Farinelli et al. |
| D362,446 S | 9/1995 | Gasiorek et al. |
| 5,457,448 A | 10/1995 | Totsuka et al. |
| D363,933 S | 11/1995 | Starck |
| 5,467,342 A | 11/1995 | Logston et al. |
| D364,877 S | 12/1995 | Tokiyama et al. |
| D364,878 S | 12/1995 | Green et al. |
| D365,102 S | 12/1995 | Gioscia |
| D366,044 S | 1/1996 | Hara et al. |
| 5,481,251 A | 1/1996 | Buys et al. |
| 5,491,839 A | 2/1996 | Schotz |
| 5,515,345 A | 5/1996 | Barreira et al. |
| 5,533,021 A | 7/1996 | Branstad et al. |
| D372,716 S | 8/1996 | Thorne |
| 5,553,147 A | 9/1996 | Pineau |
| 5,553,222 A | 9/1996 | Milne et al. |
| 5,553,314 A | 9/1996 | Grube et al. |
| D377,651 S | 1/1997 | Biasotti et al. |
| 5,596,696 A | 1/1997 | Tindell et al. |
| 5,602,992 A | 2/1997 | Danneels |
| 5,623,483 A | 4/1997 | Agrawal et al. |
| 5,625,350 A | 4/1997 | Fukatsu et al. |
| 5,633,871 A | 5/1997 | Bloks |
| D379,816 S | 6/1997 | Laituri et al. |
| 5,640,388 A | 6/1997 | Woodhead et al. |

(56) References Cited

U.S. PATENT DOCUMENTS

| | | |
|---|---|---|
| D380,752 S | 7/1997 | Hanson |
| 5,652,749 A | 7/1997 | Davenport et al. |
| D382,271 S | 8/1997 | Akwiwu |
| 5,661,665 A | 8/1997 | Glass et al. |
| 5,661,728 A | 8/1997 | Finotello et al. |
| 5,668,884 A | 9/1997 | Clair, Jr. et al. |
| 5,673,323 A | 9/1997 | Schotz et al. |
| D384,940 S | 10/1997 | Kono et al. |
| D387,352 S | 12/1997 | Kaneko et al. |
| 5,696,896 A | 12/1997 | Badovinatz et al. |
| D388,792 S | 1/1998 | Nykerk |
| D389,143 S | 1/1998 | Wicks |
| D392,641 S | 3/1998 | Fenner |
| 5,726,989 A | 3/1998 | Dokic |
| D393,628 S | 4/1998 | Ledbetter et al. |
| 5,740,235 A | 4/1998 | Lester et al. |
| 5,742,623 A | 4/1998 | Nuber et al. |
| D394,659 S | 5/1998 | Biasotti et al. |
| 5,751,819 A | 5/1998 | Dorrough |
| 5,761,320 A | 6/1998 | Farinelli et al. |
| 5,774,016 A | 6/1998 | Ketterer |
| D395,889 S | 7/1998 | Gerba et al. |
| 5,787,249 A | 7/1998 | Badovinatz et al. |
| 5,790,543 A | 8/1998 | Cloutier |
| D397,996 S | 9/1998 | Smith |
| 5,808,662 A | 9/1998 | Kinney et al. |
| 5,812,201 A | 9/1998 | Yoo |
| 5,815,689 A | 9/1998 | Shaw et al. |
| 5,818,948 A | 10/1998 | Gulick |
| D401,587 S | 11/1998 | Rudolph |
| 5,832,024 A | 11/1998 | Schotz et al. |
| 5,838,909 A | 11/1998 | Roy et al. |
| 5,848,152 A | 12/1998 | Slipy et al. |
| 5,852,722 A | 12/1998 | Hamilton |
| D404,741 S | 1/1999 | Schumaker et al. |
| D405,071 S | 2/1999 | Gambaro |
| 5,867,691 A | 2/1999 | Shiraishi |
| 5,875,233 A | 2/1999 | Cox |
| 5,875,354 A | 2/1999 | Charlton et al. |
| D406,847 S | 3/1999 | Gerba et al. |
| D407,071 S | 3/1999 | Keating |
| 5,887,143 A | 3/1999 | Saito et al. |
| 5,905,768 A | 5/1999 | Maturi et al. |
| D410,927 S | 6/1999 | Yamagishi |
| 5,917,830 A | 6/1999 | Chen et al. |
| D412,337 S | 7/1999 | Hamano |
| 5,923,869 A | 7/1999 | Kashiwagi et al. |
| 5,923,902 A | 7/1999 | Inagaki |
| 5,946,343 A | 8/1999 | Schotz et al. |
| 5,956,025 A | 9/1999 | Goulden et al. |
| 5,956,088 A | 9/1999 | Shen et al. |
| 5,960,006 A | 9/1999 | Maturi et al. |
| D415,496 S | 10/1999 | Gerba et al. |
| D416,021 S | 11/1999 | Godette et al. |
| 5,984,512 A | 11/1999 | Jones et al. |
| 5,987,611 A | 11/1999 | Freund |
| 5,990,884 A | 11/1999 | Douma et al. |
| 5,991,307 A | 11/1999 | Komuro et al. |
| 5,999,906 A | 12/1999 | Mercs et al. |
| 6,009,457 A | 12/1999 | Moller |
| 6,018,376 A | 1/2000 | Nakatani |
| D420,006 S | 2/2000 | Tonino |
| 6,026,150 A | 2/2000 | Frank et al. |
| 6,029,196 A | 2/2000 | Lenz |
| 6,031,818 A | 2/2000 | Lo et al. |
| 6,032,202 A | 2/2000 | Lea et al. |
| 6,038,614 A | 3/2000 | Chan et al. |
| 6,046,550 A | 4/2000 | Ference et al. |
| 6,061,457 A | 5/2000 | Stockhamer |
| 6,078,725 A | 6/2000 | Tanaka |
| 6,081,266 A | 6/2000 | Sciammarella |
| 6,088,063 A | 7/2000 | Shiba |
| D429,246 S | 8/2000 | Holma |
| D430,143 S | 8/2000 | Renk |
| 6,101,195 A | 8/2000 | Lyons et al. |
| 6,108,485 A | 8/2000 | Kim |
| 6,108,686 A | 8/2000 | Williams, Jr. |
| 6,122,668 A | 9/2000 | Teng et al. |
| D431,552 S | 10/2000 | Backs et al. |
| D432,525 S | 10/2000 | Beecroft |
| 6,127,941 A | 10/2000 | Van Ryzin |
| 6,128,318 A | 10/2000 | Sato |
| 6,148,205 A | 11/2000 | Cotton |
| 6,154,772 A | 11/2000 | Dunn et al. |
| 6,157,957 A | 12/2000 | Berthaud |
| 6,163,647 A | 12/2000 | Terashima et al. |
| 6,169,725 B1 | 1/2001 | Gibbs et al. |
| 6,175,872 B1 | 1/2001 | Neumann et al. |
| 6,181,383 B1 | 1/2001 | Fox et al. |
| 6,185,737 B1 | 2/2001 | Northcutt et al. |
| 6,195,435 B1 | 2/2001 | Kitamura |
| 6,195,436 B1 | 2/2001 | Scibora et al. |
| 6,199,169 B1 | 3/2001 | Voth |
| 6,212,282 B1 | 4/2001 | Mershon |
| 6,246,701 B1 | 6/2001 | Slattery |
| 6,253,293 B1 | 6/2001 | Rao et al. |
| D444,475 S | 7/2001 | Levey et al. |
| 6,255,961 B1 | 7/2001 | Van Ryzin et al. |
| 6,256,554 B1 | 7/2001 | DiLorenzo |
| 6,269,406 B1 | 7/2001 | Dutcher et al. |
| 6,301,012 B1 | 10/2001 | White et al. |
| 6,308,207 B1 | 10/2001 | Tseng et al. |
| 6,310,652 B1 | 10/2001 | Li et al. |
| 6,313,879 B1 | 11/2001 | Kubo et al. |
| 6,321,252 B1 | 11/2001 | Bhola et al. |
| 6,324,586 B1 | 11/2001 | Johnson |
| D452,520 S | 12/2001 | Gotham et al. |
| 6,332,147 B1 | 12/2001 | Moran et al. |
| 6,343,028 B1 | 1/2002 | Kuwaoka |
| 6,349,285 B1 | 2/2002 | Liu et al. |
| 6,349,339 B1 | 2/2002 | Williams |
| 6,351,821 B1 | 2/2002 | Voth |
| 6,353,172 B1 | 3/2002 | Fay et al. |
| 6,356,871 B1 | 3/2002 | Hemkumar et al. |
| 6,404,811 B1 | 6/2002 | Cvetko et al. |
| 6,418,150 B1 | 7/2002 | Staats |
| 6,430,353 B1 | 8/2002 | Honda et al. |
| 6,442,443 B1 | 8/2002 | Fujii et al. |
| D462,339 S | 9/2002 | Allen et al. |
| D462,340 S | 9/2002 | Allen et al. |
| D462,945 S | 9/2002 | Skulley |
| 6,446,080 B1 | 9/2002 | Van Ryzin et al. |
| 6,449,642 B2 | 9/2002 | Bourke-Dunphy et al. |
| 6,449,653 B2 | 9/2002 | Klemets et al. |
| 6,456,783 B1 | 9/2002 | Ando et al. |
| 6,463,474 B1 | 10/2002 | Fuh et al. |
| 6,466,832 B1 | 10/2002 | Zuqert et al. |
| 6,469,633 B1 | 10/2002 | Wachter |
| D466,108 S | 11/2002 | Glodava et al. |
| 6,487,296 B1 | 11/2002 | Allen et al. |
| 6,493,832 B1 | 12/2002 | Itakura et al. |
| D468,297 S | 1/2003 | Ikeda |
| 6,522,886 B1 | 2/2003 | Youngs et al. |
| 6,526,325 B1 | 2/2003 | Sussman et al. |
| 6,526,411 B1 | 2/2003 | Ward |
| 6,535,121 B2 | 3/2003 | Mathney et al. |
| D474,763 S | 5/2003 | Tozaki et al. |
| D475,993 S | 6/2003 | Meyer |
| D476,643 S | 7/2003 | Yamagishi |
| D477,310 S | 7/2003 | Moransais |
| 6,587,127 B1 | 7/2003 | Leeke et al. |
| 6,598,172 B1 | 7/2003 | VanDeusen et al. |
| D478,051 S | 8/2003 | Sagawa |
| D478,069 S | 8/2003 | Beck et al. |
| D478,896 S | 8/2003 | Summers |
| 6,611,537 B1 | 8/2003 | Edens et al. |
| 6,611,813 B1 | 8/2003 | Bratton |
| D479,520 S | 9/2003 | De Saulles |
| D481,056 S | 10/2003 | Kawasaki et al. |
| 6,631,410 B1 | 10/2003 | Kowalski et al. |
| 6,636,269 B1 | 10/2003 | Baldwin |
| 6,653,899 B2 | 11/2003 | Organvidez et al. |
| 6,654,720 B1 | 11/2003 | Graham et al. |
| 6,654,956 B1 | 11/2003 | Trinh et al. |

(56) References Cited

U.S. PATENT DOCUMENTS

| | | |
|---|---|---|
| 6,658,091 B1 | 12/2003 | Naidoo et al. |
| 6,674,803 B1 | 1/2004 | Kesselring |
| 6,684,060 B1 | 1/2004 | Curtin |
| D486,145 S | 2/2004 | Kaminski et al. |
| 6,687,664 B1 | 2/2004 | Sussman et al. |
| 6,704,421 B1 | 3/2004 | Kitamura |
| 6,741,961 B2 | 5/2004 | Lim |
| D491,925 S | 6/2004 | Griesau et al. |
| 6,757,517 B2 | 6/2004 | Chang |
| D493,148 S | 7/2004 | Shibata et al. |
| 6,763,274 B1 | 7/2004 | Gilbert |
| D495,333 S | 8/2004 | Borsboom |
| 6,778,073 B2 | 8/2004 | Lutter et al. |
| 6,778,493 B1 | 8/2004 | Ishii |
| 6,778,869 B2 | 8/2004 | Champion |
| D496,003 S | 9/2004 | Spira |
| D496,005 S | 9/2004 | Wang |
| D496,335 S | 9/2004 | Spira |
| D497,363 S | 10/2004 | Olson et al. |
| 6,803,964 B1 | 10/2004 | Post et al. |
| 6,809,635 B1 | 10/2004 | Kaaresoja |
| D499,086 S | 11/2004 | Polito |
| 6,816,510 B1 | 11/2004 | Banerjee |
| 6,816,818 B2 | 11/2004 | Wolf et al. |
| 6,823,225 B1 | 11/2004 | Sass |
| 6,826,283 B1 | 11/2004 | Wheeler et al. |
| D499,395 S | 12/2004 | Hsu |
| D499,718 S | 12/2004 | Chen |
| D500,015 S | 12/2004 | Gubbe |
| 6,836,788 B2 | 12/2004 | Kim et al. |
| 6,839,752 B1 | 1/2005 | Miller et al. |
| D501,477 S | 2/2005 | Hall |
| 6,859,460 B1 | 2/2005 | Chen |
| 6,859,538 B1 | 2/2005 | Voltz |
| 6,873,862 B2 | 3/2005 | Reshefsky |
| 6,882,335 B2 | 4/2005 | Saarinen |
| D504,872 S | 5/2005 | Uehara et al. |
| D504,885 S | 5/2005 | Zhang et al. |
| 6,898,642 B2 | 5/2005 | Chafle et al. |
| 6,901,439 B1 | 5/2005 | Bonasia et al. |
| D506,463 S | 6/2005 | Daniels |
| 6,907,458 B2 | 6/2005 | Tomassetti et al. |
| 6,912,610 B2 | 6/2005 | Spencer |
| 6,915,347 B2 | 7/2005 | Hanko et al. |
| 6,917,592 B1 | 7/2005 | Ramankutty et al. |
| 6,919,771 B2 | 7/2005 | Nakajima |
| 6,920,373 B2 | 7/2005 | Xi et al. |
| 6,931,557 B2 | 8/2005 | Togawa |
| 6,934,766 B1 | 8/2005 | Russell |
| 6,937,988 B1 | 8/2005 | Hemkumar et al. |
| 6,970,482 B2 | 11/2005 | Kim |
| 6,985,694 B1 | 1/2006 | De Bonet et al. |
| 6,987,767 B2 | 1/2006 | Saito |
| D515,072 S | 2/2006 | Lee |
| D515,557 S | 2/2006 | Okuley |
| 7,006,758 B1 | 2/2006 | Yamamoto et al. |
| 7,007,106 B1 | 2/2006 | Flood et al. |
| 7,020,791 B1 | 3/2006 | Aweya et al. |
| D518,475 S | 4/2006 | Yang et al. |
| 7,043,477 B2 | 5/2006 | Mercer et al. |
| 7,043,651 B2 | 5/2006 | Aweya et al. |
| 7,046,677 B2 | 5/2006 | Monta et al. |
| 7,047,308 B2 | 5/2006 | Deshpande |
| 7,054,888 B2 | 5/2006 | LaChapelle et al. |
| 7,058,889 B2 | 6/2006 | Trovato et al. |
| 7,068,596 B1 | 6/2006 | Mou |
| D524,296 S | 7/2006 | Kita |
| D527,375 S | 8/2006 | Flora et al. |
| 7,092,528 B2 | 8/2006 | Patrick et al. |
| 7,092,694 B2 | 8/2006 | Griep et al. |
| 7,096,169 B2 | 8/2006 | Crutchfield et al. |
| 7,113,999 B2 | 9/2006 | Pestoni et al. |
| 7,115,017 B1 | 10/2006 | Laursen et al. |
| 7,120,168 B2 | 10/2006 | Zimmermann |
| 7,130,316 B2 | 10/2006 | Kovacevic |
| 7,130,368 B1 | 10/2006 | Aweya et al. |
| 7,130,608 B2 | 10/2006 | Hollstrom et al. |
| 7,130,616 B2 | 10/2006 | Janik |
| 7,136,934 B2 | 11/2006 | Carter et al. |
| 7,139,981 B2 | 11/2006 | Mayer et al. |
| 7,143,141 B1 | 11/2006 | Morgan et al. |
| 7,143,939 B2 | 12/2006 | Henzerling |
| 7,146,260 B2 | 12/2006 | Preston et al. |
| 7,158,488 B2 | 1/2007 | Fujimori |
| 7,161,939 B2 | 1/2007 | Israel et al. |
| 7,162,315 B2 | 1/2007 | Gilbert |
| 7,185,090 B2 | 2/2007 | Kowalski et al. |
| 7,187,947 B1 | 3/2007 | White et al. |
| 7,188,353 B1 | 3/2007 | Crinon |
| 7,197,148 B2 | 3/2007 | Nourse et al. |
| 7,206,367 B1 | 4/2007 | Moore |
| 7,206,618 B2 | 4/2007 | Latto et al. |
| 7,206,967 B1 | 4/2007 | Marti et al. |
| 7,209,795 B2 | 4/2007 | Sullivan et al. |
| 7,218,708 B2 | 5/2007 | Berezowski et al. |
| 7,236,739 B2 | 6/2007 | Chang |
| 7,236,773 B2 | 6/2007 | Thomas |
| 7,257,398 B1 | 8/2007 | Ukita et al. |
| 7,260,616 B1 | 8/2007 | Cook |
| 7,263,110 B2 | 8/2007 | Fujishiro |
| 7,277,547 B1 | 10/2007 | Delker et al. |
| 7,286,652 B1 | 10/2007 | Azriel et al. |
| 7,289,631 B2 | 10/2007 | Ishidoshiro |
| 7,293,060 B2 | 11/2007 | Komsi |
| 7,295,548 B2 | 11/2007 | Blank et al. |
| 7,305,694 B2 | 12/2007 | Commons et al. |
| 7,308,188 B2 | 12/2007 | Namatame |
| 7,310,334 B1 | 12/2007 | Fitzgerald et al. |
| 7,312,785 B2 | 12/2007 | Tsuk et al. |
| 7,313,593 B1 | 12/2007 | Pulito et al. |
| 7,319,764 B1 | 1/2008 | Reid et al. |
| 7,324,857 B2 | 1/2008 | Goddard |
| 7,330,875 B1 | 2/2008 | Parasnis et al. |
| 7,333,519 B2 | 2/2008 | Sullivan et al. |
| 7,356,011 B1 | 4/2008 | Waters et al. |
| 7,359,006 B1 | 4/2008 | Xiang et al. |
| 7,366,206 B2 | 4/2008 | Lockridge et al. |
| 7,372,846 B2 | 5/2008 | Zwack |
| 7,391,791 B2 | 6/2008 | Balassanian et al. |
| 7,392,102 B2 | 6/2008 | Sullivan et al. |
| 7,392,481 B2 | 6/2008 | Gewickey et al. |
| 7,400,644 B2 | 7/2008 | Sakamoto et al. |
| 7,412,499 B2 | 8/2008 | Chang et al. |
| 7,428,310 B2 | 9/2008 | Park |
| 7,430,181 B1 | 9/2008 | Hong |
| 7,457,948 B1 | 11/2008 | Bilicksa et al. |
| 7,472,058 B2 | 12/2008 | Tseng et al. |
| 7,474,677 B2 | 1/2009 | Trott |
| 7,483,538 B2 | 1/2009 | McCarty et al. |
| 7,483,540 B2 | 1/2009 | Rabinowitz et al. |
| 7,483,958 B1 | 1/2009 | Elabbady et al. |
| 7,492,912 B2 | 2/2009 | Chung et al. |
| 7,505,889 B2 | 3/2009 | Salmonsen et al. |
| 7,509,181 B2 | 3/2009 | Champion |
| 7,519,667 B1 | 4/2009 | Capps |
| 7,548,744 B2 | 6/2009 | Oesterling et al. |
| 7,548,851 B1 | 6/2009 | Lau et al. |
| 7,558,224 B1 | 7/2009 | Surazski et al. |
| 7,558,635 B1 | 7/2009 | Thiel et al. |
| 7,571,014 B1 | 8/2009 | Lambourne et al. |
| 7,574,274 B2 | 8/2009 | Holmes |
| 7,599,685 B2 | 10/2009 | Goldberg et al. |
| 7,606,174 B2 | 10/2009 | Ochi et al. |
| 7,627,825 B2 | 12/2009 | Kakuda |
| 7,630,501 B2 | 12/2009 | Blank et al. |
| 7,631,119 B2 | 12/2009 | Moore et al. |
| 7,643,894 B2 | 1/2010 | Braithwaite et al. |
| 7,653,344 B1 | 1/2010 | Feldman et al. |
| 7,657,224 B2 | 2/2010 | Goldberg et al. |
| 7,657,644 B1 | 2/2010 | Zheng |
| 7,657,910 B1 | 2/2010 | McAulay et al. |
| 7,665,115 B2 | 2/2010 | Gallo et al. |
| 7,668,990 B2 | 2/2010 | Krzyzanowski et al. |
| 7,669,113 B1 | 2/2010 | Moore et al. |

(56) References Cited

U.S. PATENT DOCUMENTS

| | | |
|---|---|---|
| 7,669,219 B2 | 2/2010 | Scott, III |
| 7,672,470 B2 | 3/2010 | Lee |
| 7,675,943 B2 | 3/2010 | Mosig |
| 7,676,044 B2 | 3/2010 | Sasaki et al. |
| 7,676,142 B1 | 3/2010 | Hung |
| 7,688,306 B2 | 3/2010 | Wehrenberg et al. |
| 7,689,304 B2 | 3/2010 | Sasaki |
| 7,689,305 B2 | 3/2010 | Kreifeldt et al. |
| 7,702,279 B2 | 4/2010 | Ko et al. |
| 7,702,403 B1 | 4/2010 | Gladwin et al. |
| 7,710,941 B2 | 5/2010 | Rietschel et al. |
| 7,711,774 B1 | 5/2010 | Rothschild |
| 7,720,096 B2 | 5/2010 | Klemets |
| 7,721,032 B2 | 5/2010 | Bushell et al. |
| 7,742,740 B2 | 6/2010 | Goldberg et al. |
| 7,743,009 B2 | 6/2010 | Hangartner et al. |
| 7,746,906 B2 | 6/2010 | Jinzaki et al. |
| 7,756,743 B1 | 7/2010 | Lapcevic |
| 7,761,176 B2 | 7/2010 | Ben-Yaacov et al. |
| 7,765,315 B2 | 7/2010 | Batson et al. |
| RE41,608 E | 8/2010 | Blair et al. |
| 7,793,206 B2 | 9/2010 | Lim et al. |
| 7,827,259 B2 | 11/2010 | Heller et al. |
| 7,831,054 B2 | 11/2010 | Ball et al. |
| 7,835,689 B2 | 11/2010 | Goldberg et al. |
| 7,853,341 B2 | 12/2010 | McCarty et al. |
| 7,865,137 B2 | 1/2011 | Goldberg et al. |
| 7,882,234 B2 | 2/2011 | Watanabe et al. |
| 7,885,622 B2 | 2/2011 | Krampf et al. |
| 7,907,819 B2 | 3/2011 | Ando et al. |
| 7,916,877 B2 | 3/2011 | Goldberg et al. |
| 7,917,082 B2 | 3/2011 | Goldberg et al. |
| 7,933,418 B2 | 4/2011 | Morishima |
| 7,934,239 B1 | 4/2011 | Dagman |
| 7,945,143 B2 | 5/2011 | Yahata et al. |
| 7,945,636 B2 | 5/2011 | Nelson et al. |
| 7,945,708 B2 | 5/2011 | Ohkita |
| 7,958,441 B2 | 6/2011 | Heller et al. |
| 7,966,388 B1 | 6/2011 | Pugaczewski et al. |
| 7,987,294 B2 | 7/2011 | Bryce et al. |
| 7,995,732 B2 | 8/2011 | Koch et al. |
| 7,996,566 B1 | 8/2011 | Sylvain et al. |
| 7,996,588 B2 | 8/2011 | Subbiah et al. |
| 8,014,423 B2 | 9/2011 | Thaler et al. |
| 8,015,306 B2 | 9/2011 | Bowman |
| 8,020,023 B2 | 9/2011 | Millington et al. |
| 8,023,663 B2 | 9/2011 | Goldberg |
| 8,028,038 B2 | 9/2011 | Weel |
| 8,028,323 B2 | 9/2011 | Weel |
| 8,041,062 B2 | 10/2011 | Cohen et al. |
| 8,045,721 B2 | 10/2011 | Burgan et al. |
| 8,045,952 B2 | 10/2011 | Qureshey et al. |
| 8,050,203 B2 | 11/2011 | Jacobsen et al. |
| 8,050,652 B2 | 11/2011 | Qureshey et al. |
| 8,055,364 B2 | 11/2011 | Champion |
| 8,074,253 B1 | 12/2011 | Nathan |
| 8,086,752 B2 | 12/2011 | Millington et al. |
| 8,090,317 B2 | 1/2012 | Burge et al. |
| 8,103,009 B2 | 1/2012 | McCarty et al. |
| 8,111,132 B2 | 2/2012 | Allen et al. |
| 8,112,032 B2 | 2/2012 | Ko et al. |
| 8,116,476 B2 | 2/2012 | Inohara |
| 8,126,172 B2 | 2/2012 | Horbach et al. |
| 8,131,390 B2 | 3/2012 | Braithwaite et al. |
| 8,144,883 B2 | 3/2012 | Pdersen et al. |
| 8,148,622 B2 | 4/2012 | Rothkopf et al. |
| 8,150,079 B2 | 4/2012 | Maeda et al. |
| 8,169,938 B2 | 5/2012 | Duchscher et al. |
| 8,170,222 B2 | 5/2012 | Dunko |
| 8,170,260 B2 | 5/2012 | Reining et al. |
| 8,175,297 B1 | 5/2012 | Ho et al. |
| 8,185,674 B2 | 5/2012 | Moore et al. |
| 8,194,874 B2 | 6/2012 | Starobin et al. |
| 8,204,890 B1 | 6/2012 | Gogan |
| 8,208,653 B2 | 6/2012 | Eo et al. |
| 8,214,447 B2 | 7/2012 | Deslippe et al. |
| 8,214,740 B2 | 7/2012 | Johnson |
| 8,214,873 B2 | 7/2012 | Weel |
| 8,218,790 B2 | 7/2012 | Bull et al. |
| 8,230,099 B2 | 7/2012 | Weel |
| 8,233,029 B2 | 7/2012 | Yoshida et al. |
| 8,233,648 B2 | 7/2012 | Sorek et al. |
| 8,234,395 B2 | 7/2012 | Millington et al. |
| 8,239,748 B1 | 8/2012 | Moore et al. |
| 8,279,709 B2 | 10/2012 | Choisel et al. |
| 8,281,001 B2 | 10/2012 | Busam et al. |
| 8,285,404 B1 | 10/2012 | Kekki |
| 8,290,603 B1 | 10/2012 | Lambourne |
| 8,300,845 B2 | 10/2012 | Zurek et al. |
| 8,311,226 B2 | 11/2012 | Lorgeoux et al. |
| 8,315,555 B2 | 11/2012 | Ko et al. |
| 8,316,147 B2 | 11/2012 | Batson et al. |
| 8,325,931 B2 | 12/2012 | Howard et al. |
| 8,340,330 B2 | 12/2012 | Yoon et al. |
| 8,345,709 B2 | 1/2013 | Nitzpon et al. |
| 8,364,295 B2 | 1/2013 | Beckmann et al. |
| 8,370,678 B2 | 2/2013 | Millington et al. |
| 8,374,595 B2 | 2/2013 | Chien et al. |
| 8,407,623 B2 | 3/2013 | Kerr et al. |
| 8,411,883 B2 | 4/2013 | Matsumoto |
| 8,423,659 B2 | 4/2013 | Millington |
| 8,423,893 B2 | 4/2013 | Ramsay et al. |
| 8,432,851 B2 | 4/2013 | Xu et al. |
| 8,433,076 B2 | 4/2013 | Zurek et al. |
| 8,442,239 B2 | 5/2013 | Bruelle-Drews et al. |
| 8,457,334 B2 | 6/2013 | Yoon et al. |
| 8,463,184 B2 | 6/2013 | Dua |
| 8,463,875 B2 | 6/2013 | Katz et al. |
| 8,473,844 B2 | 6/2013 | Kreifeldt et al. |
| 8,477,958 B2 | 7/2013 | Moeller et al. |
| 8,483,853 B1 | 7/2013 | Lambourne |
| 8,509,211 B2 | 8/2013 | Trotter et al. |
| 8,520,870 B2 | 8/2013 | Sato et al. |
| 8,565,455 B2 | 10/2013 | Worrell et al. |
| 8,577,048 B2 | 11/2013 | Chaikin et al. |
| 8,588,949 B2 | 11/2013 | Lambourne et al. |
| 8,600,084 B1 | 12/2013 | Garrett |
| 8,611,559 B2 | 12/2013 | Sanders |
| 8,615,091 B2 | 12/2013 | Terwal |
| 8,639,830 B2 | 1/2014 | Bowman |
| 8,654,995 B2 | 2/2014 | Silber et al. |
| 8,672,744 B1 | 3/2014 | Gronkowski et al. |
| 8,683,009 B2 | 3/2014 | Ng et al. |
| 8,731,206 B1 | 5/2014 | Park |
| 8,750,282 B2 | 6/2014 | Gelter et al. |
| 8,751,026 B2 | 6/2014 | Sato et al. |
| 8,762,565 B2 | 6/2014 | Togashi et al. |
| 8,775,546 B2 | 7/2014 | Millington |
| 8,818,538 B2 | 8/2014 | Sakata |
| 8,819,554 B2 | 8/2014 | Basso et al. |
| 8,843,586 B2 | 9/2014 | Pantos et al. |
| 8,861,739 B2 | 10/2014 | Ojanpera |
| 8,885,851 B2 | 11/2014 | Westenbroek |
| 8,904,066 B2 | 12/2014 | Moore et al. |
| 8,917,877 B2 | 12/2014 | Haaff et al. |
| 8,930,006 B2 | 1/2015 | Haatainen |
| 8,934,647 B2 | 1/2015 | Joyce et al. |
| 8,934,655 B2 | 1/2015 | Breen et al. |
| 8,942,252 B2 | 1/2015 | Balassanian et al. |
| 8,942,395 B2 | 1/2015 | Lissaman et al. |
| 8,954,177 B2 | 2/2015 | Sanders |
| 8,965,544 B2 | 2/2015 | Ramsay |
| 8,966,394 B2 | 2/2015 | Gates et al. |
| 9,042,556 B2 | 5/2015 | Kallai et al. |
| 9,137,602 B2 | 9/2015 | Mayman et al. |
| 9,160,965 B2 | 10/2015 | Redmann et al. |
| 9,456,243 B2 | 9/2016 | Hughes et al. |
| 9,507,780 B2 | 11/2016 | Rothkopf et al. |
| 2001/0001160 A1 | 5/2001 | Shoff et al. |
| 2001/0009604 A1 | 7/2001 | Ando et al. |
| 2001/0022823 A1 | 9/2001 | Renaud |
| 2001/0027498 A1 | 10/2001 | Van De Meulenhof et al. |
| 2001/0032188 A1 | 10/2001 | Miyabe et al. |
| 2001/0042107 A1 | 11/2001 | Palm |

(56) References Cited

U.S. PATENT DOCUMENTS

| | | |
|---|---|---|
| 2001/0043456 A1 | 11/2001 | Atkinson |
| 2001/0046235 A1 | 11/2001 | Trevitt et al. |
| 2001/0047377 A1 | 11/2001 | Sincaglia et al. |
| 2001/0050991 A1 | 12/2001 | Eves |
| 2002/0002039 A1 | 1/2002 | Qureshey et al. |
| 2002/0002562 A1 | 1/2002 | Moran et al. |
| 2002/0002565 A1 | 1/2002 | Ohyama |
| 2002/0003548 A1 | 1/2002 | Krusche et al. |
| 2002/0015003 A1 | 2/2002 | Kato et al. |
| 2002/0022453 A1 | 2/2002 | Balog et al. |
| 2002/0026442 A1 | 2/2002 | Lipscomb et al. |
| 2002/0034374 A1 | 3/2002 | Barton |
| 2002/0035621 A1 | 3/2002 | Zintel et al. |
| 2002/0042844 A1 | 4/2002 | Chiazzese |
| 2002/0049843 A1 | 4/2002 | Barone et al. |
| 2002/0062406 A1 | 5/2002 | Chang et al. |
| 2002/0065926 A1 | 5/2002 | Hackney et al. |
| 2002/0067909 A1 | 6/2002 | Iivonen |
| 2002/0072816 A1 | 6/2002 | Shdema et al. |
| 2002/0072817 A1 | 6/2002 | Champion |
| 2002/0073228 A1 | 6/2002 | Cognet et al. |
| 2002/0078293 A1 | 6/2002 | Kou et al. |
| 2002/0080783 A1 | 6/2002 | Fujimori |
| 2002/0090914 A1 | 7/2002 | Kang et al. |
| 2002/0093478 A1 | 7/2002 | Yeh |
| 2002/0095460 A1 | 7/2002 | Benson |
| 2002/0098878 A1 | 7/2002 | Mooney et al. |
| 2002/0101357 A1 | 8/2002 | Gharapetian |
| 2002/0103635 A1 | 8/2002 | Mesarovic et al. |
| 2002/0109710 A1 | 8/2002 | Holtz et al. |
| 2002/0112244 A1 | 8/2002 | Liou et al. |
| 2002/0114354 A1 | 8/2002 | Sinha et al. |
| 2002/0114359 A1 | 8/2002 | Ibaraki et al. |
| 2002/0124097 A1 | 9/2002 | Isely et al. |
| 2002/0124182 A1 | 9/2002 | Bacso et al. |
| 2002/0129156 A1 | 9/2002 | Yoshikawa |
| 2002/0131398 A1 | 9/2002 | Taylor |
| 2002/0131761 A1 | 9/2002 | Kawasaki et al. |
| 2002/0136335 A1 | 9/2002 | Liou et al. |
| 2002/0137505 A1 | 9/2002 | Eiche et al. |
| 2002/0143998 A1 | 10/2002 | Rajagopal et al. |
| 2002/0159596 A1 | 10/2002 | Durand et al. |
| 2002/0163361 A1 | 11/2002 | Parkin |
| 2002/0165721 A1 | 11/2002 | Chang |
| 2002/0165921 A1 | 11/2002 | Sapieyevski |
| 2002/0168938 A1 | 11/2002 | Chang |
| 2002/0173273 A1 | 11/2002 | Spurgat et al. |
| 2002/0177411 A1 | 11/2002 | Yajima et al. |
| 2002/0181355 A1 | 12/2002 | Shikunami et al. |
| 2002/0184310 A1 | 12/2002 | Traversat et al. |
| 2002/0188762 A1 | 12/2002 | Tomassetti et al. |
| 2002/0194260 A1 | 12/2002 | Headley et al. |
| 2002/0194309 A1 | 12/2002 | Carter et al. |
| 2003/0002609 A1 | 1/2003 | Faller et al. |
| 2003/0008616 A1 | 1/2003 | Anderson |
| 2003/0014486 A1 | 1/2003 | May |
| 2003/0018797 A1 | 1/2003 | Dunning et al. |
| 2003/0020763 A1 | 1/2003 | Mayer et al. |
| 2003/0023741 A1 | 1/2003 | Tomassetti et al. |
| 2003/0035072 A1 | 2/2003 | Hagg |
| 2003/0035444 A1 | 2/2003 | Zwack |
| 2003/0041173 A1 | 2/2003 | Hoyle |
| 2003/0041174 A1 | 2/2003 | Wen et al. |
| 2003/0043856 A1 | 3/2003 | Lakaniemi et al. |
| 2003/0043924 A1 | 3/2003 | Haddad et al. |
| 2003/0050058 A1 | 3/2003 | Walsh et al. |
| 2003/0055892 A1 | 3/2003 | Huitema et al. |
| 2003/0061428 A1 | 3/2003 | Garney et al. |
| 2003/0063528 A1 | 4/2003 | Ogikubo |
| 2003/0063755 A1 | 4/2003 | Nourse et al. |
| 2003/0066094 A1 | 4/2003 | Van Der Schaar et al. |
| 2003/0067437 A1 | 4/2003 | McClintock et al. |
| 2003/0073432 A1 | 4/2003 | Meade |
| 2003/0097478 A1 | 5/2003 | King |
| 2003/0099212 A1 | 5/2003 | Anjum et al. |
| 2003/0099221 A1 | 5/2003 | Rhee |
| 2003/0101253 A1 | 5/2003 | Saito et al. |
| 2003/0103088 A1 | 6/2003 | Dresti et al. |
| 2003/0110329 A1 | 6/2003 | Higaki et al. |
| 2003/0123853 A1 | 7/2003 | Iwahara et al. |
| 2003/0126211 A1 | 7/2003 | Anttila et al. |
| 2003/0135822 A1 | 7/2003 | Evans |
| 2003/0157951 A1 | 8/2003 | Hasty |
| 2003/0167335 A1 | 9/2003 | Alexander |
| 2003/0172123 A1 | 9/2003 | Polan et al. |
| 2003/0179780 A1 | 9/2003 | Walker et al. |
| 2003/0182254 A1 | 9/2003 | Plastina et al. |
| 2003/0185400 A1 | 10/2003 | Yoshizawa et al. |
| 2003/0195964 A1 | 10/2003 | Mane |
| 2003/0198254 A1 | 10/2003 | Sullivan et al. |
| 2003/0198255 A1 | 10/2003 | Sullivan et al. |
| 2003/0198257 A1 | 10/2003 | Sullivan et al. |
| 2003/0200001 A1 | 10/2003 | Goddard |
| 2003/0204273 A1 | 10/2003 | Dinker et al. |
| 2003/0204509 A1 | 10/2003 | Dinker et al. |
| 2003/0210796 A1 | 11/2003 | McCarty et al. |
| 2003/0212802 A1 | 11/2003 | Rector et al. |
| 2003/0219007 A1 | 11/2003 | Barrack et al. |
| 2003/0227478 A1 | 12/2003 | Chatfield |
| 2003/0229900 A1 | 12/2003 | Reisman |
| 2003/0231208 A1 | 12/2003 | Hanon et al. |
| 2003/0231871 A1 | 12/2003 | Ushimaru |
| 2003/0235304 A1 | 12/2003 | Evans et al. |
| 2004/0001106 A1 | 1/2004 | Deutscher et al. |
| 2004/0001484 A1 | 1/2004 | Ozguner |
| 2004/0001591 A1 | 1/2004 | Mani et al. |
| 2004/0002938 A1 | 1/2004 | Deguchi |
| 2004/0008852 A1 | 1/2004 | Also et al. |
| 2004/0010727 A1 | 1/2004 | Fujinami |
| 2004/0012620 A1 | 1/2004 | Buhler et al. |
| 2004/0014426 A1 | 1/2004 | Moore |
| 2004/0015252 A1 | 1/2004 | Aiso et al. |
| 2004/0019497 A1 | 1/2004 | Volk et al. |
| 2004/0019807 A1 | 1/2004 | Freund |
| 2004/0019911 A1 | 1/2004 | Gates et al. |
| 2004/0023697 A1 | 2/2004 | Komura |
| 2004/0024478 A1 | 2/2004 | Hans et al. |
| 2004/0024925 A1 | 2/2004 | Cypher et al. |
| 2004/0027166 A1 | 2/2004 | Mangum et al. |
| 2004/0032348 A1 | 2/2004 | Lai et al. |
| 2004/0032421 A1 | 2/2004 | Williamson et al. |
| 2004/0037433 A1 | 2/2004 | Chen |
| 2004/0041836 A1 | 3/2004 | Zaner et al. |
| 2004/0042629 A1 | 3/2004 | Mellone et al. |
| 2004/0044742 A1 | 3/2004 | Evron et al. |
| 2004/0048569 A1 | 3/2004 | Kawamura |
| 2004/0059842 A1 | 3/2004 | Hanson et al. |
| 2004/0059965 A1 | 3/2004 | Marshall et al. |
| 2004/0066736 A1 | 4/2004 | Kroeger |
| 2004/0075767 A1 | 4/2004 | Neuman et al. |
| 2004/0078383 A1 | 4/2004 | Mercer et al. |
| 2004/0080671 A1 | 4/2004 | Siemens et al. |
| 2004/0093096 A1 | 5/2004 | Huang et al. |
| 2004/0098754 A1 | 5/2004 | Vella et al. |
| 2004/0111473 A1 | 6/2004 | Lysenko et al. |
| 2004/0117462 A1 | 6/2004 | Bodin et al. |
| 2004/0117491 A1 | 6/2004 | Karaoguz et al. |
| 2004/0117840 A1 | 6/2004 | Boudreau et al. |
| 2004/0117858 A1 | 6/2004 | Boudreau et al. |
| 2004/0128701 A1 | 7/2004 | Kaneko et al. |
| 2004/0131192 A1 | 7/2004 | Metcalf |
| 2004/0133689 A1 | 7/2004 | Vasisht |
| 2004/0143368 A1 | 7/2004 | May et al. |
| 2004/0143852 A1 | 7/2004 | Meyers |
| 2004/0148237 A1 | 7/2004 | Bittmann et al. |
| 2004/0168081 A1 | 8/2004 | Ladas et al. |
| 2004/0170383 A1 | 9/2004 | Mazur |
| 2004/0171346 A1 | 9/2004 | Lin |
| 2004/0177167 A1 | 9/2004 | Iwamura et al. |
| 2004/0179554 A1 | 9/2004 | Tsao |
| 2004/0183827 A1 | 9/2004 | Putterman et al. |
| 2004/0185773 A1 | 9/2004 | Gerber et al. |
| 2004/0203378 A1 | 10/2004 | Powers |
| 2004/0203590 A1 | 10/2004 | Shteyn |

(56) References Cited

U.S. PATENT DOCUMENTS

| | | |
|---|---|---|
| 2004/0208158 A1 | 10/2004 | Fellman et al. |
| 2004/0213230 A1 | 10/2004 | Douskalis et al. |
| 2004/0223622 A1 | 11/2004 | Lindemann et al. |
| 2004/0224638 A1 | 11/2004 | Fadell et al. |
| 2004/0228367 A1 | 11/2004 | Mosig et al. |
| 2004/0248601 A1 | 12/2004 | Chang |
| 2004/0249490 A1 | 12/2004 | Sakai |
| 2004/0249965 A1 | 12/2004 | Huggins et al. |
| 2004/0249982 A1 | 12/2004 | Arnold et al. |
| 2004/0252400 A1 | 12/2004 | Blank et al. |
| 2004/0253969 A1 | 12/2004 | Nguyen et al. |
| 2005/0010691 A1 | 1/2005 | Oyadomari et al. |
| 2005/0011388 A1 | 1/2005 | Kouznetsov |
| 2005/0013394 A1 | 1/2005 | Rausch et al. |
| 2005/0015551 A1 | 1/2005 | Eames et al. |
| 2005/0021590 A1 | 1/2005 | Debique et al. |
| 2005/0027821 A1 | 2/2005 | Alexander et al. |
| 2005/0047605 A1 | 3/2005 | Lee et al. |
| 2005/0058149 A1 | 3/2005 | Howe |
| 2005/0060435 A1 | 3/2005 | Xue et al. |
| 2005/0062637 A1 | 3/2005 | El Zabadani et al. |
| 2005/0081213 A1 | 4/2005 | Suzuoki et al. |
| 2005/0105052 A1 | 5/2005 | McCormick et al. |
| 2005/0114538 A1 | 5/2005 | Rose |
| 2005/0120128 A1 | 6/2005 | Willes et al. |
| 2005/0125222 A1 | 6/2005 | Brown et al. |
| 2005/0125357 A1 | 6/2005 | Saadat et al. |
| 2005/0131558 A1 | 6/2005 | Braithwaite et al. |
| 2005/0154766 A1 | 7/2005 | Huang et al. |
| 2005/0159833 A1 | 7/2005 | Giaimo et al. |
| 2005/0160270 A1 | 7/2005 | Goldberg et al. |
| 2005/0166135 A1 | 7/2005 | Burke et al. |
| 2005/0168630 A1 | 8/2005 | Yamada et al. |
| 2005/0177643 A1 | 8/2005 | Xu |
| 2005/0181348 A1 | 8/2005 | Carey et al. |
| 2005/0195205 A1 | 9/2005 | Abrams, Jr. |
| 2005/0195823 A1 | 9/2005 | Chen et al. |
| 2005/0197725 A1 | 9/2005 | Alexander et al. |
| 2005/0198574 A1 | 9/2005 | Lamkin et al. |
| 2005/0201549 A1 | 9/2005 | Dedieu et al. |
| 2005/0216556 A1 | 9/2005 | Manion et al. |
| 2005/0262217 A1 | 11/2005 | Nonaka et al. |
| 2005/0281255 A1 | 12/2005 | Davies et al. |
| 2005/0283820 A1 | 12/2005 | Richards et al. |
| 2005/0288805 A1 | 12/2005 | Moore et al. |
| 2005/0289224 A1 | 12/2005 | Deslippe et al. |
| 2006/0041639 A1 | 2/2006 | Lamkin et al. |
| 2006/0072489 A1 | 4/2006 | Toyoshima |
| 2006/0095516 A1 | 5/2006 | Wijeratne |
| 2006/0098936 A1 | 5/2006 | Ikeda et al. |
| 2006/0119497 A1 | 6/2006 | Miller et al. |
| 2006/0143236 A1 | 6/2006 | Wu |
| 2006/0155721 A1 | 7/2006 | Grunwald et al. |
| 2006/0161742 A1 | 7/2006 | Sugimoto et al. |
| 2006/0173844 A1 | 8/2006 | Zhang et al. |
| 2006/0193454 A1 | 8/2006 | Abou-Chakra et al. |
| 2006/0222186 A1 | 10/2006 | Paige et al. |
| 2006/0227985 A1 | 10/2006 | Kawanami |
| 2006/0259649 A1 | 11/2006 | Hsieh et al. |
| 2006/0270395 A1 | 11/2006 | Dhawan et al. |
| 2007/0003067 A1 | 1/2007 | Gierl et al. |
| 2007/0022207 A1 | 1/2007 | Millington et al. |
| 2007/0038999 A1 | 2/2007 | Millington et al. |
| 2007/0043847 A1 | 2/2007 | Carter et al. |
| 2007/0047712 A1 | 3/2007 | Gross et al. |
| 2007/0048713 A1 | 3/2007 | Plastina et al. |
| 2007/0054680 A1 | 3/2007 | Mo et al. |
| 2007/0087686 A1 | 4/2007 | Holm et al. |
| 2007/0142022 A1 | 6/2007 | Madonna et al. |
| 2007/0142944 A1 | 6/2007 | Goldberg et al. |
| 2007/0143493 A1 | 6/2007 | Mullig et al. |
| 2007/0169115 A1 | 7/2007 | Ko et al. |
| 2007/0180137 A1 | 8/2007 | Rajapakse |
| 2007/0192156 A1 | 8/2007 | Gauger |
| 2007/0249295 A1 | 10/2007 | Ukita et al. |
| 2007/0265031 A1 | 11/2007 | Koizumi et al. |
| 2007/0271388 A1 | 11/2007 | Bowra et al. |
| 2007/0299778 A1 | 12/2007 | Haveson et al. |
| 2008/0002836 A1 | 1/2008 | Moeller et al. |
| 2008/0007649 A1 | 1/2008 | Bennett |
| 2008/0007650 A1 | 1/2008 | Bennett |
| 2008/0007651 A1 | 1/2008 | Bennett |
| 2008/0018785 A1 | 1/2008 | Bennett |
| 2008/0022320 A1 | 1/2008 | Ver Steeg |
| 2008/0025535 A1 | 1/2008 | Rajapakse |
| 2008/0072816 A1 | 3/2008 | Riess et al. |
| 2008/0075295 A1 | 3/2008 | Mayman et al. |
| 2008/0077619 A1 | 3/2008 | Gilley et al. |
| 2008/0077620 A1 | 3/2008 | Gilley et al. |
| 2008/0086318 A1 | 4/2008 | Gilley et al. |
| 2008/0091771 A1 | 4/2008 | Allen et al. |
| 2008/0120429 A1 | 5/2008 | Millington et al. |
| 2008/0126943 A1 | 5/2008 | Parasnis et al. |
| 2008/0144861 A1 | 6/2008 | Melanson et al. |
| 2008/0144864 A1 | 6/2008 | Huon |
| 2008/0146289 A1 | 6/2008 | Korneluk et al. |
| 2008/0189272 A1 | 8/2008 | Powers et al. |
| 2008/0205070 A1 | 8/2008 | Osada |
| 2008/0212786 A1 | 9/2008 | Park |
| 2008/0215169 A1 | 9/2008 | Debettencourt et al. |
| 2008/0263010 A1 | 10/2008 | Roychoudhuri et al. |
| 2008/0303947 A1 | 12/2008 | Ohnishi et al. |
| 2009/0011798 A1 | 1/2009 | Yamada |
| 2009/0017868 A1 | 1/2009 | Ueda et al. |
| 2009/0031336 A1 | 1/2009 | Chavez et al. |
| 2009/0070434 A1 | 3/2009 | Himmelstein |
| 2009/0089327 A1 | 4/2009 | Kalaboukis et al. |
| 2009/0100189 A1 | 4/2009 | Bahren et al. |
| 2009/0124289 A1 | 5/2009 | Nishida |
| 2009/0157905 A1 | 6/2009 | Davis |
| 2009/0164655 A1 | 6/2009 | Pettersson et al. |
| 2009/0193345 A1 | 7/2009 | Wensley et al. |
| 2009/0222115 A1 | 9/2009 | Malcolm et al. |
| 2009/0228919 A1 | 9/2009 | Zott et al. |
| 2009/0251604 A1 | 10/2009 | Iyer |
| 2010/0004983 A1 | 1/2010 | Dickerson et al. |
| 2010/0031366 A1 | 2/2010 | Knight et al. |
| 2010/0049835 A1 | 2/2010 | Ko et al. |
| 2010/0087089 A1 | 4/2010 | Struthers et al. |
| 2010/0228740 A1 | 9/2010 | Cannistraro et al. |
| 2010/0284389 A1 | 11/2010 | Ramsay et al. |
| 2010/0299639 A1 | 11/2010 | Ramsay et al. |
| 2011/0001632 A1 | 1/2011 | Hohorst |
| 2011/0002487 A1 | 1/2011 | Panther et al. |
| 2011/0066943 A1 | 3/2011 | Brillon et al. |
| 2011/0228944 A1 | 9/2011 | Croghan et al. |
| 2011/0316768 A1 | 12/2011 | McRae |
| 2012/0029671 A1 | 2/2012 | Millington et al. |
| 2012/0030366 A1 | 2/2012 | Collart et al. |
| 2012/0051567 A1 | 3/2012 | Castor-Perry |
| 2012/0060046 A1 | 3/2012 | Millington |
| 2012/0129446 A1 | 5/2012 | Ko et al. |
| 2012/0148075 A1 | 6/2012 | Goh et al. |
| 2012/0185771 A1 | 7/2012 | Rothkopf et al. |
| 2012/0192071 A1 | 7/2012 | Millington |
| 2012/0207290 A1 | 8/2012 | Moyers et al. |
| 2012/0237054 A1 | 9/2012 | Eo et al. |
| 2012/0281058 A1 | 11/2012 | Laney et al. |
| 2012/0290621 A1 | 11/2012 | Heitz, III et al. |
| 2013/0018960 A1 | 1/2013 | Knysz et al. |
| 2013/0031475 A1 | 1/2013 | Maor et al. |
| 2013/0038726 A1 | 2/2013 | Kim |
| 2013/0041954 A1 | 2/2013 | Kim et al. |
| 2013/0047084 A1 | 2/2013 | Sanders et al. |
| 2013/0052940 A1 | 2/2013 | Brillhart et al. |
| 2013/0070093 A1 | 3/2013 | Rivera et al. |
| 2013/0080599 A1 | 3/2013 | Ko et al. |
| 2013/0094670 A1 | 4/2013 | Millington |
| 2013/0124664 A1 | 5/2013 | Fonseca, Jr. et al. |
| 2013/0129122 A1 | 5/2013 | Johnson et al. |
| 2013/0132837 A1 | 5/2013 | Mead et al. |
| 2013/0159126 A1 | 6/2013 | Elkady |
| 2013/0167029 A1 | 6/2013 | Friesen et al. |
| 2013/0174100 A1 | 7/2013 | Seymour et al. |

(56) References Cited

U.S. PATENT DOCUMENTS

| | | |
|---|---|---|
| 2013/0174223 A1 | 7/2013 | Dykeman et al. |
| 2013/0179163 A1 | 7/2013 | Herbig et al. |
| 2013/0191454 A1 | 7/2013 | Oliver et al. |
| 2013/0197682 A1 | 8/2013 | Millington |
| 2013/0208911 A1 | 8/2013 | Millington |
| 2013/0208921 A1 | 8/2013 | Millington |
| 2013/0226323 A1 | 8/2013 | Millington |
| 2013/0230175 A1 | 9/2013 | Bech et al. |
| 2013/0232416 A1 | 9/2013 | Millington |
| 2013/0253934 A1 | 9/2013 | Parekh et al. |
| 2013/0279706 A1 | 10/2013 | Marti |
| 2013/0287186 A1 | 10/2013 | Quady |
| 2013/0290504 A1 | 10/2013 | Quady |
| 2014/0006483 A1 | 1/2014 | Garmark et al. |
| 2014/0037097 A1 | 2/2014 | Labosco |
| 2014/0064501 A1 | 3/2014 | Olsen et al. |
| 2014/0075308 A1 | 3/2014 | Sanders et al. |
| 2014/0075311 A1 | 3/2014 | Boettcher et al. |
| 2014/0079242 A1 | 3/2014 | Nguyen et al. |
| 2014/0108929 A1 | 4/2014 | Garmark et al. |
| 2014/0123005 A1 | 5/2014 | Forstall et al. |
| 2014/0140530 A1 | 5/2014 | Gomes-Casseres et al. |
| 2014/0161265 A1 | 6/2014 | Chaikin et al. |
| 2014/0181569 A1 | 6/2014 | Millington et al. |
| 2014/0242913 A1 | 8/2014 | Pang |
| 2014/0256260 A1 | 9/2014 | Ueda et al. |
| 2014/0267148 A1 | 9/2014 | Luna et al. |
| 2014/0270202 A1 | 9/2014 | Ivanov et al. |
| 2014/0273859 A1 | 9/2014 | Luna et al. |
| 2014/0279889 A1 | 9/2014 | Luna |
| 2014/0285313 A1 | 9/2014 | Luna et al. |
| 2014/0286496 A1 | 9/2014 | Luna et al. |
| 2014/0298174 A1 | 10/2014 | Ikonomov |
| 2014/0323036 A1 | 10/2014 | Daley et al. |
| 2014/0344689 A1 | 11/2014 | Scott et al. |
| 2014/0378056 A1 | 12/2014 | Liu |
| 2015/0019670 A1 | 1/2015 | Redmann |
| 2015/0026613 A1 | 1/2015 | Kwon et al. |
| 2015/0032844 A1 | 1/2015 | Tarr et al. |
| 2015/0043736 A1 | 2/2015 | Olsen et al. |
| 2015/0049248 A1 | 2/2015 | Wang et al. |
| 2015/0074527 A1 | 3/2015 | Sevigny et al. |
| 2015/0074528 A1 | 3/2015 | Sakalowsky et al. |
| 2015/0098576 A1 | 4/2015 | Sundaresan et al. |
| 2015/0139210 A1 | 5/2015 | Marin et al. |
| 2015/0256954 A1 | 9/2015 | Carlsson et al. |
| 2015/0304288 A1 | 10/2015 | Balasaygun et al. |
| 2015/0365987 A1 | 12/2015 | Weel |

FOREIGN PATENT DOCUMENTS

| | | |
|---|---|---|
| CN | 101292500 A | 10/2008 |
| EP | 0251584 A2 | 1/1988 |
| EP | 0672985 A1 | 9/1995 |
| EP | 0772374 A2 | 5/1997 |
| EP | 1111527 A2 | 6/2001 |
| EP | 1122931 A2 | 8/2001 |
| EP | 1312188 A1 | 5/2003 |
| EP | 1389853 A1 | 2/2004 |
| EP | 2713281 | 4/2004 |
| EP | 1517464 A2 | 3/2005 |
| EP | 0895427 A3 | 1/2006 |
| EP | 1416687 B1 | 8/2006 |
| EP | 1410686 | 3/2008 |
| EP | 2043381 A2 | 4/2009 |
| EP | 2161950 A2 | 3/2010 |
| EP | 0742674 B1 | 4/2014 |
| EP | 2591617 B1 | 6/2014 |
| GB | 2284327 A | 5/1995 |
| GB | 2338374 | 12/1999 |
| GB | 2379533 A | 3/2003 |
| GB | 2486183 | 6/2012 |
| JP | 63269633 | 11/1988 |
| JP | 07-210129 | 8/1995 |
| JP | 2000149391 A | 5/2000 |
| JP | 2001034951 | 2/2001 |
| JP | 2002111817 | 4/2002 |
| JP | 2002123267 A | 4/2002 |
| JP | 2002358241 A | 12/2002 |
| JP | 2003037585 | 2/2003 |
| JP | 2003506765 A | 2/2003 |
| JP | 2003101958 | 4/2003 |
| JP | 2003169089 A | 6/2003 |
| JP | 2005108427 | 4/2005 |
| JP | 2005136457 | 5/2005 |
| JP | 2007241652 A | 9/2007 |
| JP | 2009506603 A | 2/2009 |
| JP | 2009075540 A | 4/2009 |
| JP | 2009135750 | 6/2009 |
| JP | 2009535708 | 10/2009 |
| JP | 2009538006 A | 10/2009 |
| JP | 2011130496 | 6/2011 |
| TW | 439027 | 6/2001 |
| WO | 9525313 | 9/1995 |
| WO | 9923560 | 5/1999 |
| WO | 9961985 | 12/1999 |
| WO | 0019693 A1 | 4/2000 |
| WO | 0110125 A1 | 2/2001 |
| WO | 0153994 | 7/2001 |
| WO | 02073851 | 9/2002 |
| WO | 03093950 A2 | 11/2003 |
| WO | 2005013047 | 2/2005 |
| WO | 2007023120 A1 | 3/2007 |
| WO | 2007127485 | 11/2007 |
| WO | 2007131555 | 11/2007 |
| WO | 2007135581 A2 | 11/2007 |
| WO | 2008082350 A1 | 7/2008 |
| WO | 2008114389 A1 | 9/2008 |
| WO | 2012050927 | 4/2012 |
| WO | 2014004182 | 1/2014 |
| WO | 2014149533 A2 | 9/2014 |

OTHER PUBLICATIONS

Final Office Action mailed on Jun. 3, 2016, issued in connection with U.S. Appl. No. 13/705,176, filed Dec. 5, 2012, 24 pages.
Final Office Action mailed on May 25, 2016, issued in connection with U.S. Appl. No. 14/290,493, filed May 29, 2014, 33 pages.
Japanese Patent Office, Office Action mailed on May 24, 2016, issued in connection with Japanese Patent Application No. 2014-220704, 7 pages.
Non-Final Office Action mailed on Jun. 1, 2016, issued in connection with U.S. Appl. No. 14/184,522, filed Feb. 19, 2014, 21 pages.
Non-Final Office Action mailed on May 10, 2016, issued in connection with U.S. Appl. No. 14/504,812, filed Oct. 2, 2014, 22 pages.
Polycom Conference Composer manual: copyright 2001.
Pre-Interview First Office Action mailed on Mar. 10, 2015, issued in connection with U.S. Appl. No. 14/505,027, filed Oct. 2, 2014, 4 pages.
Presentations at WinHEC 2000, May 2000, 138 pages.
PRISMIQ; Inc., "PRISMIQ Media Player User Guide", 2003, 44 pages.
Re-Exam Final Office Action mailed on Aug. 5, 2015, issued in connection with U.S. Appl. No. 90/013,423, filed Jan. 5, 2015, 25 pages.
Re-Exam Non-Final Office Action mailed on Apr. 22, 2015, issued in connection with U.S. Appl. No. 90/013,423, filed Jan. 5, 2015, 16 pages.
Renkus Heinz Manual; available for sale at least 2004, 6 pages.
Roland Corporation, "Roland announces BA-55 Portable PA System," press release, Apr. 6, 2011, 2 pages.
Rothermel et al., "An Adaptive Stream Synchronization Protocol," 5th International Workshop on Network and Dperating System Support for Digital Audio and Video, 1995, 13 pages.
Schmandt et al., "Impromptu: Managing Networked Audio Applications for Mobile Users", 2004, 11 pages.
Schulzrinne H., et al., "RTP: A Transport Protocol for Real-Time Applications, RFC 3550," Network Working Group, 2003, pp. 1-89.

(56) References Cited

OTHER PUBLICATIONS

UPnP; "Universal Plug and Play Device Architecture," Jun. 8, 2000; version 1.0; Microsoft Corporation; pp. 1-54.
"Welcome. You're watching Apple TV." Apple TV 1st Generation Setup Guide, Apr. 8, 2008 Retrieved Oct. 14, 2014, 40 pages.
"Welcome. You're watching Apple TV." Apple TV 2nd Generation Setup Guide, Mar. 10, 2011 Retrieved Oct. 16, 2014, 35 pages.
"Welcome. You're watching Apple TV." Apple TV 3rd Generation Setup Guide, Mar. 16, 2012 Retrieved Oct. 16, 2014, 35 pages.
Yamaha DME 32 manual: copyright 2001.
Yamaha DME Designer software manual: Copyright 2004, 482 pages.
Final Office Action mailed on Aug. 3, 2015, issued in connection with U.S. Appl. No. 13/848,921, filed Mar. 22, 2013, 13 pages.
Final Office Action mailed on Dec. 3, 2014, issued in connection with U.S. Appl. No. 14/184,528, filed Feb. 19, 2014, 12 pages.
Final Office Action mailed on Jul. 3, 2012, issued in connection with U.S. Appl. No. 13/298,090, filed Nov. 16, 2011, 41 pages.
Final Office Action mailed on Mar. 3, 2015, issued in connection with U.S. Appl. No. 13/864,251, filed Apr. 17, 2013, 13 pages.
Final Office Action mailed on Mar. 4, 2015, issued in connection with U.S. Appl. No. 13/848,904, filed Mar. 22, 2013, 16 pages.
Final Office Action mailed on Mar. 5, 2015, issued in connection with U.S. Appl. No. 13/888,203, filed May 6, 2013, 13 pages.
Final Office Action mailed on Jan. 7, 2015, issued in connection with U.S. Appl. No. 13/848,932, filed Mar. 22, 2013, 14 pages.
Final Office Action mailed on Mar. 9, 2015, issued in connection with U.S. Appl. No. 14/516,867, filed Oct. 17, 2014, 14 pages.
Final Office Action mailed Aug. 10, 2015, issued in connection with U.S. Appl. No. 14/290,493, filed May 29, 2014, 26 pages
Final Office Action mailed on Aug. 11, 2015, issued in connection with U.S. Appl. No. 13/864,247, filed Apr. 17, 2013, 15 pages.
Final Office Action mailed on 11 Feb. 2015, issued in connection with U.S. Appl. No. 14/184,526, filed Feb. 19, 2014, 13 pages.
Final Office Action mailed on Feb. 11, 2015, issued in connection with U.S. Appl. No. 14/184,935, filed Feb. 20, 2014, 17 pages.
Final Office Action mailed on Feb. 12, 2015, issued in connection with U.S. Appl. No. 14/184,522, filed Feb. 19, 2014, 20 pages.
Final Office Action mailed on Oct. 13, 2011, issued in connection with U.S. Appl. No. 12/035,112, filed Feb. 21, 2008, 10 pages.
Final Office Action mailed on Jul. 15, 2015, issued in connection with U.S. Appl. No. 14/504,812, filed Oct. 2, 2014, 18 pages.
Final Office Action mailed on Jun. 15, 2015, issued in connection with U.S. Appl. No. 14/184,522, filed Feb. 19, 2014, 25 pages.
Final Office Action mailed on Dec. 17, 2014, issued in connection with U.S. Appl. No. 13/533,105, filed Jun. 26, 2012, 36 pages.
Final Office Action mailed on Jan. 21, 2010, issued in connection with U.S. Appl. No. 11/906,702, filed Oct. 2, 2007, 27 pages.
Final Office Action mailed on Oct. 22, 2014, issued in connection with U.S. Appl. No. 14/186,850, filed Feb. 21, 2014, 12 pages.
Final Office Action mailed on Oct. 23, 2014, issued in conection with U.S. Appl. No. 13/705,176, filed Dec. 5, 2012, 23 pages.
Final Office Action mailed on Feb. 24, 2016, issued in connection with U.S. Appl. No. 13/871,795, filed Apr. 26, 2013, 28 pages.
Final Office Action mailed on Apr. 28, 2015, issued in connection with U.S. Appl. No. 14/186,850, filed Feb. 21, 2014, 20 pages.
Final Office Action mailed on Nov. 30, 2015, issued in connection with U.S. Appl. No. 13/871,795, filed Apr. 26, 2013, 26 pages.
First Action Interview Office Action Summary mailed on Apr. 15, 2015, issued in connection with U.S. Appl. No. 14/505,027, filed Oct. 2, 2014, 6 pages.
Fulton et al., "The Network Audio System: Make Your Application Sing (As Well As Dance)!", The X Resource, 1994, 14 pages.
Hans et al., "Interacting with Audio Streams for Entertainment and Communication", Proceedings of the Eleventh ACM International Conference on Multimedia, ACM, 2003, 7 pages.
Horwitz, Jeremy, "Logic3 i-Station25," retrieved from the internet: http://www.ilounge.com/index.php/reviews/entry/logic3-i-station25/, last visited Dec. 17, 2013, 5 pages.

Huang C.M., et al., "A Synchronization Infrastructure for Multicast Multimedia at the Presentation Layer," IEEE Transactions on Consumer Electronics, 1997, pp. 370-380, vol. 43, No. 3.
International Bureau, International Preliminary Report on Patentability, mailed on Jan. 8, 2015, issued in connection with International Application No. PCT/US2013/046372, filed on Jun. 18, 2013, 6 pages.
International Bureau, International Preliminary Report on Patentability, mailed on Jan. 8, 2015, issued in connection with International Application No. PCT/US2013/046386, filed on Jun. 18, 2013, 8 pages.
International Bureau, International Preliminary Report on Patentability mailed on Jan. 30, 2014, issued in connection with International Application No. PCT/US2012/045894, filed on Jul. 9, 2012, 6 pages.
International Searching Authority, International Search Report mailed on Aug. 1, 2008, in connection with International Application No. PCT/US2004/023102, 5 pages.
International Searching Authority, International Search Report mailed on Dec. 26, 2012, issued in connection with International Application No. PCT/US2012/045894, filed on Jul. 9, 2012, 3 pages.
International Searching Authority, International Search Report, mailed on Sep. 30, 2013, issued in connection with PCT Application No. PCT/US2013/046386, 3 pages.
International Searching Authority, International Search Report mailed on Aug. 26, 2013, issued in connection with International Patent application No. PCT/US2013/046372, 3 pages.
International Searching Authority, Written Opinion mailed on Aug. 26, 2013, issued in connection with International Application No. PCT/US2013/046372, filed on Jun. 18, 2013, 4 pages.
International Searching Authority, Written Opinion mailed on Dec. 26, 2012, issued in connection with International Application No. PCT/US2012/045894, filed on Jul. 9, 2012, 4 pages.
International Searching Authority, Written Opinion mailed on Sep. 30, 2013, issued in connection with International Application No. PCT/US2013/046386, tiled on Jun. 18, 2013, 6 pages.
Ishibashi et al., "A Group Synchronization Mechanism for Live Media in Multicast Communications," IEEE Global Telecommunications Conference, 1997, pp. 746-752, vol. 2.
Ishibashi et al., "A Group Synchronization Mechanism for Stored Media in Multicast Communications," IEEE Information Revolution and Communications, 1997, pp. 692-700, vol. 2.
Japanese Intellectual Property Office, Decision of Rejection mailed on Jul. 8, 2014, issued in connection with Japanese Patent Application No. 2012-178711, 3 pages.
Japanese Intellectual Property Office, Office Action Summary mailed on Feb. 2, 2016, issued in connection with Japanese Patent Application No. 2015-520286, 6 pages.
Japanese Intellectual Property Office, Office Action Summary mailed on Nov. 19, 2013, issued in connection with Japanese Patent Application No. 2012-178711, 5 pages.
Japanese Patent Office, Notice of Rejection, mailed on Feb. 3, 2015, issued in connection with Japanese Patent Application No. 2014-521648, 7 pages.
Japanese Patent Office, Notice of Rejection mailed on Sep. 15, 2015, issued in connection with Japanese Patent Application No. 2014-220704, 7 pages.
Japanese Patent Office, Office Action mailed on Mar. 29, 2016, issued in connection with Japanese Patent Application No. JP2015-520288, 12 pages.
Jo et al., "Synchronized One-to-many Media Streaming with Adaptive Playout Control," Proceedings of SPIE, 2002, pp. 71-82, vol. 4861.
Jones, Stephen, "Dell Digital Audio Receiver: Digital upgrade for your analog stereo" Analog Stereo Jun. 24, 2000 retrieved Jun. 18, 2014, 2 pages.
Levergood et al., "AudioFile: A Network-Transparent System for Distributed Audio Applications", Digital Equipment Corporation, 1993, 109 pages.
Louderback, Jim, "Affordable Audio Receiver Furnishes Homes With MP3," TechTV Vault. Jun. 28, 2000 retrieved Jul. 10, 2014, 2 pages.

(56) References Cited

OTHER PUBLICATIONS

Maniactools, "Identify Duplicate Files by Sound," Sep. 28, 2010, http://www.maniactools.com/soft/music-duplicate-remover/identify-duplicate-files-by-sound.shtml.
Mills David L., "Network Time Protocol (Version 3) Specification, Implementation and Analysis," Network Working Group, Mar. 1992, 7 pages.
Mills, David L., "Precision Synchronization of Computer Network Clocks," ACM SIGCOMM Computer Communication Review, 1994, pp. 28-43, vol. 24, No. 2.
Motorola., "Simplefi, Wireless Digital Audio Receiver, Installation and User Guide", Dec. 31, 2001, 111 pages.
Nilsson, M., "ID3 Tag Version 2", Mar. 26, 1998, 28 pages.
Non-Final Office Action mailed May 1, 2014, issued in connection with U.S. Appl. No. 14/184,522, filed Feb. 19, 2014, 31 pages.
Non-Final Office Action mailed Dec. 5, 2013, issued in connection with U.S. Appl. No. 13/827,653, filed Mar. 14, 2013, 28 pages.
Non-Final Office Action mailed Jan. 5, 2012, issued in connection with U.S. Appl. No. 13/298,090, filed Nov. 16, 2011, 35 pages.
Non-Final Office Action mailed May 6, 2014, issued in connection with U.S. Appl. No. 13/705,176, filed Dec. 5, 2012, 23 pages.
Non-final Office Action mailed Apr. 10, 2013, issued in connection with U.S. Appl. No. 13/619,237, filed Sep. 14, 2012, 10 pages.
Non-Final Office Action mailed May 12, 2014, issued in connection with U.S. Appl. No. 14/184,528, filed Feb. 19, 2014, 23 pages.
"Non-Final Office Action mailed May 14, 2014, issued in connection with U.S. Appl. No. 13/848,932, filed Mar. 22, 2013, 14 pages".
"Non-Final Office Action mailed Jun. 17, 2014, issued in connection with U.S. Appl. No. 14/176,808, filed Feb. 10, 2014, 6 pages".
"Non-Final Office Action mailed Dec. 18, 2013, issued in connection with U.S. Appl. No. 13/907,666, filed May 31, 2013, 12 pages".
"Non-Final Office Action mailed Jan. 18, 2008, issued in connection with U.S. Appl. No. 10/816,217, filed Apr. 1, 2004, 28 pages".
"Non-Final Office Action mailed Apr. 19, 2010, issued in connection with U.S. Appl. No. 11/801,468, filed May 9, 2007, 16 pages".
"Non-Final Office Action mailed Mar. 19, 2013, issued in connection with U.S. Appl. No. 13/724,048, filed Dec. 21, 2012, 9 pages".
"Non-Final Office Action mailed Jun. 21, 2011, issued in connection with U.S. Appl. No. 10/816,217, filed Apr. 1, 2004, 13 pages".
"Non-Final Office Action mailed Jan. 22, 2009, issued in connection with U.S. Appl. No. 10/816,217, filed Apr. 1, 2004, 18 pages".
"Non-Final Office Action mailed Jul. 25, 2014, issued in connection with U.S. Appl. No. 14/184,526, filed Feb. 19, 2014, 9 pages".
"Non-Final Office Action mailed Jul. 25, 2014, issued in connection with U.S. Appl. No. 14/184,935, filed Feb. 20, 2014, 11 pages".
"Non-Final Office Action mailed Jun. 25, 2010, issued in connection with U.S. Appl. No. 10/816,217, filed Apr. 1, 2004, 17 pages".
"Non-Final Office Action mailed Nov. 25, 2013, issued in connection with U.S. Appl. No. 13/533,105, filed Jun. 26, 2012, 19 pages".
"Non-Final Office Action mailed May 27, 2014, issued in connection with U.S. Appl. No. 14/186,850, filed Feb. 21, 2014, 13 pages".
Non-Final Office Action mailed Feb. 29, 2012, issued in connection with U.S. Appl. No. 13/297,000, filed Nov. 15, 2011, 10 pages.
"Non-Final Office Action mailed Nov. 29, 2010, issued in connection with U.S. Appl. No. 11/801,468, filed May 9, 2007, 17 pages".
Non-Final Office Action mailed Jul. 30, 2013 issued in connection with U.S. Appl. No. 13/724,048, filed Dec. 21, 2012, 7 pages.
Non-Final Office Action mailed Jul. 31, 2014, issued in connection with U.S. Appl. No. 13/533,105, filed Jun. 26, 2012, 31 pages.
"Non-Final Office Action mailed on Dec. 1, 2014, issued in connection with U.S. Appl. No. 14/516,867, filed Oct. 17, 2014, 11 pages".
"Non-Final Office Action mailed on Jun. 3, 2015, issued in connection with U.S. Appl. No. 14/564,544, filed Dec. 9, 2014, 7 pages."
"Non-Final Office Action mailed on Jun. 4, 2015, issued in connection with U.S. Appl. No. 13/871,795, filed Apr. 26, 2013, 16 pages."
"Non-Final Office Action mailed on Mar. 4, 2015, issued in connection with U.S. Appl. No. 13/435,776, filed Mar. 30, 2012, 16 pages."
Non-Final Office Action mailed on Mar. 8, 2016, issued in connection with U.S. Appl. No. 13/848,921, filed Mar. 22, 2013, 13 pages.
"Non-Final Office Action mailed on Mar. 10, 2011, issued in connection with U.S. Appl. No. 12/035,112, filed Feb. 21, 2008, 12 pages."
"Non-Final Office Action mailed on Jun. 12, 2015, issued in connection with U.S. Appl. No. 13/848,932, filed Mar. 22, 2013, 16 pages".
Non-Final Office Action mailed on Mar. 12, 2015, issued in connection with U.S. Appl. No. 13/705,174, filed Dec. 5, 2012, 13 pages.
Non-Final Office Action mailed on Jan. 13, 2016, issued in connection with U.S. Appl. No. 14/184,528, filed Feb. 19, 2014, 14 pages.
"Non-Final Office Action mailed on Mar. 13, 2015, issued in connection with U.S. Appl. No. 13/705,177, filed Dec. 5, 2012, 15 pages."
"Non-Final Office Action mailed on Nov. 17, 2014, issued in connection with U.S. Appl. No. 13/864,247, filed Apr. 17, 2013, 11 pages".
"Non-Final Office Action mailed on Feb. 18, 2009, issued in connection with U.S. Appl. No. 10/861,653, filed Jun. 5, 2004, 18 pages."
"Non-Final Office Action mailed on Nov. 18, 2014, issued in connection with U.S. Appl. No. 13/435,739, filed Mar. 30, 2012, 10 pages".
"Non-Final Office Action mailed on Jun. 19, 2015, issued in connection with U.S. Appl. No. 13/533,105, filed Jun. 26, 2012, 38 pages."
"Non-Final Office Action mailed on Nov. 19, 2014, issued in connection with U.S. Appl. No. 13/848,921, filed Mar. 22, 2013, 9 pages".
Non-Final Office Action mailed on Aug. 20, 2009, issued in connection with U.S. Appl. No. 11/906,702, filed Oct. 2, 2007, 27 pages.
Non-Final Office Action mailed on Jun. 23, 2015, issued in connection with U.S. Appl. No. 13/705,176, filed Dec. 5, 2012, 30 pages.
"Non-Final Office Action mailed on Oct. 23, 2014, issued in connection with U.S. Appl. No. 13/848,904, filed Mar. 22, 2013, 11 pages".
"Non-Final Office Action mailed on Oct. 23, 2014, issued in connection with U.S. Appl. No. 13/864,251, filed Apr. 17, 2013, 11 pages".
"Non-Final Office Action mailed on Oct. 23, 2014, issued in connection with U.S. Appl. No. 13/888,203, filed May 6, 2013, 9 pages".
"Non-final Office Action mailed on Oct. 24, 2014, issued in connection with U.S. Appl. No. 13/435,776, filed Mar. 30, 2012, 14 pages".
"Non-Final Office Action mailed on Feb. 26, 2015, issued in connection with U.S. Appl. No. 14/186,850, filed Feb. 21, 2014, 25 pages."
Non-Final Office Action mailed on Mar. 26, 2015, issued in connection with U.S. Appl. No. 14/184,528, filed Feb. 19, 2014, 18 pages.
Non-Final Office Action mailed on Jun. 27, 2008, issued in connection with U.S. Appl. No. 10/861,653, filed Jun. 5, 2004, 19 pages.
Non-Final Office Action mailed on Mar. 27, 2015, issued in connection with U.S. Appl. No. 13/705,178, filed Dec. 5, 2012, 14 pages.
Non-Final Office Action mailed on Dec. 28, 2015, issued in connection with U.S. Appl. No. 14/290,493, filed May 29, 2014, 29 pages.
Non-Final Office Action mailed on Apr. 30, 2012, issued in connection with U.S. Appl. No. 13/204,511, filed Aug. 5, 2011, 16 pages.

(56) References Cited

OTHER PUBLICATIONS

Non-Final Office Action mailed on Jan. 30, 2015, issued in connection with U.S. Appl. No. 14/504,812, filed Oct. 2, 2014, 13 pages.
Non-Final Office Action mailed on Jan. 30, 2015, issued in connection with U.S. Appl. No. 14/290,493, filed May 29, 2014, 30 pages.
North American MPEG-2 Information, "The MPEG-2 Transport Stream", Retrieved from the Internet:, 2006, pp. 1-5.
Notice of Allowance mailed Jan. 31, 2013, issued in connection with U.S. Appl. No. 13/298,090, filed Nov. 16, 2011, 19 pages.
Notice of Allowance mailed on Jul. 2, 2015, issued in connection with U.S. Appl. No. 13/848,904, filed Mar. 22, 2013, 17 pages.
Notice of Allowance mailed on Jul. 2, 2015, issued in connection with U.S. Appl. No. 13/888,203, filed May 6, 2013, 19 pages.
Notice of Allowance mailed on Jul. 2, 2015, issued in connection with U.S. Appl. No. 14/184,935, filed Feb. 20, 2014, 23 pages.
Notice of Allowance mailed on Sep. 3, 2015, issued in connection with U.S. Appl. No. 13/705,174, filed Dec. 5, 2012, 4 pages.
Notice of Allowance mailed on Aug. 4, 2015, issued in connection with U.S. Appl. No. 14/516,867, filed Oct. 17, 2014, 13 pages.
Notice of Allowance mailed on Oct. 5, 2012, issued in connection with U.S. Appl. No. 13/204,511, filed Aug. 5, 2011, 11 pages.
Notice of Allowance mailed on Mar. 6, 2014, issued in connection with U.S. Appl. No. 13/827,653, filed Mar. 14, 2013, 17 pages.
Notice of Allowance mailed on May 6, 2011, issued in connection with U.S. Appl. No. 11/801,468, filed May 9, 2007, 10 pages.
Notice of Allowance mailed on Sep. 6, 2013, issued in connection with U.S. Appl. No. 13/619,237, filed Sep. 14, 2012, 10 pages.
Notice of Allowance mailed on Apr. 7, 2016, issued in connection with U.S. Appl. No. 13/533,105, filed Jun. 26, 2012, 40 pages.
Notice of Allowance mailed on Oct. 7, 2015, issued in connection with U.S. Appl. No. 14/184,526, filed Feb. 19, 2014, 7 pages.
Notice of Allowance mailed on Oct. 9, 2015, issued in connection with U.S. Appl. No. 13/435,739, filed Mar. 30, 2012, 4 pages.
Notice of Allowance mailed on Aug. 10, 2015, issued in connection with U.S. Appl. No. 13/848,904, filed Mar. 22, 2013, 9 pages.
Notice of Allowance mailed on Nov. 10, 2011, issued in connection with U.S. Appl. No. 11/906,702, filed Oct. 2, 2007, 17 pages.
Notice of Allowance mailed on Apr. 11, 2016, issued in connection with U.S. Appl. No. 13/864,247, filed Apr. 17, 2013, 21 pages.
Notice of Allowance mailed on Jan. 11, 2016, issued in connection with U.S. Appl. No. 14/565,544, filed Dec. 9, 2014, 5 pages.
Notice of Allowance mailed on Aug. 12, 2015, issued in connection with U.S. Appl. No. 13/435,739, filed Mar. 30, 2012, 27 pages.
Notice of Allowance mailed on Jul. 13, 2015, issued in connection with U.S. Appl. No. 14/184,526, filed Feb. 19, 2014, 22 pages.
Notice of Allowance mailed on Nov. 13, 2013, issued in connection with U.S. Appl. No. 13/724,048, filed Dec. 21, 2012, 7 pages.
Notice of Allowance mailed on Oct. 13, 2015, issued in connection with U.S. Appl. No. 13/864,251, filed Apr. 17, 2013, 7 pages.
Notice of Allowance mailed on Jun. 14, 2012, issued in connection with U.S. Appl. No. 12/035,112, filed Feb. 21, 2008, 9 pages.
Notice of Allowance mailed on Jul. 15, 2015, issued in connection with U.S. Appl. No. 13/705,174, filed Dec. 5, 2012, 18 pages.
Notice of Allowance mailed on Jun. 16, 2009, issued in connection with U.S. Appl. No. 10/861,653, filed Jun. 5, 2004, 11 pages.
Notice of Allowance mailed on Jul. 17, 2015, issued in connection with U.S. Appl. No. 13/864,251, filed Apr. 17, 2013, 20 pages.
Notice of Allowance mailed on May 19, 2015, issued in connection with U.S. Appl. No. 13/907,666, filed May 31, 2013, 7 pages.
Notice of Allowance mailed on Sep. 21, 2015, issued in connection with U.S. Appl. No. 13/297,000, filed Nov. 15, 2011, 11 pages.
Notice of Allowance mailed on Sep. 22, 2015, issued in connection with U.S. Appl. No. 13/888,203, filed May 6, 2013, 7 pages.
Notice of Allowance mailed on Sep. 24, 2015, issued in connection with U.S. Appl. No. 13/705,174, filed Dec. 5, 2012, 7 pages.
Notice of Allowance mailed on Sep. 24, 2015, issued in connection with U.S. Appl. No. 14/184,935, filed Feb. 20, 2014, 7 pages.
Notice of Allowance mailed on Sep. 25, 2014, issued in connection with U.S. Appl. No. 14/176,808, filed Feb. 10, 2014, 5 pages.
Notice of Allowance mailed on Aug. 27, 2015, issued in connection with U.S. Appl. No. 13/705,177, filed Dec. 5, 2012, 34 pages.
Notice of Allowance mailed on Aug. 27, 2015, issued in connection with U.S. Appl. No. 14/505,027, filed Oct. 2, 2014, 18 pages.
Notice of Allowance mailed on Dec. 27, 2011, issued in connection with U.S. Appl. No. 10/816,217, filed Apr. 1, 2004, 15 pages.
Notice of Allowance mailed on Jul. 29, 2015, issued in connection with U.S. Appl. No. 13/359,976, filed Jan. 27, 2012, 28 pages.
Notice of Allowance mailed on Jul. 29, 2015, issued in connection with U.S. Appl. No. 14/186,850, filed Feb. 21, 2014, 9 pages.
Notice of Allowance mailed on Jul. 30, 2015, issued in connection with U.S. Appl. No. 13/705,178, filed Dec. 5, 2012, 18 pages.
Notice of Allowance mailed on Aug. 5, 2015, issued in connection with U.S. Appl. No. 13/435,776, filed Mar. 30, 2012, 26 pages.
Notice of Allowance mailed on Jul. 6, 2015, issued in connection with U.S. Appl. No. 13/297,000, filed Nov. 15, 2011, 24 pages.
Nutzel et al., "Sharing Systems for Future HiFi Systems", IEEE, 2004, 9 pages.
Palm, Inc., "Handbook for the Palm VII Handheld," May 2000, 311 pages.
Park et al., "Group Synchronization in MultiCast Media Communications," Proceedings of the 5th Research on Multicast Technology Workshop, 2003, 5 pages.
Advisory Action mailed Feb. 2, 2016, issued in connection with U.S. Appl. No. 13/848,921, filed Mar. 22, 2013, 8 pages.
Advisory Action mailed Sep. 18, 2008, issued in connection with U.S. Appl. No. 10/816,217, filed Apr. 1, 2004, 8 pages.
Advisory Action mailed on Feb. 1, 2016, issued in connection with U.S. Appl. No. 13/864,247, filed Apr. 17, 2013, 6 pages.
Advisory Action mailed on Jun. 1, 2015, issued in connection with U.S. Appl. No. 14/516,867, filed Oct. 17, 2014, 11 pages.
Advisory Action mailed on Mar. 2, 2015, issued in connection with U.S. Appl. No. 13/848,932, filed Mar. 22, 2013, 3 pages.
Advisory Action mailed on Jan. 5, 2012, issued in connection with U.S. Appl. No. 12/035,112, filed Feb. 21, 2008, 3 pages.
Advisory Action mailed on Sep. 5, 2014, issued in connection with U.S. Appl. No. 13/907,666, filed May 31, 2013, 3 pages.
Advisory Action mailed on Jan. 8, 2015, issued in connection with U.S. Appl. No. 13/705,176, filed Dec. 5, 2012, 4 pages.
Advisory Action mailed on Feb. 10, 2016, issued in connection with U.S. Appl. No. 13/871,795, filed Apr. 26, 2013, 3 pages.
Advisory Action mailed on Nov. 12, 2014, issued in connection with U.S. Appl. No. 13/907,666, filed May 31, 2013, 6 pages.
Advisory Action mailed on Apr. 15, 2015, issued in connection with U.S. Appl. No. 14/184,526, filed Feb. 19, 2014, 9 pages.
Advisory Action mailed on Apr. 15, 2015, issued in connection with U.S. Appl. No. 14/184,935, filed Feb. 20, 2014, 9 pages.
Advisory Action mailed on Mar. 25, 2015, issued in connection with U.S. Appl. No. 13/533,105, filed Jun. 26, 2012, 5 pages.
Advisory Action mailed on Feb. 26, 2015, issued in connection with U.S. Appl. No. 14/184,528, filed Feb. 19, 2014, 3 pages.
Advisory Action mailed on Nov. 26, 2014, issued in connection with U.S. Appl. No. 14/186,850, filed Feb. 21, 2014, 9 pages.
Advisory Action mailed on Jul. 28, 2015, issued in connection with U.S. Appl. No. 14/184,522, filed Feb. 19, 2014, 7 pages.
Advisory Action mailed on Sep. 28, 2009, issued in connection with U.S. Appl. No. 10/816,217, filed Apr. 1, 2004, 4 pages.
"AudioTron Quick Start Guide, Version 1.0", Voyetra Turtle Beach, Inc., Mar. 2001, 24 pages.
"AudioTron Reference Manual, Version 3.0", Voyetra Turtle Beach, Inc., May 2002, 70 pages.
"AudioTron Setup Guide, Version 3.0", Voyetra Turtle Beach, Inc., May 2002, 38 pages.
Baldwin, Roberto. "How-To: Setup iTunes DJ on Your Max and iPhone", available at http://www.maclife.com/article/howtos/howto_setup_itunes_dj_your_mac_and_iphone, archived on Mar. 17, 2009, 4 pages.
Baudisch et al., "Flat Volume Control: Improving Usability by Hiding the Volume Control Hierarchy in the User Interface", 2004, 8 pages.

(56) References Cited

OTHER PUBLICATIONS

Benslimane Abderrahim, "A Multimedia Synchronization Protocol for Multicast Groups," Proceedings of the 26th Euromicro Conference, 2000, pp. 456-463, vol. 1.
Biersack et al., "Intra- and Inter-Stream Synchronization for Stored Multimedia Streams," IEEE International Conference on Multimedia Computing and Systems, 1996, pp. 372-381.
Blakowski G. et al., "A Media Synchronization Survey: Reference Model, Specification, and Case Studies", Jan. 1996, vol. 14, No. 1, 5-35.
Bluetooth. "Specification of the Bluetooth System: The ad hoc SCATTERNET for affordable and highly functional wireless connectivity," Core, Version 1.0 A, Jul. 26, 1999, 1068 pages.
Bluetooth. "Specification of the Bluetooth System: Wireless connections made easy," Core, Version 1.0 B, Dec. 1, 1999, 1076 pages.
Bretl W.E., et al., MPEG2 Tutorial [online], 2000 [retrieved on Jan. 13, 2009] Retrieved from the Internet:, pp. 1-23.
Canadian Intellectual Property Office, Canadian Office Action mailed on Apr. 4, 2016, issued in connection with Canadian Patent Application No. 2,842,342, 5 pages.
Canadian Intellectual Property Office, Canadian Office Action mailed on Sep. 14, 2015, issued in connection with Canadian Patent Application No. 2,842,342, 2 pages.
Chakrabarti et al., "A Remotely Controlled Bluetooth Enabled Environment", IEEE, 2004, pp. 77-81.
Corrected Notice of Allowance mailed on Aug. 19, 2015, issued in connection with U.S. Appl. No. 13/907,666, filed May 31, 2013, 2 pages.
Creative, "Connecting Bluetooth Devices with Creative D200," http://support.creative.com/kb/ShowArticle.aspx?url=http://ask.creative.com:80/SRVS/CGI-BIN/WEBCGI.EXE/,/?St=106,E=0000000000396859016,K=9377,Sxi=8, Varset=ws:http://us.creative.com,case=63350>, available on Nov. 28, 2011, 2 pages.
Crown PIP Manual available for sale at least 2004, 68 pages.
Dell, Inc. "Dell Digital Audio Receiver: Reference Guide," Jun. 2000, 70 pages.
Dell, Inc. "Start Here," Jun. 2000, 2 pages.
European Extended Search Repor mailed on Feb. 28, 2014, issued in connection with EP Application No. 13184747.7, 8 pages.
European Extended Search Report mailed Mar. 7, 2016, issued in connection with EP Application No. 13810340.3, 9 pages.
European Extended Search Report mailed on Mar. 31, 2015, issued in connection with EP Application No. 14181454.1, 9 pages.
European Patent Office, Examination Report mailed on Mar. 22, 2016, issued in connection with European Patent Application No. EP14181454.1, 6 pages.
Falcone, John, "Sonos BU150 Digital Music System review," CNET, CNET [online] Jul. 27, 2009 [retrieved on Mar. 16, 2016], 11 pages Retrieved from the Internet: URL:http://www.cnet.com/products/sonos-bu150-digital-music-system/.
Final Office Action mailed Jun. 5, 2014, issued in connection with U.S. Appl. No. 13/907,666, filed May 31, 2013, 12 pages.
Final Office Action mailed Jul. 13, 2009, issued in connection with U.S. Appl. No. 10/816,217, filed Apr. 1, 2004, 16 pages.
Final Office Action mailed Sep. 13, 2012, issued in connection with U.S. Appl. No. 13/297,000, filed Nov. 15, 2011, 17 pages.
Final Office Action mailed Nov. 18, 2015, issued in connection with U.S. Appl. No. 13/533,105, filed Jun. 26, 2012, 56 pages.
Final Office Action mailed Oct. 21, 2011, issued in connection with U.S. Appl. No. 10/816,217, filed Apr. 1, 2004, 19 pages.
Final Office Action mailed Mar. 27, 2014, issued in connection with U.S. Appl. No. 13/533,105, filed Jun. 26, 2012, 29 pages.
Final Office Action mailed Jan. 28, 2011, issued in connection with U.S. Appl. No. 10/816,217, filed Apr. 1, 2004, 21 pages.
Final Office Action mailed Jun. 30, 2008, issued in connection with U.S. Appl. No. 10/816,217, filed Apr. 1, 2004, 30 pages.
"884+ Automatic Matrix Mixer Control System," Ivie Technologies, Inc., 2000, pp. 1-4.

Advanced Driver Tab User Interface WaveLan GUI Guide, AVAGO0009, Agere Systems, Feb. 2004, 4 pages.
Agere Systems' Voice-over-Wireless LAN (VoWLAN) Station Quality of Service, AVAGO0015, Agere Systems, Jan. 2005, 5 pages.
Akyildiz et al., "Multimedia Group Synchronization Protocols for Integrated Services Networks," IEEE Journal on Selected Areas in Communications, 1996 pp. 162-173, vol. 14, No. 1.
Audio Authority: How to Install and Use the Model 1154 Signal Sensing Auto Selector, 2002, 4 pages.
Audio Authority: Model 1154B High Definition AV Auto Selector, 2008, 8 pages.
AudioSource: AMP 100 User Manual, 2003, 4 pages.
Automatic Profile Hunting Functional Description, AVAGO0013, Agere Systems, Feb. 2004, 2 pages.
AXIS Communication: AXIS P8221 Network I/O Audio Module, 2009, 41 pages.
Balfanz et al., "Network-in-a-Box: How to Set Up a Secure Wireless Network in Under a Minute", 13th USENIX Security Symposium—Technical Paper, 2002, 23 pages.
Balfanz et al., "Talking to Strangers: Authentication in Ad-Hoc Wireless Networks", Xerox Palo Alto Research Center, 2002, 13 pages.
Barham et al., "Wide Area Audio Synchronisation", University of Cambridge Computer Laboratory, 1995, 5 pages.
Bogen Communications, Inc., ProMatrix Digitally Matrixed Amplifier Model PM3180, Copyright 1996, 2 pages.
Brassil et al., "Enhancing Internet Streaming Media with Cueing Protocols", 2000, 9 pages.
Breebaart et al., "Multi-Channel Goes Mobile: MPEG Surround Binaural Rendering", AES 29th International Conference, 2006, Sep. 2-4, 1-13.
Cen et al., "A Distributed Real-Time MPEG Video Audio Player", Department of Computer Science and Engineering. Oregon Graduate Institute of Science and Technology, 1995, 12 pages.
Change Notification: Agere Systems WaveLan Multimode Reference Design (D2 to D3), AVAGO0042, Agere Systems, Nov. 2004, 2 pages.
Dannenberg et al., "A. System Supporting Flexible Distributed Real-Time Music Processing", Proceedings of the 2001 International Computer Music Conference, 2001, 4 pages.
Dannenberg; Roger B., "Remote Access to Interactive Media", Proceedings of the SPIE 1785, 1993, 230-237.
Day, Rebecca, "Going Elan!" Primedia Inc., 2003, 4 pages.
Deep-Sleep Implementation in WL60011 for IEEE 802.11b Applications, AVAGO0020, Agere Systems, Jul. 2004, 22 pages.
Denon AV Surround Receiver AVR-1604/684 User's Manual, 2004, 128 pages.
Denon AV Surround Receiver AVR-5800 Operating Instructions, Copyright 2000,67 pages.
Faller, Christof, "Coding of Spatial Audio Compatible with Different Playback Formats", Audio Engineering Society Convention Paper (Presented at the 117th Convention), Oct. 28-31, 2004, 12 pages.
Fireball DVD and Music Manager DVDM-100 Installation and User's Guide, Copyright 2003, 185 pages.
Fireball MP-200 User's Manual, Copyright 2006, 93 pages.
Fireball Remote Control Guide WD006-1-1, Copyright 2003, 19 pages.
Fireball SE-D1 User's Manual, Copyright 2005, 90 pages.
Fober et al., "Clock Skew Compensation over a High Latency Network," Proceedings of the ICMC, 2002, pp. 548-552.
Gaston et al., "Methods for Sharing Stereo and Multichannel Recordings Among Planetariums", Audio Engineering Society Convention Paper 7474, 2008, 15 pages.
Herre et al., "The Reference Model Architecture for MPEG Spatial Audio Coding", Audio Engineering Society Convention Paper (Presented at the 118th Convention), May 28-31, 2005, 13 pages.
IBM Home Director Installation and Service Manual, Copyright 1998, 124 pages.
IBM Home Director Owner's Manual, Copyright 1999, 67 pages.
Integra Audio Network Receiver NAC 2.3 Instruction Manual, 68 pages.

(56) References Cited

OTHER PUBLICATIONS

Integra Audio Network Server NAS 2.3 Instruction Manual, pp. 1-32.
Integra Service Manual, Audio Network Receiver Model NAC-2.3, Dec. 2002, 44 pages.
Ishibashi et al., "A Comparison of Media Synchronization Quality Among Reactive Control Schemes," IEEE Infocom, 2001, pp. 77-84.
Issues with Mixed IEEE 802.b/802.11g Networks, AVAGO0058, Agere Systems, Feb. 2004, 5 pages.
Lake Processors: Lake® LM Series Digital Audio Processors Operation Manual, 2011, 71 pages.
"A/V Surround Receiver AVR-5800," Denon Electronics, 2000, 2 pages.
"A/V System Controleer, Owner's Manual," B&K Compontents, Ltd., 1998, 52 pages.
"Denon 2003-2004 Product Catalog," Denon, 2003-2004, 44 pages.
"DP-0206 Digital Signal Processor," TOA Electronics, Inc., 2001, pp. 1-12.
"Home Theater Control Systems," Cinema Source, 2002, 19 pages.
"Model MRC44 Four Zone—Four Source Audio/Video Controller/ Amplifier System," Xantech Corporation, 2002, 52 pages.
"NexSys Software v. 3 Manual," Crest Audio, Inc., 1997, 76 pages.
"Residential Distributed Audio Wiring Practices," Leviton Network Solutions, 2001, 13 pages.
"RVL-6 Modular Multi-Room Controller, Installation & Operation Guide," Nile Audio Corporations, 1999, 46 pages.
"Systemline Modular Installation Guide, Multiroom System," Systemline, 2003, pp. 1-22.
"ZR-8630AV MultiZone Audio/Video Receiver, Installation and Operation Guide," Niles Audio Corporation, 2003, 86 pages.
ZX135: Installation Manual, LA Audio, Apr. 2003, 44 pages.
LG: RJP-201M Remote Jack Pack Installation and Setup Guide, 2010, 24 pages.
Lienhart et al., "On the Importance of Exact Synchronization for Distributed Audio Signal Processing", Session L: Poster Session II—ICASSP'03 Papers, 2002, 1 page.
LinkSys by Cisco, Wireless Home Audio Controller, Wireless-N Touchscreen Remote DMRW1000 Datasheet, Copyright 2008, 2 pages.
LinkSys by Cisco, Wireless Home Audio Controller, Wireless-N Touchscreen Remote DMRW1000 User Guide, Copyright 2008, 64 pages.
LinkSys by Cisco, Wireless Home Audio Player, Wireless-N Music Extender DMP100 Quick Installation Guide, Copyright 2009, 32 pages.
LinkSys by Cisco, Wireless Home Audio Player, Wireless-N Music Extender DMP100 User Guide, Copyright 2008, 65 pages.
Liu et al., "A synchronization control scheme for real-time streaming multimedia applications," Packet Video. 2003, 10 pages, vol. 2003.
Liu et al., "Adaptive Delay Concealment for Internet Voice Applications with Packet-Based Time-Scale Modification." Information Technologies 2000, 4 pages.
Parasound Zpre2 Zone Preamplifier with PTZI Remote Control, 2005, 16 pages.
Pillai et al., "A Method to Improve the Robustness of MPEG Video Applications over Wireless Networks", Kent Ridge Digital Labs, 2000, 15 pages.
Proficient Audio Systems M6 Quick Start Guide, 2011, 5 pages.
Proficient Audio Systems: Proficient Editor Advanced Programming Guide, 2007, 40 pages.
Programming Interface for WL54040 Dual-Band Wireless Transceiver, AVAGO0066, Agere Systems, May 2004, 16 pages.
Radio Shack, "Auto-Sensing 4-Way Audio/Video Selector Switch", 2004, 1 page.
RadioShack, Pro-2053 Scanner, 2002 Catalog, part 1, 100 pages.
RadioShack, Pro-2053 Scanner, 2002 Catalog, part 2, 100 pages.
RadioShack, Pro-2053 Scanner, 2002 Catalog, part 3, 100 pages.
RadioShack, Pro-2053 Scanner, 2002 Catalog, part 4, 100 pages.
RadioShack, Pro-2053 Scanner, 2002 Catalog, part 5, 46 pages.
Rangan et al., "Feedback Techniques for Continuity and Synchronization in Multimedia Information Retrieval", ACM Transactions on Information Systems, 1995, 13(2), 145-176.
Reid, Mark, "Multimedia conferencing over ISDN and IP networks using ITU-T H-series recommendations: architecture, control and coordination," Computer Networks, 1999, vol. 31, pp. 225-235.
Rothermel et al., "An Adaptive Protocol for Synchronizing Media Streams", Institute of Parallel and Distributed High-Performance Systems (IPVR), 1997, 26 pages.
Rothermel et al., "An Adaptive Adaptive Stream Synchronization Protocol," 5th International Workshop on Network and Operating System Support for Digital Audio and Video, Apr. 18-21, 1995, 12 pages.
Rothermel et al., "Synchronization in Joint-Viewing Environments", University of Stuttgart Institute of Parallel and Distributed High-Performance Systems, 1992, 13 pages.
*Sonos, Inc.* v. *D&M Holdings Inc. et al.*, Complaint for Patent Infringement, filed Oct. 21, 2014, 20 pages.
*Sonos, Inc.* v. *D&M Holdings Inc. et al.*, Declaration of Steven C. Visser, executed Sep. 9, 2016, 40 pages.
*Sonos, Inc.* v. *D&M Holdings Inc. et al.*, Defendant's Amended Invalidity Contentions, filed Sep. 14, 2016, 100 pages.
*Sonos, Inc.* v. *D&M Holdings Inc. et al.*, Defendant's Initial Invalidity Contentions Exhibit 1: Defendants' Invalidity Contentions for U.S. Pat. No. 7,571,014 filed Apr. 15, 2016, 161 pages.
*Sonos, Inc.* v. *D&M Holdings Inc. et al.*, Defendant's Initial Invalidity Contentions Exhibit 10: Defendants' Invalidity Contentions for U.S. Pat. No. 9,213,357 filed Apr. 15, 2016, 244 pages.
*Sonos, Inc.* v. *D&M Holdings Inc. et al.*, Defendant's Initial Invalidity Contentions Exhibit 11: Defendants' Invalidity Contentions for U.S. Pat. No. 9,219,959 filed Apr. 15, 2016, 172 pages.
*Sonos, Inc.* v. *D&M Holdings Inc. et al.*, Defendant's Initial Invalidity Contentions Exhibit 12: Defendants' Invalidity aontentions for U.S. Design Patent No. D559,197 filed Apr. 15, 2016, 36 pages.
*Sonos, Inc.* v. *D&M Holdings Inc. et al.*, Defendant's Initial Invalidity Contentions Exhibit 2: Defendants' Invalidity Contentions for U.S. Pat. No. 8,588,949 filed Apr. 15, 2016, 112 pages.
*Sonos, Inc.* v. *D&M Holdings Inc. et al.*, Defendant's Initial Invalidity Contentions Exhibit 3: Defendants' Invalidity Contentions for U.S. Pat. No. 8,843,224 filed Apr. 15, 2016, 118 pages.
*Sonos, Inc.* v. *D&M Holdings Inc. et al.*, Defendant's Initial Invalidity Contentions Exhibit 4: Defendants' Invalidity Contentions for U.S. Pat. No. 8,938,312 filed Apr. 15, 2016, 217 pages.
*Sonos, Inc.* v. *D&M Holdings Inc. et al.*, Defendant's Initial Invalidity Contentions Exhibit 5: Defendants' Invalidity Contentions for U.S. Pat. No. 8,938,637 filed Apr. 15, 2016, 177 pages.
*Sonos, Inc.* v. *D&M Holdings Inc. et al.*, Defendant's Initial Invalidity Contentions Exhibit 6: Defendants' Invalidity Contentions for U.S. Pat. No. 9,042,556 filed Apr. 15, 2016, 86 pages.
*Sonos, Inc.* v. *D&M Holdings Inc. et al.*, Defendant's Initial Invalidity Contentions Exhibit 7: Defendants' Invalidity Contentions for U.S. Pat. No. 9,130,771 filed Apr. 15, 2016, 203 pages.
*Sonos, Inc.* v. *D&M Holdings Inc. et al.*, Defendant's Initial Invalidity Contentions Exhibit 8: Defendants' Invalidity Contentions for U.S. Pat. No. 9,195,258 filed Apr. 15, 2016, 400 pages.
*Sonos, Inc.* v. *D&M Holdings Inc. et al.*, Defendant's Initial Invalidity Contentions Exhibit 9: Defendants' Invalidity Contentions for U.S. Pat. No. 9,202,509 filed Apr. 15, 2016, 163 pages.
*Sonos, Inc.* v. *D&M Holdings Inc. et al.*, Defendant's Initial Invalidity Contentions, filed Apr. 15, 2016, 97 pages.
*Sonos, Inc.* v. *D&M Holdings Inc. et al.*, Defendant's Preliminary Identification of Indefinite Terms, provided Jul. 29, 2016, 8 pages.
*Sonos, Inc.* v. *D&M Holdings Inc. et al.*, Defendant's Preliminary Identification of Prior Art References, provided Jul. 29, 2016, 5 pages.
*Sonos, Inc.* v. *D&M Holdings Inc. et al.*, Defendants' Amended Answer, Defenses, and Counterclaims for Patent Infringement, filed Nov. 30, 2015, 47 pages.
*Sonos, Inc.* v. *D&M Holdings Inc. et al.*, Defendants' Answer to Plaintiff's Second Amended Complaint, filed Apr. 30, 2015, 19 pages.

(56) References Cited

OTHER PUBLICATIONS

*Sonos, Inc.* v. *D&M Holdings Inc. et al.*, Defendants' First Amended Answer to Plaintiffs' Third Amended Complaint, filed Sep. 7, 2016, 23 pages.
*Sonos, Inc.* v. *D&M Holdings Inc. et al.*, Defendants' Reply in Support of Partial Motion for Judgment on the Pleadings, filed Jun. 10, 2016, 15 pages.
*Sonos, Inc.* v. *D&M Holdings Inc. et al.*, Exhibit A: Defendants' Second Amended Answer to Plaintiffs' Third Amended Complaint, filed Sep. 9, 2016, 43 pages.
*Sonos, Inc.* v. *D&M Holdings Inc. et al.*, First Amended Complaint for Patent Infringement, filed Dec. 17, 2014, 26 pages.
*Sonos, Inc.* v. *D&M Holdings Inc. et al.*, Joint Claim Construction Chart, vol. 1 of 3 with Exhibits A-O, filed Aug. 17, 2016, 30 pages.
*Sonos, Inc.* v. *D&M Holdings Inc. et al.*, Opening Brief in Support of Defendants' Partial Motion for Judgment on the Pleadings for Lack of Patent-Eligible Subject Matter, filed May 6, 2016, 27 pages.
*Sonos, Inc.* v. *D&M Holdings Inc. et al.*, Plaintiff Sonos, Inc.'s Opening Claim Construction Brief, filed Sep. 9, 2016, 26 pages.
*Sonos, Inc.* v. *D&M Holdings Inc. et al.*, Plaintiff Sonos, Inc.'s Response in Opposition to Defendants' Partial Motion for Judgment on the Pleadings, filed May 27, 2016, 24 pages.
*Sonos, Inc.* v. *D&M Holdings Inc. et al.*, Second Amended Complaint for Patent Infringement, filed Feb. 27, 2015, 49 pages.
*Sonos, Inc.* v. *D&M Holdings Inc. et al.*, Third Amended Complaint for Patent Infringement, filed Jan. 29, 2016, 47 pages.
Sony: Air-SA 50R Wireless Speaker, Copyright 2009, 2 pages.
Sony: Altus Quick Setup Guide ALT-SA32PC, Copyright 2009, 2 pages.
Sony: BD/DVD Home Theatre System Operating Instructions for BDV-E300, E301 and E801, Copyright 2009, 115 pages.
Sony: BD/DVD Home Theatre System Operating Instructions for BDV-IT1000/BDV-IS1000, Copyright 2008, 159 pages.
Sony: Blu-ray Disc/DVD Home Theatre System Operating Instructions for BDV-IZ1000W, Copyright 2010, 88 pages.
Sony: DVD Home Theatre System Operating Instructions for DAV-DZ380W/DZ680W/DZ880W, Copyright 2009, 136 pages.
Sony: DVD Home Theatre System Operating Instructions for DAV-DZ870W, Copyright 2008, 128 pages.
Sony Ericsson MS500 User Guide, Copyright 2009, 2 pages.
Sony: Home Theatre System Operating Instructions for HT-IS100, Copyright 2008, 168 pages.
Sony: HT-IS100, 5.1 Channel Audio System, last updated Nov. 2009, 2 pages.
Sony: Multi Channel AV Receiver Operating Instructions, 2007, 80 pages.
Sony: Multi Channel AV Receiver Operating Instructions for STR-DN1000, Copyright 2009, 136 pages.
Sony: STR-DN1000, Audio Video Receiver, last updated Aug. 2009, 2 pages.
Sony: Wireless Surround Kit Operating Instructions for WHAT-SA2, Copyright 2010, 56 pages.
Taylor, Marilou, "Long Island Sound," Audio Video Interiors, Apr. 2000, 8 pages.
TOA Corporation, Digital Processor DP-0206 DACsys2000 Version 2.00 Software Instruction Manual, Copyright 2001,67 pages.
WaveLan High-Speed Multimode Chip Set, AVAGO0003, Agere Systems, Feb. 2003, 4 pages.
WaveLan High-Speed Multimode Chip Set, AVAGO0005, Agere Systems, Feb. 2003, 4 pages.
WaveLAN Wireless Integration Developer Kit (WI-DK) for Access Point Developers, AVAGO0054, Agere Systems, Jul. 2003, 2 pages.
WaveLAN Wireless Integration-Developer Kit (WI-DK) Hardware Control Function (HCF), AVAGO0052, Agere Systems, Jul. 2003, 2 pages.
WI-DK Release 2 WaveLan Embedded Drivers for VxWorks and Linux, AVAGO0056, Agere Systems, Jul. 2003, 2 pages.
WI-DK Release 2 WaveLan END Reference Driver for VxWorks, AVAGO0044, Agere Systems, Jul. 2003, 4 pages.

WI-DK Release 2 WaveLan LKM Reference Drivers for Linux, AVAGO0048, Agere Systems, Jul. 2003, 4 pages.
WPA Reauthentication Rates, AVAGO0063, Agere Systems, Feb. 2004, 3 pages.
European Patent Office, Examination Report mailed on Oct. 24, 2016, issued in connection with European Patent Application No. 13808623.6, 4 pages.
"Final Office Action mailed on Oct. 19, 2016, issued in connection with U.S. Appl. No. 13/848,921, filed Mar. 22, 2013, 14 pages".
Non-Final Office Action mailed on Nov. 3, 2016, issued in connection with U.S. Appl. No. 14/184,528, filed Feb. 19, 2014, 17 pages.
Non-Final Office Action mailed on Oct. 4, 2016, issued in connection with U.S. Appl. No. 15/089,758, filed Apr. 4, 2016, 9 pages.
Non-Final Office Action mailed on Oct. 5, 2016, issued in connection with U.S. Appl. No. 13/864,250, filed Apr. 17, 2013, 10 pages.
Non-Final Office Action mailed on Oct. 5, 2016, issued in connection with U.S. Appl. No. 13/864,252, filed Apr. 17, 2013, 11 pages.
Non-Final Office Action mailed on Oct. 6, 2016, issued in connection with U.S. Appl. No. 15/088,678, filed Apr. 1, 2016, 9 pages.
Non-Final Office Action mailed on Oct. 7, 2016, issued in connection with U.S. Appl. No. 15/156,392, filed May 17, 2016, 8 pages.
Non-Final Office Action mailed on Sep. 21, 2016, issued in connection with U.S. Appl. No. 15/080,591, filed Mar. 25, 2016, 9 pages.
Non-Final Office Action mailed on Sep. 21, 2016, issued in connection with U.S. Appl. No. 15/080,716, filed Mar. 25, 2016, 8 pages.
Non-Final Office Action mailed on Sep. 21, 2016, issued in connection with U.S. Appl. No. 15/088,283, filed Apr. 1, 2016, 8 pages.
Non-Final Office Action mailed on Sep. 21, 2016, issued in connection with U.S. Appl. No. 15/088,532, filed Apr. 1, 2016, 9 pages.
Non-Final Office Action mailed on Sep. 22, 2016, issued in connection with U.S. Appl. No. 15/155,149, filed May 16, 2016, 7 pages.
Non-Final Office Action mailed on Sep. 30, 2016, issued in connection with U.S. Appl. No. 13/864,249, filed Apr. 17, 2013, 12 pages.
Notice of Allowance mailed on Oct. 19, 2016, issued in connection with U.S. Appl. No. 14/290,493, filed May 29, 2014, 14 pages.
Chinese Office Action mailed on Jul. 5, 2016, issued in connection with Chinese Patent Application No. 201380044380.2, 25 pages.
"RVL-6 Modular Multi-Room Controller, Installation & Operation Guide," Nile Audio Corporations, 1999,46 pages.
Liu et al., "A synchronization control scheme for real-time streaming multimedia applications" Packet Video. 2003, 10 pages, vol. 2003.
Liu et al., "Adaptive Delay Concealment for Internet Voice Applications with Packet-Based Time-Scale Modification." Information Technologies 2000, pp. 91-102.
Non-Final Office Action mailed Sep. 7, 2016, issued in connection with U.S. Appl. No. 13/864,248, filed Apr. 17, 2013, 12 pages.
Non-Final Office Action mailed on Aug. 9, 2016, issued in connection with U.S. Appl. No. 13/871,795, filed Apr. 26, 2013, 31 pages.
Notice of Allowance mailed on Aug. 30, 2016, issued in connection with U.S. Appl. No. 14/290,493, filed May 29, 2014, 7 pages.
Reid; Mark, "Multimedia conferencing over ISDN and IP networks using ITU-T H-series recommendations: architecture, control and coordination", Computer Networks, 1999, vol. 31, 225-235.
Rothermel et al., "An Adaptive Stream Synchronization Protocol," 5th International Workshop on Network and Operating System Support for Digital Audio and Video, Apr. 18-21, 1995, 12 pages.
European Patent Office, Office Action dated Nov. 25, 2016, issued in connection with EP Application No. 13810340.3, 5 pages.
Japanese Patent Office, Office Action dated Nov. 22, 2016, issued in connection with Japanese Application No. 2015-520288, 6 pages.
Japanese Patent Office, Office Action dated Nov. 29, 2016, issued in connection with Japanese Application No. 2015-516169, 4 pages.
Final Office Action dated Dec. 13, 2016, issued in connection with U.S. Appl. No. 13/871795, filed Apr. 26, 2013, 41 pages.
Non-Final Office Action dated Nov. 10, 2016, issued in connection with U.S. Appl. No. 15/243,355, filed Aug. 22, 2016, 11 pages.
Non-Final Office Action dated Nov. 16, 2016, issued in connection with U.S. Appl. No. 15/228,639, filed Aug. 4, 2016, 15 pages.

(56) References Cited

OTHER PUBLICATIONS

Non-Final Office Action dated Nov. 29, 2016, issued in connection with U.S. Appl. No. 13/894,179, filed May 14, 2013, 14 pages.
Non-Final Office Action dated Nov. 30, 2016, issued in connection with U.S. Appl. No. 15/243,186, filed Aug. 22, 2016, 12 pages.
Notice of Allowance dated Dec. 1, 2016, issued in connection with U.S. Appl. No. 15/088,283, filed Apr. 1, 2016, 9 pages.
Notice of Allowance dated Dec. 2, 2016, issued in connection with U.S. Appl. No. 15/088,532, filed Apr. 1, 2016, 9 pages.
Notice of Allowance dated Dec. 2, 2016, issued in connection with U.S. Appl. No. 15/088,678, filed Apr. 1, 2016, 9 pages.
Notice of Allowance dated Dec. 2, 2016, issued in connection with U.S. Appl. No. 15/089,758, filed Apr. 4, 2016, 9 pages.
Notice of Allowance dated Dec. 2, 2016, issued in connection with U.S. Appl. No. 15/155,149, filed May 16, 2016, 9 pages.
Notice of Allowance dated Dec. 13, 2016, issued in connection with U.S. Appl. No. 15/080,591, filed Mar. 25, 2016, 9 pages.
Notice of Allowance dated Dec. 22, 2016, issued in connection with U.S. Appl. No. 15/080,716, filed Mar. 25, 2016, 9 pages.
Advisory Action dated Dec. 28, 2016, issued in connection with U.S. Appl. No. 13/705,176, filed Dec. 5, 2012, 4 pages.
AVTransport:1 Service Template Version 1.01 For UPnP, Version 1.0 (Jun. 25, 2002) (66 pages).
Chinese Office Action, Office Action dated Dec. 20, 2016, issued in connection with Chinese Application No. 201380044446.8, 16 pages.
Connection Manager: 1 Service Template Version 1.01 For UPnP, Version 1.0 (Jun. 25, 2002) (25 pages).
ContentDirectory:1 Service Template Version 1.01 For UPnP, Version 1.0 (Jun. 25, 2002) (89 pages).
Designing a UPnP AV MediaServer, Nelson Kidd (2003) (SONDM000115062-116) (55 pages).
Dhir, Amit, "Wirless Home Networks—DECT, Bluetooth, Home RF, and wireless LANs," XILINX, wp135 (v1.0), Mar. 21, 2001, 18 pages.
Final Office Action dated Jan. 12, 2017, issued in connection with U.S. Appl. No. 14/504,812, filed Oct. 2, 2014, 25 pages.
Fout, Tom, "Universal Plug and Play (UPnP) Client Support," Microsoft, Aug. 2001, 18 pages.
General Event Notification Architecture Base: Client to Arbiter (Apr. 2000) (23 pages).
Home Networking with Universal Plug and Play, IEEE Communications Magazine, vol. 39 No. 12 (Dec. 2001) (D+M_0402025-40) (16 pages).
Intel Designing a UPnP AV Media Renderer, v. 1.0 ("Intel AV Media Renderer") (May 20, 2003) (SONDM000115117-62) (46 pages).
Intel Media Renderer Device Interface ("Intel Media Renderer") (Sep. 6, 2002) (62 pages).
Intel SDK for UPnP Devices Programming Guide, Version 1.2.1, (Nov. 2002) (30 pages).
Japanese Patent Office, Final Office Action dated Nov. 8, 2016, issued in connection with Japanese Patent Application No. 2015-520286, 5 pages.
Kou et al., "RenderingControl:1 Service Template Version 1.01," Contributing Members of the UPnP Forum, Jun. 25, 2002, 63 pages.
Linux SDK for UPnP Devices v. 1.2 (Sep. 6, 2002) (101 pages).
"Linux SDK for UPnP Devices v1.2," Intel Corporation, Jan. 17, 2003, 102 pages.
MediaRenderer:1 Device Template Version 1.01 For UPnP, Version 1.0 (Jun. 25, 2002) (12 pages).
MediaServer:1 Device Template Version 1.01 For UPnP, Version 1.0 (Jun. 25, 2002) (12 pages).
Microsoft, Universal Plug and Play (UPnP) Client Support ("Microsoft UPnP") (Aug. 2002) (D+M_0402007-24) (18 pages).
Microsoft Window's XP Reviewer's Guide (Aug. 2001) (D+M_0402225-85) (61 pages).
Network Time Protocol (NTP), RFC 1305 (Mar. 1992) (D+M_0397417-536) (120 pages).
Non-Final Office Action dated Jan. 3, 2017, issued in connection with U.S. Appl. No. 14/808,875, filed Jul. 24, 2015, 10 pages.

Non-Final Office Action dated Jan. 12, 2017, issued in connection with U.S. Appl. No. 13/895,076, filed May 15, 2013, 10 pages.
Notice of Allowance dated Dec. 7, 2016, issued in connection with U.S. Appl. No. 15/156,392, filed May 17, 2016, 9 pages.
Pascoe, Bob, "Salutation Architectures and the newly defined service discovery protocols from Microsoft® and Sun®," Salutation Consortium, White Paper, Jun. 6, 1999, 5 pages.
Real Time Control Protocol (RTCP) and Realtime Transfer Protocol (RTP), RFC 1889 (Jan. 1996) (D+M_0397810-84) (75 pages).
Realtime Streaming Protocol (RTSP), RFC 2326 (Apr. 1998) (D+M_0397945-8036) (92 pages).
Realtime Transport Protocol (RTP), RFC 3550 (Jul. 2003) (D+M_0398235-323) (89 pages).
RenderingControl:1 Service Template Version 1.01 For UPnP, Version 1.0, (Jun. 25, 2002) (SONDM000115187-249) (63 pages).
Ritchie et al., "MediaServer:1 Device Template Version 1.01," Contributing Members of the UPnP Forum, Jun. 25, 2002, 12 pages.
Ritchie et al., "UPnP AV Architecture:1, Version 1.0," Contributing Members of the UPnP Forum, Jun. 25, 2002, 22 pages.
Ritchie, John, "MediaRenderer:1 Device Template Version 1.01," Contributing Members of the UPnP Forum, Jun. 25, 2002, 12 pages.
Schulzrinne et al., "RTP: A Transport Protocol for Real-Time Applications," Network Working Group, Jan. 1996, pp. 1-75.
Simple Network Time Protocol (SNTPI), RFC 1361 (Aug. 1992) (D+M_0397537-46) (10 pages).
Simple Network Time Protocol (SNTPII), RFC 1769 (Mar. 1995) (D+M_0397663-76) (14 pages).
Simple Service Discovery Protocol/1.0 Operating without an Arbiter (Oct. 28, 1999) (24 pages).
*Sonos, Inc.* v. *D&M Holdings Inc. et al.*, Defendant's Amended Invalidity Contentions Exhibit 1: Defendants' Invalidity Contentions for U.S. Pat. No. 7,571,014 filed Sep. 16, 2016, 270 pages.
*Sonos, Inc.* v. *D&M Holdings Inc. et al.*, Defendant's Amended Invalidity Contentions Exhibit 10: Defendants' Invalidity Contentions for U.S. Pat. No. 9,219,959 filed Sep. 27, 2016, 236 pages.
*Sonos, Inc.* v. *D&M Holdings Inc. et al.*, Defendant's Amended Invalidity Contentions Exhibit 11: Defendants' Invalidity Contentions for Design U.S. Pat. No. D559,197 filed Sep. 27, 2016, 52 pages.
*Sonos, Inc.* v. *D&M Holdings Inc. et al.*, Defendant's Amended Invalidity Contentions Exhibit 2: Defendants' Invalidity Contentions for U.S. Pat. No. 8,588,949 filed Sep. 27, 2016, 224 pages.
*Sonos, Inc.* v. *D&M Holdings Inc. et al.*, Defendant's Amended Invalidity Contentions Exhibit 3: Defendants' Invalidity Contentions for U.S. Pat. No. 8,843,224 filed Sep. 27, 2016, 147 pages.
*Sonos, Inc.* v. *D&M Holdings Inc. et al.*, Defendant's Amended Invalidity Contentions Exhibit 4: Defendants' Invalidity Contentions for U.S. Pat. No. 8,938,312 filed Sep. 27, 2016, 229 pages.
*Sonos, Inc.* v. *D&M Holdings Inc. et al.*, Defendant's Amended Invalidity Contentions Exhibit 5: Defendants' Invalidity Contentions for U.S. Pat. No. 8,938,637 filed Sep. 27, 2016, 213 pages.
*Sonos, Inc.* v. *D&M Holdings Inc. et al.*, Defendant's Amended Invalidity Contentions Exhibit 6: Defendants' Invalidity Contentions for U.S. Pat. No. 9,042,556 filed Sep. 27, 2016, 162 pages.
*Sonos, Inc.* v. *D&M Holdings Inc. et al.*, Defendant's Amended Invalidity Contentions Exhibit 7: Defendants' Invalidity Contentions for U.S. Pat. No. 9,195,258 filed Sep. 27, 2016, 418 pages.
*Sonos, Inc.* v. *D&M Holdings Inc. et al.*, Defendant's Amended Invalidity Contentions Exhibit 8: Defendants' Invalidity Contentions for U.S. Pat. No. 9,202,509 filed Sep. 27, 2016, 331 pages.
*Sonos, Inc.* v. *D&M Holdings Inc. et al.*, Defendant's Amended Invalidity Contentions Exhibit 9: Defendants' Invalidity Contentions for U.S. Pat. No. 9,213,357 filed Sep. 27, 2016, 251 pages.
*Sonos, Inc.* v. *D&M Holdings Inc. et al.*, Defendants' Brief in Support of their Motion for Leave to Amend their Answer to Add the Defense of Inequitable Conduct, provided Oct. 12, 2016, 24 pages.
*Sonos, Inc.* v. *D&M Holdings Inc. et al.*, Defendants' Opposition to Sonos's Motion to Strike Defendants' New Amended Answer Submitted with their Reply, provided Oct. 3, 2016, 15 pages.
*Sonos, Inc.* v. *D&M Holdings Inc. et al.*, Exhibit A: Defendants' First Amended Answer to Plaintiffs' Third Amended Complaint, provided Aug. 1, 2016, 26 pages.

(56) References Cited

OTHER PUBLICATIONS

*Sonos, Inc.* v. *D&M Holdings Inc. et al.*, Exhibit A: Defendants' Second Amended Answer to Plantiffs' Third Amended Complaint, provided Oct. 12, 2016, 43 pages.
*Sonos, Inc.* v. *D&M Holdings Inc. et al.*, Exhibit A: Defendants' Second Amended Answer to Plaintiffs' Third Amended Complaint, provided Sep. 9, 2016, 88 pages.
*Sonos, Inc.* v. *D&M Holdings Inc. et al.*, Exhibit B: Defendants' Second Amended Answer to Plaintiffs' Third Amended Complaint, provided Oct. 12, 2016, 43 pages.
*Sonos, Inc.* v. *D&M Holdings Inc. et al.*, Opening Brief in Support of Defendants' Motion for Leave to Amend Their Answer to Add the Defense of Inequitable Conduct, provided Aug. 1, 2016, 11 pages.
*Sonos, Inc.* v. *D&M Holdings Inc. et al.*, Order, provided Oct. 7, 2016, 2 pages.
*Sonos, Inc.* v. *D&M Holdings Inc. et al.*, Plaintiff's Opposition to Defendants' Motion for Leave to Amend Their Answer to Add the Defense of Inequitable Conduct, provided Aug. 26, 2016, 25 pages.
*Sonos, Inc.* v. *D&M Holdings Inc. et al.*, Redlined Exhibit B: Defendants' First Amended Answer to Plaintiffs' Third Amended Complaint, provided Aug. 1, 2016, 27 pages.
*Sonos, Inc.* v. *D&M Holdings Inc. et al.*, Reply Brief in Support of Defendants' Motion for Leave to Amend their Answer to Add the Defense Of Inequitable Conduct, provided Nov. 10, 2016, 16 pages.
*Sonos, Inc.* v. *D&M Holdings Inc. et al.*, Reply Brief in Support of Defendants' Motion for Leave to Amend their Answer to Add the Defense of Inequitable Conduct, provided Sep. 9, 2016, 16 pages.
*Sonos, Inc.* v. *D&M Holdings Inc. et al.*, Sonos's Motion to Strike Defendants' New Amended Answer Submitted with their Reply Brief, provided Sep. 15, 2016, 10 pages.
*Sonos, Inc.* v. *D&M Holdings Inc. et al.*, Sonos's Opposition to Defendants' Motion for Leave to Amend their Answer to Add the Defense of Inequitable Conduct, provided Oct. 31, 2016, 26 pages.
*Sonos, Inc.* v. *D&M Holdings*, DI 206-1, Transcript of 101 Hearing (Nov. 28, 2016) (28 pages).
*Sonos, Inc.* v. *D&M Holdings*, DI 207, Public Joint Claim Construction Brief (Nov. 30, 2016) (88 pages).
*Sonos, Inc.* v. *D&M Holdings*, DI 214, D&M Post-Markman Letter (Dec. 22, 2016) (13 pages).
*Sonos, Inc.* v. *D&M Holdings*, DI 215, Sonos Post-Markman Letter (Dec. 22, 2016) (15 pages).
*Sonos, Inc.* v. *D&M Holdings*, DI 219, Claim Construction Opinion (Jan. 12, 2017) (24 pages).
*Sonos, Inc.* v. *D&M Holdings*, DI 221, Claim Construction Order (Jan. 18, 2017) (2 pages).
*Sonos, Inc.* v. *D&M Holdings*, DI 226, Opinion Denying Inequitable Conduct Defenses, Feb. 6, 2017, 5 pages.
*Sonos, Inc.* v. *D&M Holdings*, DI 227, Order Denying Inequitable Conduct Defenses, Feb. 6, 2017, 1 page.
*Sonos, Inc.* v. *D&M Holdings*, Markman Hearing Transcript (Dec. 14, 2016) (69 pages).
Understanding Universal Plug and Play, Microsoft White Paper (Jun. 2000) (D+M_0402074-118) (45 pages).
U.S. Appl. No. 60/490,768, filed Jul. 28, 2003, entitled "Method for synchronizing audio playback between multiple networked devices," 13 pages.
U.S. Appl. No. 60/825,407, filed Sep. 12, 2003, entitled "Controlling and manipulating groupings in a multi-zone music or media system," 82 pages.
Universal Play and Play Device Architecture V. 1.0, (Jun. 8, 2000) (54 pages).
Universal Plug and Play in Windows XP, Tom Fout. Microsoft Corporation (Jul. 2001) (D+M_0402041-73) (33 pages).
Universal Plug and Play ("UPnP") AV Architecture:1 For UPnP, Version 1.0, (Jun. 25, 2002) (D+M_0298151-72) (22 pages).
Universal Plug and Play Vendor's Implementation Guide (Jan. 5, 2000) (7 pages).
"UPnP and Sonos Questions," Sonos Community, Dec. 2006, 5 pages.
UPnP AV Architecture:0.83 (Jun. 12, 2002) (SONDM000115483-504) (22 pages).
UPnP Design by Example, A Software Developers Guide to Universal Plug and Play Michael Jeronimo and JackWeast, Intel Press (D+M_0401307-818) (Apr. 2003) (511 pages).
WANCommonInterfaceConfig: 1 Service Template Version 1.01 For UPnP, Ver. 1.0 (Nov. 12, 2001) (D+M_0401820-43) (24 pages).
WANIPConnection:1 Service Template Version 1.01 For UPnP Ver. 1.0 (Nov. 12, 2001) (D+M_0401844-917) (74 pages).
WANPPPConnection:1 Service Template Version 1.01 For UPnP, Version 1.0 (Nov. 12, 2001) (D+M_0401918-2006) (89 pages).
Windows Media Connect Device Compatibility Specification (Apr. 12, 2004) (16 pages).
Yamaha DME 64 Owner's Manual; copyright 2004, 80 pages.
Yamaha DME Designer 3.5 setup manual guide; copyright 2004, 16 pages.
Yamaha DME Designer 3.5 User Manual; Copyright 2004, 507 pages.
Advisory Action dated Mar. 8, 2017, issued in connection with U.S. Appl. No. 13/871,795, filed Apr. 26, 2013, 22 pages.
*Sonos, Inc.* v. *D&M Holdings, Inc.*, Defendants' Final Invalidity Contentions (Jan. 18, 2017) (106 pages).
*Implicit, LLC* v. *Sonos, Inc.*, Defendants' Original Complaint (Mar. 3, 2017) (15 pages).
Notice of Allowance dated Feb. 10, 2017, issued in connection with U.S. Appl. No. 14/290,493, filed May 29, 2014, 13 pages.
Notice of Allowance dated Mar. 15, 2017, issued in connection with U.S. Appl. No. 15/080,716, filed Mar. 25, 2016, 7 pages.
Notice of Allowance dated Mar. 27, 2017, issued in connection with U.S. Appl. No. 15/089,758, filed Apr. 4, 2016, 7 pages.
Notice of Allowance dated Mar. 28, 2017, issued in connection with U.S. Appl. No. 15/088,532, filed Apr. 1, 2016, 7 pages.
Notice of Allowance dated Mar. 28, 2017, issued in connection with U.S. Appl. No. 15/088,906, filed Apr. 1, 2016, 7 pages.
Rothermel et al., "Clock Hierarchives—An Abstraction for Grouping and Controlling Media Streams," University of Stuttgart Institute of Parallel and Distributed High-Performance Systems, Jan. 1996, 23 pages.
Rothermel, Kurt, "State-of-the-Art and Future Research in Stream Synchronization," University of Stuttgart, 3 pages.
*Sonos, Inc.* v. *D&M Holdings*, D&M Supp Opposition Brief including Exhibits, Mar. 17, 2017, 23 pages.
*Sonos, Inc.* v. *D&M Holdings*, Expert Report of Jay P. Kesan including Appendices A-P, Feb. 20, 2017, 776 pages.
*Sonos, Inc.* v. *D&M Holdings*, DI 226, Opinion Denying Inequitable Conduct Defenses, Feb. 6, 2017, updated, 5 pages.
*Sonos, Inc.* v. *D&M Holdings*, DI 242, US District Judge Andrews 101 Opinion, Mar. 13, 2017, 16 pages.
*Sonos, Inc.* v. *D&M Holdings*, Sonos Supp Opening Markman Brief including Exhibits, Mar. 3, 2017, 17 pages.
*Sonos, Inc.* v. *D&M Holdings*, Sonos Supp Reply Markman Brief including Exhibits, Mar. 29, 2017, 36 pages.
Final Office Action dated Apr. 10, 2017, issued in connection with U.S. Appl. No. 15/243,355, filed Aug. 22, 2016, 15 pages.
"Symantec pcAnywhere User's Guide," v 10.5.1, 1995-2002, 154 pages.
Final Office Action dated May 15, 2017, issued in connection with U.S. Appl. No. 13/864,252, filed Apr. 17, 2013, 13 pages.
Final Office Action dated May 16, 2017, issued in connection with U.S. Appl. No. 13/864,249, filed Apr. 17, 2013, 14 pages.
Final Office Action dated May 16, 2017, issued in connection with U.S. Appl. No. 13/864,250, filed Apr. 17, 2013, 12 pages.
Final Office Action dated Apr. 20, 2017, issued in connection with U.S. Appl. No. 13/864,248, filed Apr. 17, 2013, 14 pages.
Fries et al. "The MP3 and Internet Audio Handbook: Your Guide to the Digital Music Revolution." 2000, 320 pages.
"Microsoft Windows XP File and Printer Share with Microsoft Windows" Microsoft Windows XP Technical Article, 2003, 65 pages.
"SMPTE Made Simple: A Time Code Tutor by Timeline," 1996, 46 pages.
Niederst, Jennifer "O'Reilly Web Design in a Nutshell," Second Edition, Sep. 2001, 678 pages.

(56) References Cited

OTHER PUBLICATIONS

Non-Final Office Action dated Apr. 10, 2017, issued in connection with U.S. Appl. No. 13/871,785, filed on Apr. 26, 2013, 10 pages.
Non-Final Office Action dated Apr. 20, 2017, issued in connection with U.S. Appl. No. 90/013,882, filed Dec. 27, 2016, 197 pages.
Notice of Allowance dated Mar. 9, 2017, issued in connection with U.S. Appl. No. 15/080,591, filed Mar. 25, 2016, 7 pages.
Notice of Allowance dated Apr. 25, 2017, issued in connection with U.S. Appl. No. 15/156,392, filed May 17, 2016, 8 pages.
Notice of Allowance dated Mar. 27, 2017, issued in connection with U.S. Appl. No. 15/089,758, filed on Apr. 4, 2016, 7 pages.
Notice of Allowance dated Mar. 28, 2017, issued in connection with U.S. Appl. No. 15/155,149, filed May 16, 2016, 7 pages.
Notice of Allowance dated Apr. 3, 2017, issued in connection with U.S. Appl. No. 15/088,678, filed Apr. 1, 2016, 8 pages.
Notice of Allowance dated Mar. 30, 2017, issued in connection with U.S. Appl. No. 15/088,532, filed Apr. 1, 2016, 7 pages.
Notice of Allowance dated Apr. 6, 2017, issued in connection with U.S. Appl. No. 15/088,283, filed Apr. 1, 2016, 7 pages.
Notice of Incomplete Re-Exam Request dated May 25, 2017, issued in connection with U.S. Appl. No. 90/013,959, filed Apr. 1, 2016, 10 pages.
Pre-Brief Conference Conference Decision dated May 11, 2017, issued in connection with U.S. Appl. No. 14/504,812, filed Oct. 2, 2014, 2 pages.
Request for Ex Parte Reexamination submitted in U.S. Pat. No. 9,213,357 dated May 22, 2017, 85 pages.
Advisory Action dated Jun. 20, 2017, issued in connection with U.S. Appl. No. 15/243,355, filed Aug. 22, 2016, 5 pages.
Final Office Action dated Jun. 2, 2017, issued in connection with U.S. Appl. No. 13/848,932, filed Mar. 22, 2013, 32 pages.
Final Office Action dated Jun. 15, 2017, issued in connection with U.S. Appl. No. 15/228,639, filed Aug. 4, 2016, 16 pages.
Notice of Allowance dated Jun. 1, 2017, issued in connection with U.S. Appl. No. 14/290,493, filed May 29, 2014, 12 pages.
Renewed Request for Ex Parte Re-Examination, U.S. Appl. No. 90/013,959, filed Jun. 16, 2017, 126 pages.

OBTAINING CONTENT BASED ON CONTROL BY MULTIPLE CONTROLLERS

CROSS-REFERENCE TO RELATED APPLICATIONS

The present application is a continuation of U.S. application Ser. No. 13/864,249 filed Apr. 17, 2013, titled "Method And Apparatus For Playing And Providing Audio Content In A Synchrony Group," which is a continuation of U.S. application Ser. No. 13/297,000 filed Nov. 15, 2011, titled "System And Method For Synchronizing Operations Among A Plurality Of Independently Clocked Digital Data Processing Devices," which is a continuation of U.S. application Ser. No. 10/816,217 filed Apr. 1, 2004, titled "System And Method For Synchronizing Operations Among A Plurality Of Independently Clocked Digital Data Processing Devices," which claims priority to U.S. Provisional App. 60/490,768 filed Jul. 28, 2003, titled "Method For Synchronizing Audio Playback Between Multiple Networked Devices." The entire contents of the Ser. Nos. 13/864,249; 13/297,000; 10/816,217; and 60/490,768 applications are incorporated herein by reference.

FIELD OF THE INVENTION

The present invention relates generally to the field of digital data processing devices, and more particularly to systems and methods for synchronizing operations among a plurality of independently-clocked digital data processing devices. The invention is embodied in a system for synchronizing operations among a plurality of devices, in relation to information that is provided by a common source. One embodiment of the invention enables synchronizing of audio playback as among two or more audio playback devices that receive audio information from a common information source, or channel.

More generally, the invention relates to the field of arrangements that synchronize output generated by a number of output generators, including audio output, video output, combinations of audio and video, as well as other types of output as will be appreciated by those skilled in the art, provided by a common channel Generally, the invention will find utility in connection with any type of information for which synchrony among independently-clocked devices is desired.

BACKGROUND OF THE INVENTION

There are a number of circumstances under which it is desirable to maintain synchrony of operations among a plurality of independently-clocked digital data processing devices in relation to, for example, information that is provided thereto by a common source. For example, systems are being developed in which one audio information source can distribute audio information in digital form to a number of audio playback devices for playback. The audio playback devices receive the digital information and convert it to analog form for playback. The audio playback devices may be located in the same room or they may be distributed in different rooms in a residence such as a house or an apartment, in different offices in an office building, or the like. For example, in a system installed in a residence, one audio playback device may be located in a living room, while another audio playback device is be located in a kitchen, and yet other audio playback devices may be located in various bedrooms of a house. In such an arrangement, the audio information that is distributed to various audio playback devices may relate to the same audio program, or the information may relate to different audio programs. If the audio information source provides audio information relating to the same audio program to two or more audio playback devices at the same time, the audio playback devices will generally contemporaneously play the same program. For example, if the audio information source provides audio information to audio playback devices located in the living room and kitchen in a house at the same time, they will generally contemporaneously play the same program.

One problem that can arise is to ensure that, if two or more audio playback devices are contemporaneously attempting to play back the same audio program, they do so simultaneously. Small differences in the audio playback devices' start times and/or playback speeds can be perceived by a listener as an echo effect, and larger differences can be very annoying. Differences can arise because for a number of reasons, including delays in the transfer of audio information over the network. Such delays can differ as among the various audio playback devices for a variety of reasons, including where they are connected into the network, message traffic and other reasons as will be apparent to those skilled in the art.

Another problem arises from the following. When an audio playback device converts the digital audio information from digital to analog form, it does so using a clock that provides timing information. Generally, the audio playback devices that are being developed have independent clocks, and, if they are not clocking at precisely the same rate, the audio playback provided by the various devices can get out of synchronization.

SUMMARY OF THE INVENTION

The invention provides a new and improved system and method for synchronizing operations among a number of digital data processing devices that are regulated by independent clocking devices. Generally, the invention will find utility in connection with any type of information for which synchrony among devices connected to a network is desired. The invention is described in connection with a plurality of audio playback devices that receive digital audio information that is to be played back in synchrony, but it will be appreciated that the invention can find usefulness in connection with any kind of information for which coordination among devices that have independent clocking devices would find utility.

In brief summary, the invention provides, in one aspect, a system for maintaining synchrony of operations among a plurality of devices that have independent clocking arrangements. The system includes a task distribution device that distributes tasks to a synchrony group comprising a plurality of devices that are to perform the tasks distributed by the task distribution device in synchrony. The task distribution device distributes each task to the members of the synchrony group over a network. Each task is associated with a time stamp that indicates a time, relative to a clock maintained by the task distribution device, at which the members of the synchrony group are to execute the task. Each member of the synchrony group periodically obtains from the task distribution device an indication of the current time indicated by its clock, determines a time differential between the task distribution device's clock and its respective clock and determines therefrom a time at which, according to its respective clock, the time stamp indicates that it is to execute the task.

In one embodiment, the tasks that are distributed include audio information for an audio track that is to be played by all of the devices comprising the synchrony group synchronously. The audio track is divided into a series of frames, each of which is associated with a time stamp indicating the time, relative to the clock maintained by an audio information channel device, which, in that embodiment, serves as the task distribution device, at which the members of the synchrony group are to play the respective frame. Each member of the synchrony group, using a very accurate protocol, periodically obtains the time indicated by the audio information channel device, and determines a differential between the time as indicated by its local clock and the audio information channel device's clock. The member uses the differential and the time as indicated by the time stamp to determine the time, relative to its local clock, at which it is to play the respective frame. The members of the synchrony group do this for all of the frames, and accordingly are able to play the frames in synchrony.

BRIEF DESCRIPTION OF THE DRAWINGS

This invention is pointed out with particularity in the appended claims. The above and further advantages of this invention may be better understood by referring to the following description taken in conjunction with the accompanying drawings, in which:

DETAILED DESCRIPTION OF AN ILLUSTRATIVE EMBODIMENT

Figure 1:
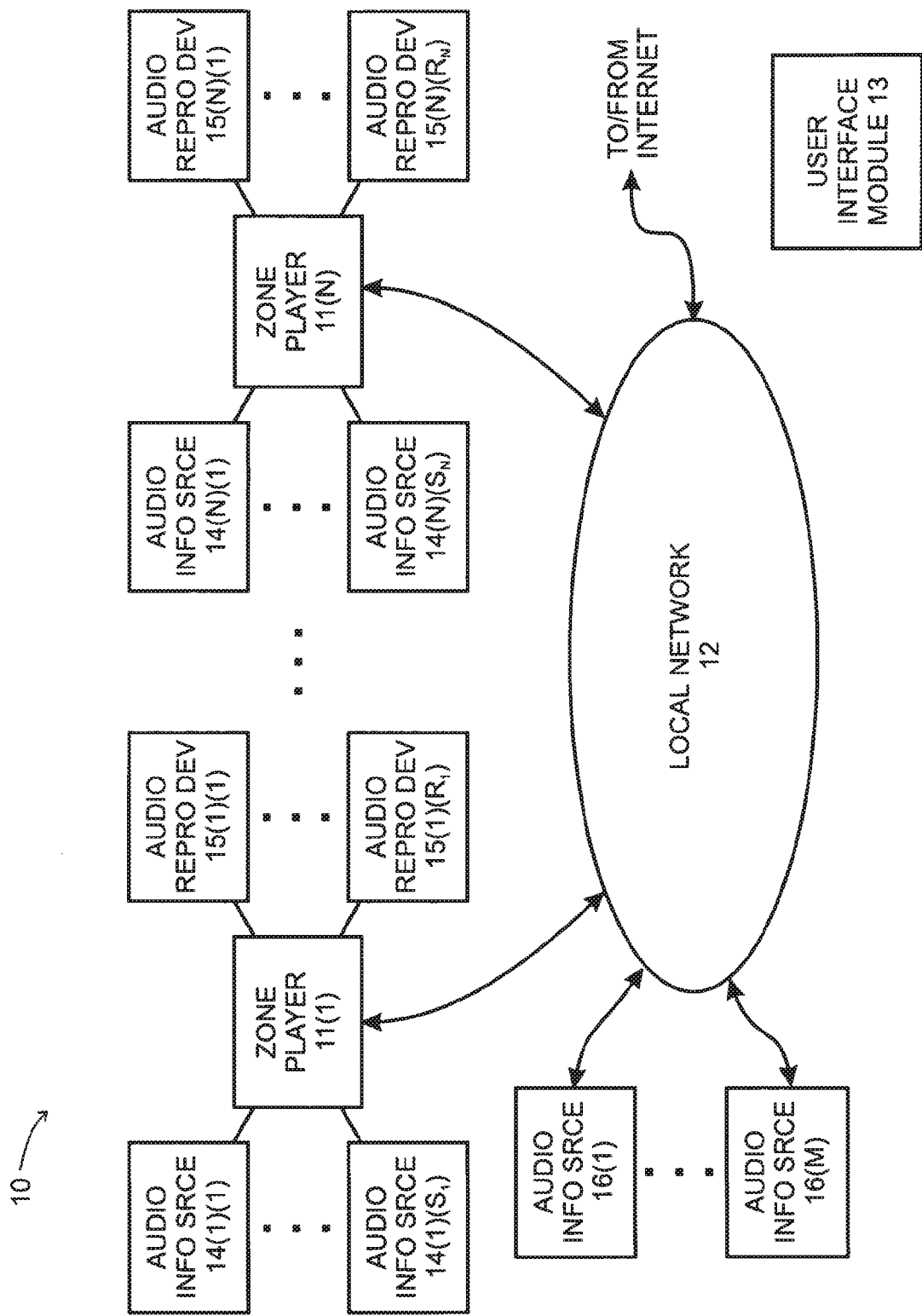
FIG. 1 schematically depicts an illustrative networked audio system, constructed in accordance with the invention.

FIG. 1 depicts an illustrative network audio system 10 constructed in accordance with the invention. With reference to FIG. 1, the network audio system 10 includes a plurality of zone players 11(1) through 11(N) (generally identified by reference numeral 11($n$)) interconnected by a local network 12, all of which operate under control of one or more user interface modules generally identified by reference numeral 13. One or more of the zone players 11($n$) may also be connected to one or more audio information sources, which will generally be identified herein by reference numeral 14($n$)($s$), and/or one or more audio reproduction devices, which will generally be identified by reference numeral 15($n$)($r$). In the reference numeral 14($n$)($s$), index "n" refers to the index "n" of the zone player 11($n$) to which the audio information source is connected, and the index "s" ($s=1, \ldots, S_n$) refers to the "s-th" audio information source connected to that "n-th" zone player 11($n$). Thus, if, for example, a zone player 11($n$) is connected to four audio information sources 14($n$)(1) through 14($n$)(4), the audio information sources may be generally identified by reference numeral 14($n$)($s$), with $S_n=4$. It will be appreciated that the number of audio information sources $S_n$ may vary as among the various zone players 11($n$), and some zone players may not have any audio information sources connected thereto. Similarly, in the reference numeral 15($n$)($r$), index "n" refers to the index "n" of the zone player 11($n$) to which the audio reproduction device is connected, and the index "r" ($r=1, \ldots, R_n$) refers to the "r-th" audio information source connected to that "n-th" zone player 11($n$). In addition to the audio information sources 14($n$)($s$), the network audio system 10 may include one or more audio information sources 16(1) through 16(M) connected through appropriate network interface devices (not separately shown) to the local network 12. Furthermore, the local network may include one or more network interface devices (also not separately shown) that are configured to connect the local network 12 to other networks, including a wide area network such as the Internet, the public switched telephony network (PSTN) or other networks as will be apparent to those skilled in the art, over which connections to audio information sources may be established.

The zone players 11($n$) associated with system 10 may be distributed throughout an establishment such as residence, an office complex, a hotel, a conference hall, an amphitheater or auditorium, or other types of establishments as will be apparent to those skilled in the art or the like. For example, if the zone players 11($n$) and their associated audio information source(s) and/or audio reproduction device(s) are distributed throughout a residence, one, such as zone player 11(1) and its associated audio information source(s) and audio reproduction device(s) may be located in a living room, another may be located in a kitchen, another may be located in a dining room, and yet others may be located in respective bedrooms, to selectively provide entertainment in those rooms. On the other hand, if the zone players 11($n$) and their associated audio information source(s) and/or audio reproduction device(s) are distributed throughout an office complex, one may, for example, be provided in each office to selectively provide entertainment to the employees in the respective offices. Similarly, if the zone players 11($n$) and associated audio information source(s) and/or audio reproduction device(s) are used in a hotel, they may be distributed throughout the rooms to provide entertainment to the guests. Similar arrangements may be used with zone players 11($n$) and associated audio information source(s) and/or audio reproduction device(s) used in an amphitheater or auditorium. Other arrangements in other types of environments will be apparent to those skilled in the art. In each case, the zone players 11($n$) can be used to selectively provide entertainment in the respective locations, as will be described below.

The audio information sources 14($n$)($s$) and 16($m$) may be any of a number of types of conventional sources of audio information, including, for example, compact disc ("CD") players, AM and/or FM radio receivers, analog or digital tape cassette players, analog record turntables and the like. In addition, the audio information sources 14($n$)($s$) and 16($m$) may comprise digital audio files stored locally on, for example, personal computers (PCs), personal digital assistants (PDAs), or similar devices capable of storing digital information in volatile or non-volatile form. As noted above, the local network 12 may also have an interface (not shown) to a wide area network, over which the network audio system 10 can obtain audio information. Moreover, one or more of the audio information sources 14(*n*)(*s*) may also comprise an interface to a wide area network such as the Internet, the public switched telephony network (PSTN) or any other source of audio information. In addition, one or more of the audio information sources 14(*n*)(*s*) and 16(*m*) may comprise interfaces to radio services delivered over, for example, satellite. Audio information obtained over the wide area network may comprise, for example, streaming digital audio information such as Internet radio, digital audio files stored on servers, and other types of audio information and sources as will be appreciated by those skilled in the art. Other arrangements and other types of audio information sources will be apparent to those skilled in the art.

Generally, the audio information sources 14(*n*)(*s*) and 16(*m*) provide audio information associated with audio programs to the zone players for playback. A zone player that receives audio information from an audio information source 14(*n*)(*s*) that is connected thereto can provide playback and/or forward the audio information, along with playback timing information, over the local network 12 to other zone players for playback. Similarly, each audio information source 16(*m*) that is not directly connected to a zone player can transmit audio information over the network 12 to any zone player 11(*n*) for playback. In addition, as will be explained in detail below, the respective zone player 11(*n*) can transmit the audio information that it receives either from an audio information source 14(*n*)(*s*) connected thereto, or from an audio information source 16(*m*), to selected ones of the other zone players 11(*n'*), 11(*n"*), . . . (n not equal to n', n", . . . ) for playback by those other zone players. The other zone players 11(*n'*), 11(*n"*), . . . to which the zone player 11(*n*) transmits the audio information for playback may be selected by a user using the user interface module 13. In that operation, the zone player 11(*n*) will transmit the audio information to the selected zone players 11(*n'*), 11(*n"*), . . . over the network 12. As will be described below in greater detail, the zone players 11(*n*), 11(*n'*), 11(*n"*), . . . operate such that the zone players 11(*n'*), 11(*n"*), . . . synchronize their playback of the audio program with the playback by the zone player 11(*n*), so that the zone players 11(*n*), 11(*n'*), 11(*n"*) provide the same audio program at the same time.

Users, using user interface module 13, may also enable different groupings or sets of zone players to provide audio playback of different audio programs synchronously. For example, a user, using a user interface module 13, may enable zone players 11(1) and 11(2) to play one audio program, audio information for which may be provided by, for example, one audio information source 14(1)(1). The same or a different user may, using the same or a different user interface module 13, enable zone players 11(4) and 11(5) to contemporaneously play another audio program, audio information for which may be provided by a second audio information source, such as audio information source 14(5)(2). Further, a user may enable zone player 11(3) to contemporaneously play yet another audio program, audio information for which may be provided by yet another audio information source, such as audio information source 16(1). As yet another possibility, a user may contemporaneously enable zone player 11(1) to provide audio information from an audio information source connected thereto, such as audio information source 14(1)(2), to another zone player, such as zone player 11(6) for playback.

In the following, the term-"synchrony group" will be used to refer to a set of one or more zone players that are to play the same audio program synchronously. Thus, in the above example, zone players 11(1) and 11(2) comprise one synchrony group, zone player 11(3) comprises a second synchrony group, zone players 11(4) and 11(5) comprise a third synchrony group, and zone player 11(6) comprises yet a fourth synchrony group. Thus, while zone players 11(1) and 11(2) are playing the same audio program, they will play the audio program synchronously. Similarly, while zone players 11(4) and 11(5) are playing the same audio program, they will play the audio program synchronously. On the other hand, zone players that are playing different audio programs may do so with unrelated timings. That is, for example, the timing with which zone players 11(1) and 11(2) play their audio program may have no relationship to the timing with which zone player 11(3), zone players 11(4) and 11(5), and zone player 11(6) play their audio programs. It will be appreciated that, since "synchrony group" is used to refer to sets of zone players that are playing the same audio program synchronously, zone player 11(1) will not be part of zone player 11(6)'s synchrony group, even though zone player 11(1) is providing the audio information for the audio program to zone player 11(6).

In the network audio system 10, the synchrony groups are not fixed. Users can enable them to be established and modified dynamically. Continuing with the above example, a user may enable the zone player 11(1) to begin providing playback of the audio program provided thereto by audio information source 14(1)(1), and subsequently enable zone player 11(2) to join the synchrony group. Similarly, a user may enable the zone player 11(5) to begin providing playback of the audio program provided thereto by audio information source 14(5)(2), and subsequently enable zone player 11(4) to join that synchrony group. In addition, a user may enable a zone player to leave a synchrony group and possibly join another synchrony group. For example, a user may enable the zone player 11(2) to leave the synchrony group with zone player 11(1), and join the synchrony group with zone player 11(6). As another possibility, the user may enable the zone player 11(1) to leave the synchrony group with zone player 11(2) and join the synchrony group with zone player 11(6). In connection with the last possibility, the zone player 11(1) can continue providing audio information from the audio information source 14(1)(1) to the zone player 11(2) for playback thereby.

A user, using the user interface module 13, can enable a zone player 11(*n*) that is currently not a member of a synchrony group to join a synchrony group, after which it will be enabled to play the audio program that is currently being played by that synchrony group. Similarly, a user, also using the user interface module 13, can enable a zone player 11(*n*) that is currently a member of one synchrony group, to disengage from that synchrony group and join another synchrony group, after which that zone player will be playing the audio program associated with the other synchrony group. For example, if a zone player 11(6) is currently not a member of any synchrony group, it, under control of the user interface module 13, can become a member of a synchrony group, after which it will play the audio program being played by the other members of the synchrony group, in synchrony with the other members of the synchrony group. In becoming a member of the synchrony group, zone player 11(6) can notify the zone player that is the master device for the synchrony group that it wishes to become a member of its synchrony group, after which that zone player will also transmit audio information associated with the audio program, as well as timing information, to the zone player 11(6). As the zone player 11(6) receives the audio information and the timing information from the master device, it will play the audio information with the timing indicated by the timing information, which will enable the zone player 11(6) to play the audio program in synchrony with the other zone player(s) in the synchrony group.

Similarly, if a user, using the user interface module 13, enables a zone player 11(n) associated with a synchrony group to disengage from that synchrony group, and if the zone player 11(n) is not the master device of the synchrony group, the zone player 11(n) can notify the master device, after which the master device can terminate transmission of the audio information and timing information to the zone player 11(n). If the user also enables the zone player 11(n) to begin playing another audio program using audio information from an audio information source 14(n)(s) connected thereto, it will acquire the audio information from the audio information source 14(n)(s) and initiate playback thereof. If the user enables another zone player 11(n') to join the synchrony group associated with zone player 11(n), operations in connection therewith can proceed as described immediately above.

As yet another possibility, if a user, using the user interface module 13, enables a zone player 11(n) associated with a synchrony group to disengage from that synchrony group and join another synchrony group, and if the zone player is not the master device of the synchrony group from which it is disengaging, the zone player 11(n) can notify the master device of the synchrony group from which it is disengaging, after which that zone player will terminate transmission of audio information and timing information to the zone player 11(n) that is disengaging. Contemporaneously, the zone player 11(n) can notify the master device of the synchrony group that it (that is, zone player 11(n)) is joining, after which the master device can begin transmission of audio information and timing information to that zone player 11(n). The zone player 11(n) can thereafter begin playback of the audio program defined by the audio information, in accordance with the timing information so that the zone player 11(n) will play the audio program in synchrony with the master device.

As yet another possibility, a user, using the user interface module 13, may enable a zone player 11(n) that is not associated with a synchrony group, to begin playing an audio program using audio information provided to it by an audio information source 14(n)(s) connected thereto. In that case, the user, also using the user interface module 13 or a user interface device that is specific to the audio information source 14(n)(s), can enable the audio information source 14(n)(s) to provide audio information to the zone player 11(n). After the zone player 11(n) has begun playback, or contemporaneously therewith, the user, using the user interface module 13, can enable other zone players 11(n'), 11(n''), . . . to join zone player 11(n)'s synchrony group and enable that zone player 11(n) to transmit audio information and timing information thereto as described above, to facilitate synchronous playback of the audio program by the other zone players 11(n'), 11(n'') . . .

A user can use the user interface module 13 to control other aspects of the network audio system 10, including but not limited to the selection of the audio information source 14(n)(s) that a particular zone player 11(n) is to utilize, the volume of the audio playback, and so forth. In addition, a user may use the user interface module 13 to turn audio information source(s) 14(n)(s) on and off and to enable them to provide audio information to the respective zone players 11(n).

Figure 2:
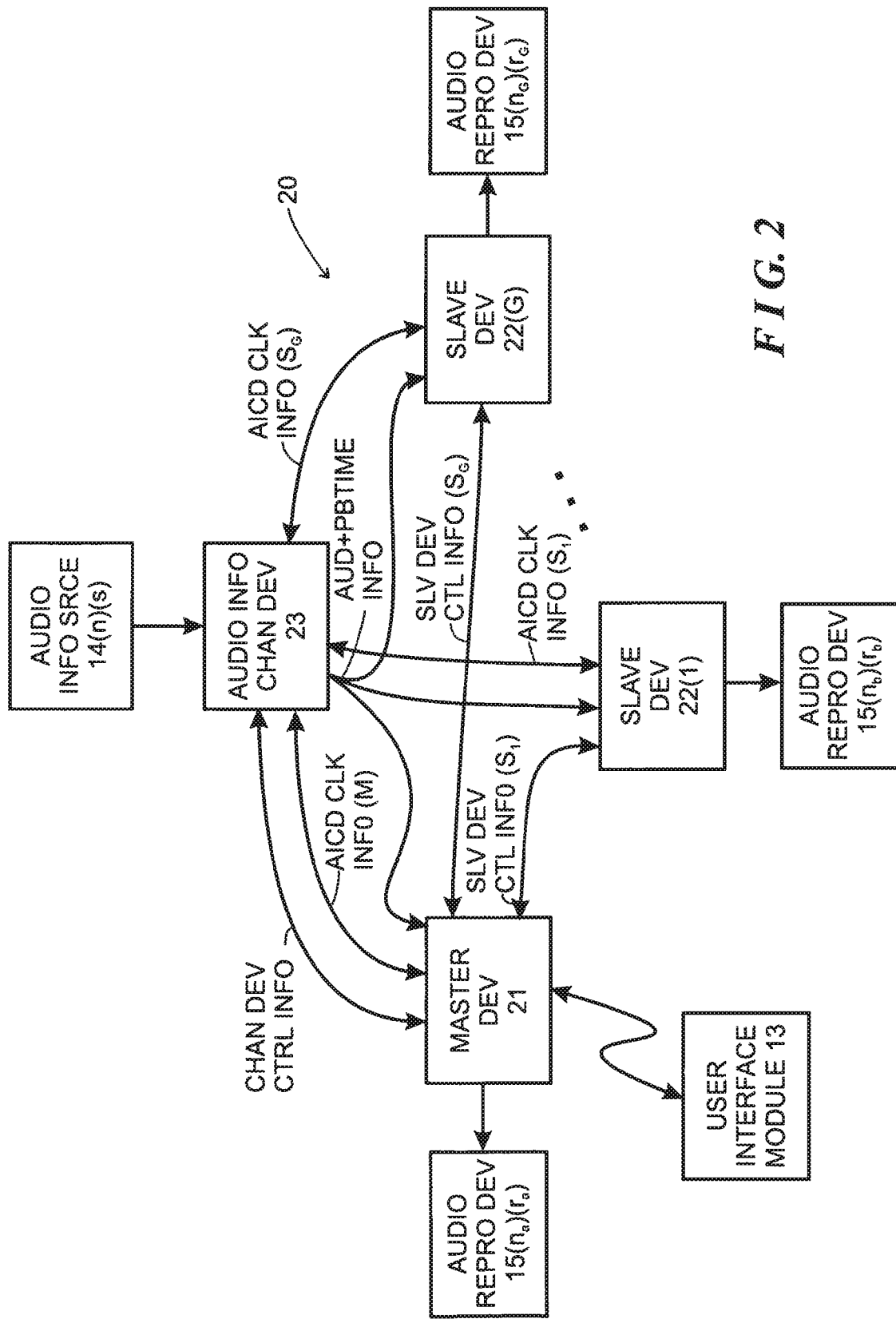
FIG. 2 schematically depicts a functional block diagram of a synchrony group utilizing a plurality of zone players formed within the networked audio system depicted in FIG. 1.

Operations performed by the various devices associated with a synchrony group will be described in connection with FIG. 2, which schematically depicts a functional block diagram of a synchrony group in the network audio system 10 described above in connection with FIG. 1. With reference to FIG. 2, a synchrony group 20 includes a master device 21 and zero or more slave devices 22(1) through 22 (G) (generally identified by reference numeral 22(g)), all of which synchronously play an audio program provided by an audio information channel device 23. Each of the master device 21, slave devices 22(g) and audio information channel device 23 utilizes a zone player 11(n) depicted in FIG. 1, although it will be clear from the description below that a zone player may be utilized both for the audio information channel device for the synchrony group 20, and the master device 21 or a slave device 22(g) of the synchrony group 20. As will be described below in more detail, the audio information channel device 23 obtains the audio information for the audio program from an audio information source, adds playback timing information, and transmits the combined audio and playback timing information to the master device 21 and slave devices 22(g) over the network 12 for playback. The playback timing information that is provided with the audio information, together with clock timing information provided by the audio information channel device 23 to the various devices 21 and 22(g) as will be described below, enables the master device 21 and slave devices 22(g) of the synchrony group 20 to play the audio information simultaneously.

The master device 21 and the slave devices 22(g) receive the audio and playback timing information, as well as the clock timing information, that are provided by the audio information channel device 23, and play back the audio program defined by the audio information. The master device 21 is also the member of the synchrony group 20 that communicates with the user interface module 13 and that controls the operations of the slave devices 22(g) in the synchrony group 20. In addition, the master device 21 controls the operations of the audio information channel device 23 that provides the audio and playback timing information for the synchrony group 20. Generally, the initial master device 21 for the synchrony group will be the first zone player 11(n) that a user wishes to play an audio program. However, as will be described below, the zone player 11(n) that operates as the master device 21 can be migrated from one zone player 11(n) to another zone player 11(n'), which preferably will be a zone player that is currently operating as a slave device 22(g) in the synchrony group.

In addition, under certain circumstances, as will be described below, the zone player 11(n) that operates as the audio information channel device 23 can be migrated from one zone player to another zone player, which also will preferably will be a zone player that is currently operating as a member of the synchrony group 20. It will be appreciated that the zone player that operates as the master device 21 can be migrated to another zone player independently of the migration of the audio information channel device 23. For example, if one zone player 11(n) is operating as both the master device 21 and the audio information channel device 23 for a synchrony group 20, the master device 21 can be migrated to another zone player 11(n') while the zone player 11(n) is still operating as the audio information channel device 23. Similarly, if one zone player 11(n) is operating as both the master device 21 and the audio information channel device 23 for a synchrony group 20, the audio information channel device 23 can be migrated to another zone player 11(n') while the zone player 11(n) is still operating as the master device 21. In addition, if one zone player 11(n) is operating as both the master device 21 and the audio information channel device 23 for a synchrony group 20, the master device 21 can be migrated to another zone player 11($n'$) and the audio information channel device can be migrated to a third zone player 11($n''$).

The master device 21 receives control information from the user interface module 13 for controlling the synchrony group 20 and provides status information indicating the operational status of the synchrony group to the user interface module 13. Generally, the control information from the user interface module 13 enables the master device 21 to, in turn, enable the audio information channel device 23 to provide audio and playback timing information to the synchrony group to enable the devices 21 and 22($g$) that are members of the synchrony group 20 to play the audio program synchronously. In addition, the control information from the user interface module 13 enables the master device 21 to, in turn, enable other zone players to join the synchrony group as slave devices 22($g$) and to enable slave devices 22($g$) to disengage from the synchrony group. Control information from the user interface module 13 can also enable the zone player 11($n$) that is currently operating as the master device 21 to disengage from the synchrony group, but prior to doing so that zone player will enable the master device 21 to transfer from that zone player 11($n$) to another zone player 11($n'$), preferably to a zone player 11($n'$) that is currently a slave device 22($g$) in the synchrony group 20. The control information from the user interface module 13 can also enable the master device 21 to adjust its playback volume and to enable individual ones of the various slave devices 22($g$) to adjust their playback volumes. In addition, the control information from the user interface module 13 can enable the synchrony group 20 to terminate playing of a current track of the audio program and skip to the next track, and to re-order tracks in a play list of tracks defining the audio program that is to be played by the synchrony group 20.

The status information that the master device 21 may provide to the user interface module 13 can include such information as a name or other identifier for the track of the audio work that is currently being played, the names or other identifiers for upcoming tracks, the identifier of the zone player 11($n$) that is currently operating as the master device 21, and identifiers of the zone players that are currently operating as slave devices 22($g$). In one embodiment, the user interface module 13 includes a display (not separately shown) that can display the status information to the user.

It will be appreciated that the zone player 11($n$) that is operating as the audio information channel device 23 for one synchrony group may also comprise the master device 21 or any of the slave devices 22($g$) in another synchrony group. This may occur if, for example, the audio information source that is to provide the audio information that is to be played by the one synchrony group is connected to a zone player also being utilized as the master device or a slave device for the other synchrony group. This will be schematically illustrated below in connection with FIG. 2A. Since, as noted above, the zone player 11($n$) that is operating as the audio information channel device 23 for the synchrony group 20 may also be operating as a master device 21 or slave device 22($g$) for another synchrony group, it can also be connected to one or more audio reproduction devices 15($n$)($r$), although that is not depicted in FIG. 2. Since the master device 21 and slave devices 22($g$) are all to provide playback of the audio program, they will be connected to respective audio reproduction devices 15($n$)($r$). Furthermore, it will be appreciated that one or more of the zone players 11($n$) that operate as the master device 21 and slave devices 22($g$) in synchrony group 20 may also operate as an audio information channel device for that synchrony group or for another synchrony group and so they may be connected to one or more audio information sources 14($n$)($s$), although that is also not depicted in FIG. 2. In addition, it will be appreciated that a zone player 11($n$) can also operate as a audio information channel device 23 for multiple synchrony groups.

If the audio information channel device 23 does not utilize the same zone player as the master device 21, the master device 21 controls the audio information channel device by exchanging control information over the network 12 with the audio information channel device 23. The control information is represented in FIG. 2 by the arrow labeled CHAN_DEV_CTRL_INFO. The control information that the master device 21 provides to the audio information channel device 23 will generally depend on the nature of the audio information source that is to provide the audio information for the audio program that is to be played and the operation to be enabled by the control information. If, for example, the audio information source is a conventional compact disc, tape, or record player, broadcast radio receiver, or the like, which is connected to a zone player 11($n$), the master device 21 may merely enable the zone player serving as the audio information channel device 23 to receive the audio information for the program from the audio information source. It will be appreciated that, if the audio information is not in digital form, the audio information channel device 23 will convert it to digital form and provide the digitized audio information, along with the playback timing information, to the master device 21 and slave devices 22($g$).

On the other hand, if the audio information source is, for example, a digital data storage device, such as may be on a personal computer or similar device, the master device 21 can provide a play list to the audio information channel device 23 that identifies one or more files containing the audio information for the audio program. In that case, the audio information channel device 23 can retrieve the files from the digital data storage device and provide them, along with the playback timing information, to the master device 21 and the slave devices 22($g$). It will be appreciated that, in this case, the audio information source may be directly connected to the audio information channel device 23, as, for example, an audio information source 14($n$)($s$), or it may comprise an audio information source 16($m$) connected to the network 12. As a further alternative, if the audio information source is a source available over the wide area network, the master device 21 can provide a play list comprising a list of web addresses identifying the files containing the audio information for the audio program that is to be played, and in that connection the audio information channel device 23 can initiate a retrieval of the files over the wide area network. As yet another alternative, if the audio information source is a source of streaming audio received over the wide area network, the master device 21 can provide a network address from which the streaming audio can be received. Other arrangements by which the master device 21 can control the audio information channel device 23 will be apparent to those skilled in the art.

The master device 21 can also provide control information to the synchrony group's audio information channel device 23 to enable a migration from one zone player 11($n$) to another zone player 11($n'$). This may occur if, for example, the audio information source is one of audio information sources 16 or a source accessible over the wide area network via the network 12. The master device 21 can enable migration of the audio information channel device 23 for several reasons, including, for example, to reduce the loading of the zone player 11(n), to improve latency of message transmission in the network 12, and other reasons as will be appreciated by those skilled in the art.

As noted above, the audio information channel device 23 provides audio and playback timing information for the synchrony group to enable the master device 21 and slave devices 22(g) to play the audio program synchronously. Details of the audio and playback timing information will be described in detail below in connection with FIGS. 3 and 4, but, in brief, the audio information channel device 23 transmits the audio and playback timing information in messages over the network 12 using a multi-cast message transmission methodology. In that methodology, the audio information channel device 23 will transmit the audio and playback timing information in a series of messages, with each message being received by all of the zone players 11(n) comprising the synchrony group 20, that is, by the master device 21 and the slave devices 22(g). Each of the messages includes a multi-cast address, which the master device 21 and slave devices 22(g) will monitor and, when they detect a message with that address, they will receive and use the contents of the message. The audio and playback timing information is represented in FIG. 2 by the arrow labeled "AUD+PBTIME_INFO," which has a single tail, representing a source for the information at the audio information channel device 23, and multiple arrowheads representing the destinations of the information, with one arrowhead extending to the master device 21 and other arrowheads extending to each of the slave devices 22(g) in the synchrony group 20. The audio information channel device 23 may make use of any convenient multi-cast message transmission methodology in transmitting the audio and playback timing information to the synchrony group 20. As will be described in detail in connection with FIG. 4, the audio and playback timing information is in the form of a series of frames, with each frame having a time stamp. The time stamp indicates a time, relative to the time indicated by a clock maintained by the audio information channel device 23, at which the frame is to be played. Depending on the size or sizes of the messages used in the selected multi-cast message transmission methodology and the size or sizes of the frames, a message may contain one frame, or multiple frames, or, alternatively, a frame may extend across several messages.

The audio information channel device 23 also provides clock time information to the master device 21 and each of the slave devices 22(g) individually over network 12 using a highly accurate clock time information transmission methodology. The distribution of the clock time information is represented in FIG. 2 by the arrows labeled "AICD_CLK_INF (M)" (in the case of the clock time information provided to the master device 21) and "AICD_CLK_INF ($S_1$)" through "AICD_CLK_INF ($S_G$)" (in the case of audio information channel device clock information provided to the slave devices 22(g)). In one embodiment, the master device 21 and slave devices 22(g) make use of the well-known SNTP (Simple Network Time Protocol) to obtain current clock time information from the audio information channel device 23. The SNTP makes use of a unicast message transfer methodology, in which one device, such as the audio information channel device 23, provides clock time information to a specific other device, such as the master device 21 or a slave device 22(g), using the other device's network, or unicast, address. Each of the master device 21 and slave devices 22(g) will periodically initiate SNTP transactions with the audio information channel device 23 to obtain the clock time information from the audio information channel device 23. As will be described below in more detail, the master device 21 and each slave device 22(g) make use of the clock time information to determine the time differential between the time indicated by the audio information channel device's clock and the time indicated by its respective clock, and use that time differential value, along with the playback time information associated with the audio information and the respective device's local time as indicated by its clock to determine when the various frames are to be played. This enables the master device 21 and the slave devices 22(g) in the synchrony group 20 to play the respective frames simultaneously.

As noted above, the control information provided by the user to the master device 21 through the user interface module 13 can also enable the master device 21 to, in turn, enable another zone player 11(n') to join the synchrony group as a new slave device 22(g). In that operation, the user interface module 13 will provide control information, including the identification of the zone player 11(n') that is to join the synchrony group to the master device 21. After it receives the identification of the zone player 11(n') that is to join the synchrony group, the master device 21 will exchange control information, which is represented in FIG. 2 by the arrows labeled SLV_DEV_CTRL_INF ($S_1$) through SLV_DEV_CTRL_INF ($S_G$) group slave control information, over the network 12 with the zone player 11(d) that is identified in the control information from the user interface module 13. The control information that the master device 21 provides to the new zone player 11(n') includes the network address of the zone player 11(n) that is operating as the audio information channel device 23 for the synchrony group, as well as the multi-cast address that the audio information channel device 23 is using to broadcast the audio and playback timing information over the network. The zone player that is to operate as the new slave device 22(g') uses the multi-cast address to begin receiving the multi-cast messages that contain the audio information for the audio program being played by the synchrony group.

It will be appreciated that, if the zone player 11(n) that is operating as the master device 21 for the synchrony group 20 is also operating the audio information channel device 23, and if there are no slave devices 22(g) in the synchrony group 20, the audio information channel device 23 may not be transmitting audio and playback timing information over the network. In that case, if the new slave device 22(g') is the first slave device in the synchrony group, the zone player 11(n) that is operating as both the master device 21 and audio information channel device 23, can begin transmitting the audio and playback timing information over the network 12 when the slave device 22(g') is added to the synchrony group 20. The zone player 11(n) can maintain a count of the number of slave devices 22(g) in the synchrony group 20 as they join and disengage, and, if the number drops to zero, it can stop transmitting the audio and playback timing information over the network 12 to reduce the message traffic over the network 12.

The new slave device 22(g') added to the synchrony group 20 uses the network address of the audio information channel device 23 for several purposes. In particular, the new slave device 22(g') will, like the master device 21 (assuming the zone player 11(n) operating as the master device 21 is not also the audio information channel device 23), engage in SNTP transactions with the audio information channel device 23 to obtain the clock timing information from the audio information channel device 23. In addition, the new slave device 22(g') can notify the audio information channel device 23 that it is a new slave device 22(g') for the synchrony group 20 and provide the audio information channel device 23 with its network address. As will be described below, in one embodiment, particularly in connection with audio information obtained from a source, such as a digital data storage device, which can provide audio information at a rate that is faster than the rate at which it will be played, the audio information channel device 23 will buffer audio and timing information and broadcast it over the network 12 to the synchrony group 20 generally at a rate at which it is provided by the source. Accordingly, when a new slave device 22(g') joins the synchrony group 20, the playback timing information may indicate that the audio information that is currently being broadcast by the audio information channel device 23 using the multi-cast methodology is to be played back some time in the future. To reduce the delay with which the new slave device 22(g') will begin playback, the audio information channel device 23 can also retransmit previously transmitted audio and timing information that it had buffered to the new slave device 22(g') using the unicast network address of the slave device 22(g').

The master device 21 can also use the slave device control information exchanged with the slave devices 22(g) for other purposes. For example, the master device 21 can use the slave device control information to initiate a migration of the master from its zone player 11(n) to another zone player 11(n'). This may occur for any of a number of reasons, including, for example, that the master device 21 is terminating playback by it of the audio program and is leaving the synchrony group 20, but one or more of the other devices in the synchrony group is to continue playing the audio program. The master device 21 may also want to initiate a migration if it is overloaded, which can occur if, for example, the zone player 11(n) that is the master device 21 for its synchrony group is also operating as an audio information channel device 23 for another synchrony group.

The user can also use the user interface module 13 to adjust playback volume by the individual zone players 11(n) comprising the synchrony group. In that operation, the user interface module 13 provides information identifying the particular device whose volume is to be adjusted, and the level at which the volume is to be set to the master device 21. If the device whose volume is to be adjusted is the master device 21, the master device 21 can adjust its volume according to the information that it receives from the user interface module 13. On the other hand, if the device whose volume is to be adjusted is a slave device 22(g), the master device 21 can provide group slave control information to the respective slave device 22(g), to enable it to adjust its volume.

The user can also use the user interface module 13 to enable a synchrony group 20 to cancel playing of the track in an audio program that is currently being played, and to proceed immediately to the next track. This may occur, for example, if the tracks for the program is in the form of a series of digital audio information files, and the user wishes to cancel playback of the track that is defined by one of the files. In that case, when the master device 21 receives the command to cancel playback of the current track, it will provide channel device control information to the audio information channel device 23 so indicating. In response, the audio information channel device 23 inserts control information into the audio and playback timing information, which will be referred to as a "resynchronize" command. In addition, the audio information channel device 23 will begin transmitting audio information for the next track, with timing information to enable it to be played immediately. The resynchronize command can also enable playback of a track to be cancelled before it has been played. Details of these operations will be described below.

Figure 2A:
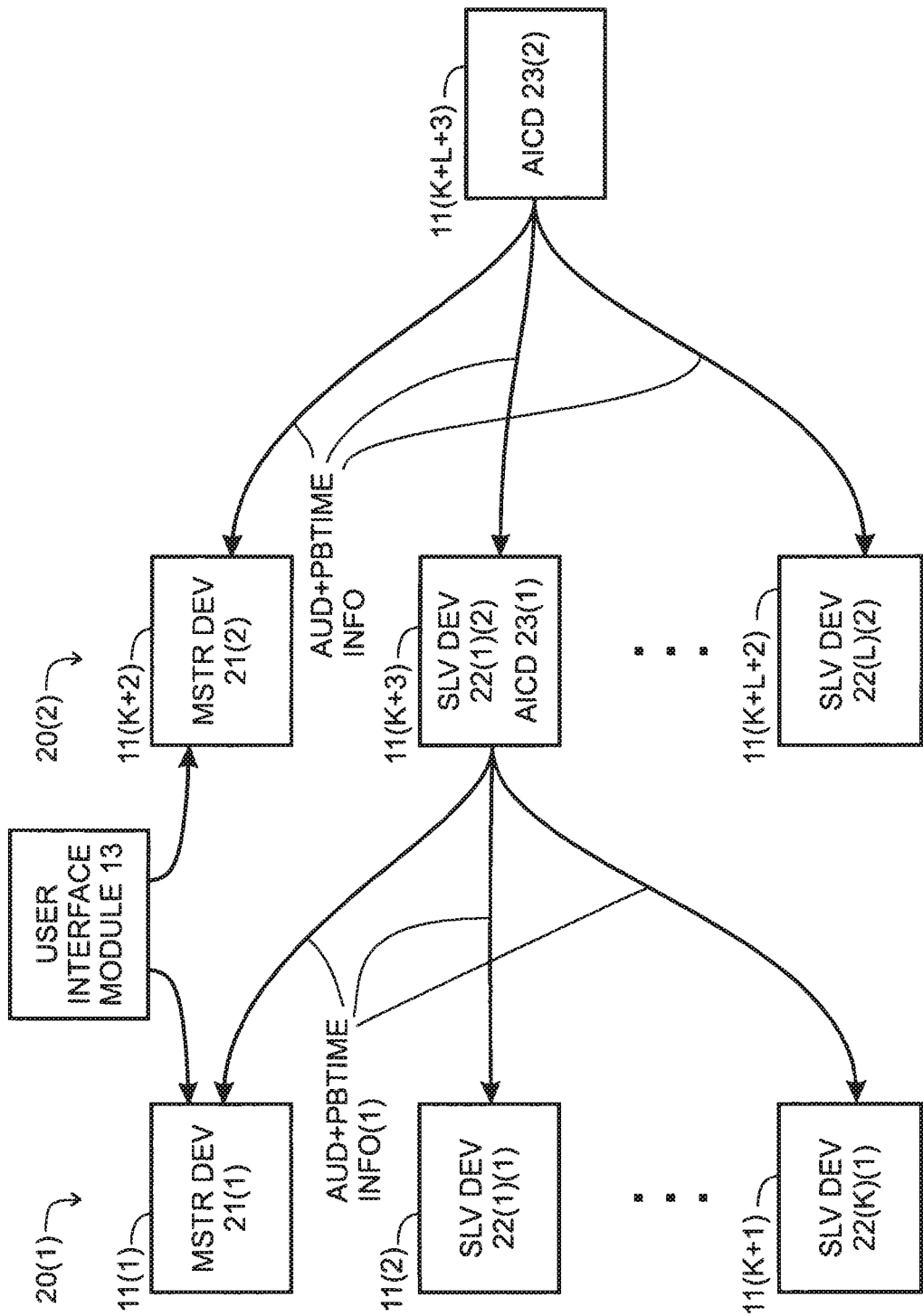
FIG. 2A schematically depicts two synchrony groups, illustrating how a member of one synchrony group can provide audio information to the members of another synchrony group.

As noted above, there may be multiple synchrony groups in the network audio system 10, and further that, for example, a zone player 11(n) may operate both as a master device 21 or a slave device 22(g) in one synchrony group, and as the audio information channel device 23 providing audio and playback timing information and clock timing information for another synchrony group. An illustrative arrangement of this will be described in connection with FIG. 2A. With reference to FIG. 2A, that FIG. depicts elements of two synchrony groups, identified by reference numerals 20(1) and 20(2), respectively. For clarity, FIG. 2A does not show a number of elements, the presence of which would be evident from FIGS. 1 and 2 as described above. For example, FIG. 2A does not depict the audio information sources from which audio information is obtained for the synchrony groups or the audio reproduction devices that are used to produce sound for the master and slave devices, which are depicted in both FIGS. 1 and 2. In addition, FIG. 2A does not depict arrows that represent control information provided by the respective master devices to the slave devices in the respective synchrony groups, or to the audio information channel devices that provide audio and timing information for the respective synchrony groups, which are depicted in FIG. 2. In addition, FIG. 2A does not depict the arrows that represent the clock timing information provided by the audio information channel devices to the respective members of the respective synchrony groups, which are also depicted in FIG. 2. As will be noted below, however, FIG. 2A does depict arrows representing the audio and playback timing information provided by the respective audio information channel devices for the respective synchrony groups 20(1), 20(2), to the master and slave devices comprising the respective synchrony groups 20(1), 20(2).

Each synchrony group 20(1), 20(2) comprises elements of a number of zone players. A functional block diagram of a zone player will be described below in connection with FIG. 3. Synchrony group 20(1) includes a master device 21(1) and "K" slave devices 22(1)(1) through 22(K)(1) (the index "1" in reference numeral 21(1) and the last index in reference numeral 22(1)(1) through 21(K)(1) corresponds to the index of the synchrony group 20(1) to which they belong) utilize zone players 11(1) and 11(K+1) respectively. Similarly, synchrony group 20(2) includes a master device 21(2) and "L" slave devices 22(1)(2) through 22(L)(2) that utilize zone players 11(K+2) through 11(K+L+2). In the illustrative arrangement depicted in FIG. 2A, both synchrony groups 20(1) and 20(2) are controlled by the user interface module 13, which can provide control information to, and receive status information from, the master devices 21(1) and 21(2) independently. It will be appreciated that separate user interface modules may be provided to provide control information to, and receive status information from, the respective master devices 21(1), 21(2).

As noted above, the slave device 22(1)(2) in synchrony group 20(2) utilizes zone player 11(K+3). In the illustrative arrangement depicted in FIG. 2A, the audio information channel device 23(1) that provides audio and playback timing information to the master and slave devices 21(1), 22(1)(1), . . . , 22(K)(1) of synchrony group 20(1) also utilizes zone player 11(K+3). As noted above, this may occur if, for example, the audio information source that is to provide audio information to be played by the synchrony group 20(1) is connected to the zone player 11(K+3). Thus, when the master device 21(1) of synchrony group 20(1) exchanges channel device control information with the audio information channel device 23(1), it is effectively exchanging channel device control information with the zone player 11(K+3). Similarly, when the master and slave devices 21(1), 22(1)(1), . . . , 22(K)(1) of synchrony group 20(1) receive audio and playback timing information, as well as clock timing information, from the audio information channel device 23(1), they are effectively receiving the information from the zone player 11(K+3). FIG. 2A depicts a multi-headed arrow representing audio and playback timing information transmitted by the zone player 11(K+3), as audio information channel device 23(1), to the master and slave devices 21(1), 22(1)(1), . . . , 11(K)(1) comprising synchrony group 20(1).

On the other hand, in the illustrative arrangement depicted in FIG. 2A, the synchrony group 20(2) utilizes a zone player 11(K+L+3) as its audio information channel device 23(2). As with synchrony group 20(1), when the master device 21(2) of synchrony group 20(2) exchanges channel device control information with the audio information channel device 23(2), it is effectively exchanging channel device control information with the zone player 11(K+L+3). Similarly, when the master and slave devices 21(2), 22(1)(2), . . . , 22(L)(2) of synchrony group 20(2) receive audio and playback timing information, as well as clock timing information, from the audio information channel device 23(2), they are effectively receiving the information from the zone player 11(K+L+3). FIG. 2A depicts a multi-headed arrow representing audio and playback timing information transmitted by the zone player 11(K+3) as audio information channel device 23(2) to the master and slave devices 21(2), 22(1)(2), . . . , 22(L)(2) comprising synchrony group 20(2).

In the illustrative arrangement depicted in FIG. 2A, zone player 11(K+L+3), which is the audio information channel device 23(2) for synchrony group 20(2), is not shown as being either a master or a slave device in another synchrony group. However, it will be appreciated that zone player 11(K+L+3) could also be utilized as the master device or a slave device for another synchrony group. Indeed, it will be appreciated that the zone player that is utilized as the audio information channel device for synchrony group 20(2) may also be a zone player that is utilized as the master device 21(1) or a slave device 22(1)(1), . . . , 22(K)(1) in the synchrony group 20(1).

A zone player 11(n) that is utilized as a member of one synchrony group may also be utilized as the audio information channel device for another synchrony group if the audio information source that is to supply the audio information that is to be played by the other synchrony group is connected to that zone player 11(n). A zone player 11(n) may also be utilized as the audio information channel device for the other synchrony group if, for example, the audio information source is an audio information source 16(m) (FIG. 1) that is connected to the network 12 or an audio information source that is available over a wide area network such as the Internet. The latter may occur if, for example, the zone player 11(n) has sufficient processing power to operate as the audio information channel device and it is in an optimal location in the network 12, relative to the zone players comprising the other synchrony group (that is the synchrony group for which it is operating as audio information channel device) for providing the audio and playback timing information to the members of the other synchrony group. Other circumstances under which the zone player 11(n) that is utilized as a member of one synchrony group may also be utilized as the audio information channel device for another synchrony group will be apparent to those skilled in the art.

As was noted above, the master device 21 for a synchrony group 20 may be migrated from one zone player 11(n) to another zone player 11(n'). As was further noted above, the audio information channel device 23 for a synchrony group 20 may be migrated from one zone player 11(n) to another zone player 11(n'). It will be appreciated that the latter may occur if, for example, the audio information source that provides the audio program for the synchrony group is not connected to the zone player 11(n) that is operating as the audio information channel device 23, but instead is one of the audio information sources 16(m) connected to the network 12 or a source available over a wide area network such as the Internet. Operations performed during a migration of an audio information channel device 23 from one zone player 11(n) to another zone player 11(n') will generally depend on the nature of the audio information that is being channeled by the audio information channel device 23. For example, if the audio information source provides streaming audio, the zone player 11(n) that is currently operating as the audio information channel device 23 for the synchrony group 20, can provide the following information to the other zone player 11(n') that is to become the audio information channel device 23 for the synchrony group 20:

(a) the identification of the source of the streaming audio information, (b) the time stamp associated with the frame that the zone player 11(n) is currently forming, and (c) the identifications of the zone players that are operating as the master device 21 and slave devices 22(g) comprising the synchrony group 20.

After the zone player 11(n') receives the information from the zone player 11(n), it will begin receiving the streaming audio from the streaming audio information source identified by the zone player 11(n), assemble the streaming audio information into frames, associate each frame with a time stamp, and transmit the resulting audio and playback timing information over the network 12. The zone player 11(n') will perform these operations in the same manner as described above, except that, instead of using the time indicated by its digital to analog converter clock 34 directly in generating the time stamps for the frames, the initial time stamp will be related to the value of the time stamp that is provided by the zone player 11(n) (reference item (b) above), with the rate at which the time stamps are incremented corresponding to the rate at which its (that is, the zone player 11(n')'s) clock increments. In addition, the zone player 11(n') will notify the zone players that are operating as the master device 21 and slave devices 22(g) of the synchrony group 20 that it is the new audio information channel device 23 for the synchrony group 20, and provide the multi-cast address that it will be using to multi-cast the audio and playback timing information, as well as its unicast network address. After the members of the synchrony group 20 receive the notification from the zone player 11(n') indicating that it is the new audio information channel device 23 for the synchrony group 20, they will receive the audio and playback timing information from the zone player 11(n') instead of the zone player 11(n), using the multi-cast address provided by the zone player 11(n'). In addition, they can utilize the zone player 11(n')'s unicast network address to obtain current time information therefrom. It will be appreciated that the zone player 11(n') will determine its current time in relation to the time stamp that is provided by the zone player 11(n) (reference item (b)

above) or the current time information that it received from the zone player 11(*n*) using the SNTP protocol as described above.

Generally similar operations can be performed in connection with migrating the audio information channel device from one zone player 11(*n*) to another zone player 11(*n*') if the audio information is from one or more audio information files, such as may be the case if the audio information comprises MP3 or WAV files that are available from sources such as sources 16(*m*) connected to the network 12 or over from sources available over a wide area network such as the Internet, except for differences to accommodate the fact that the audio information is in files. In that case, the zone player 11(*n*) that is currently operating as the audio information channel device 23 for the synchrony group 20 can provide the following information to the zone player 11(*n*') that is to become the audio information channel device 23 for the synchrony group 20:

(d) a list of the audio information files containing the audio information that is to be played;

(e) the identification of the file for which the zone player 11(*n*) is currently providing audio and playback timing information, along with the offset into the file for which the current item of audio and playback timing information is being generated and the time stamp that the zone player 11(*n*) is associating with that frame, and (f) the identifications of the zone players that comprise the master device 21 and slave devices 22(*g*) comprising the synchrony group 20.

After the zone player 11(*n*') receives the information from the zone player 11(*n*), it will begin retrieving audio information from the file identified in item (e), starting at the identified offset. In addition, the zone player 11(*n*') can assemble the retrieved audio information into frames, associate each frame with a time stamp and transmit the resulting audio and playback timing information over the network 12. The zone player 11(*n*') will perform these operations in the same manner as described above, except that, instead of using the time indicated by its digital to analog converter clock 34 directly in generating the time stamps for the frames, the value of the initial time stamp will be related to the time stamp that is provided by the zone player 11(*n*) (reference item (e) above), with the rate at which the time stamps are incremented corresponding to the rate at which its (that is, the zone player 11(*n*')'s) clock increments. In addition, the zone player 11(*n*') will notify the zone players that are operating as the master device 21 and slave devices 22(*g*) of the synchrony group 20 that it is the new audio information channel device 23 for the synchrony group 20, and provide the multi-cast address that it will be using to multi-cast the audio and playback timing information, as well as its unicast network address. After the members of the synchrony group 20 receive the notification from the zone player 11(*n*') indicating that it is the new audio information channel device 23 for the synchrony group 20, they will receive the audio and playback timing information from the zone player 11(*n*') instead of the zone player 11(*n*), using the multi-cast address provided by the zone player 11(*n*'). In addition, they can utilize the zone player 11(*n*')'s unicast network address to obtain current time information therefrom. It will be appreciated that the zone player 11(*n*') will determine its current time in relation to the time stamp that is provided by the zone player 11(*n*) (reference item (b) above) or the current time information that it received from the zone player 11(*n*) using the SNTP protocol as described above. The zone player 11(*n*') will process successive audio information files in the list that it receives from the zone player 11(*n*) (reference item (d)).

Operations performed by the zone players 11(*n*) and 11(*n*') in connection with migration of the audio information channel device 23 for other types of audio information will be apparent to those skilled in the art. In any case, preferably, the zone player 11(*n*) will continue operating as an audio information channel device 23 for the synchrony group 20 for at least a brief time after it notifies the zone player 11(*n*') that it is to become audio information channel device for the synchrony group, so that the zone player 11(*n*') will have time to notify the zone players in the synchrony group 20 that it is the new audio information channel device 23 for the synchrony group.

Figure 3:
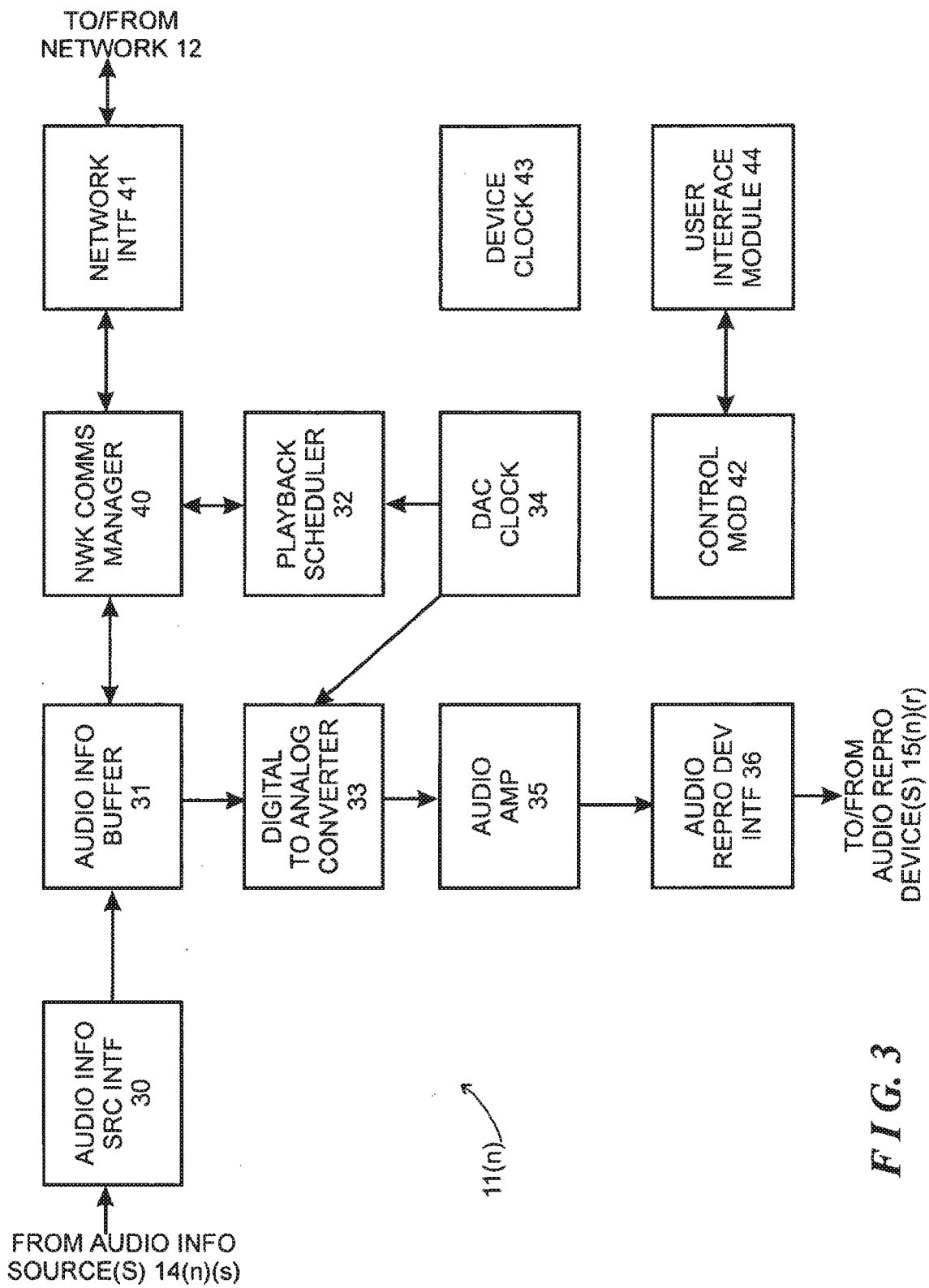
FIG. 3 depicts an functional block diagram of a zone player for use in the networked audio system depicted in FIG. 1.

Before proceeding further in describing operations performed by the network audio system 10, it would be helpful to provide a detailed description of a zone player 11(*n*) constructed in accordance with the invention. FIG. 3 depicts a functional block diagram of a zone player 11(*n*) constructed in accordance with the invention. All of the zone players in the network audio system 10 may have similar construction. With reference to FIG. 3, the zone player 11(*n*) includes an audio information source interface 30, an audio information buffer 31, a playback scheduler 32, a digital to analog converter 33, an audio amplifier 35, an audio reproduction device interface 36, a network communications manager 40, and a network interface 41, all of which operate under the control of a control module 42. The zone player 11(*n*) also has a device clock 43 that provides timing signals that control the general operations of the zone player 11(*n*). In addition, the zone player 11(*n*) includes a user interface module interface 44 that can receive control signals from the user interface module 13 (FIGS. 1 and 2) for controlling operations of the zone player 11(*n*), and provide status information to the user interface module 13.

Generally, the audio information buffer 31 buffers audio information, in digital form, along with playback timing information. If the zone player 11(*n*) is operating as the audio information channel device 23 (FIG. 2) for a synchrony group 20, the information that is buffered in the audio information buffer 31 will include the audio and playback timing information that will be provided to the devices 21 and 22(*g*) in the synchrony group 20. If the zone player 11(*n*) is operating as the master device 21 or a slave device 22(*g*) for a synchrony group, the information that is buffered in the audio information buffer 31 will include the audio and playback timing information that the zone player 11(*n*) is to play.

The audio information buffer 31 can receive audio and playback timing information from two sources, namely, the audio information source interface 30 and the network communications manager 40. In particular, if the zone player 11(*n*) is operating as the audio information channel device 23 for a synchrony group 20, and if the audio information source is a source 14(*n*)(*s*) connected to the zone player 11(*n*), the audio information buffer 31 will receive and buffer audio and playback timing information from the audio information source interface 30. On the other hand, if the zone player 11(*n*) is operating as the audio information channel device 23 for a synchrony group 20, and if the audio information source is a source 16(*m*) connected to the network 12, or a source available over the wide area network, the audio information buffer 31 will receive and buffer audio and playback timing information from the network communications manager 40. It will be appreciated that, if the zone player 11(*n*) is not a member of the synchrony group, the zone player 11(n) will not play this buffered audio and playback timing information.

On yet another hand, if the zone player 11(n) is operating as the master device 21 or a slave device 22(g) in a synchrony group, and if the zone player 11(n) is not also the audio information channel device 23 providing audio and playback timing information for the synchrony group 20, the audio information buffer 31 will receive and buffer audio and playback timing information from the network communications manager 40.

The audio information source interface 30 connects to the audio information source(s) 14(n)(s) associated with the zone player 11(n). While the zone player 11(n) is operating as audio information channel device 23 for a synchrony group 20, and if the audio information is to be provided by a source 14(n)(s) connected to the zone player 11(n), the audio information source interface 30 will selectively receive audio information from one of the audio information source(s) 14(n)(s) to which the zone player is connected and store the audio information in the audio information buffer 21. If the audio information from the selected audio information source 14(n)(s) is in analog form, the audio information source interface 30 will convert it to digital form. The selection of the audio information source 14(n)(s) from which the audio information source interface 30 receives audio information is under control of the control module 42, which, in turn, receives control information from the user interface module through the user interface module interface 44. The audio information source interface 30 adds playback timing information to the digital audio information and buffers the combined audio and playback timing information in the audio information buffer 21.

More specifically, as noted above, the audio information source interface 30 receives audio information from an audio information source 14(n)(s), converts it to digital form if necessary, and buffers it along with playback timing information in the audio information buffer 21. In addition, the audio information source interface 30 will also provide formatting and scheduling information for the digital audio information, whether as received from the selected audio information source 14(n)(s) or as converted from an analog audio information source. As will be made clear below, the formatting and scheduling information will control not only playback by the zone player 11(n) itself, but will also enable other zone players 11(n'), 11(n''), . . . that may be in a synchrony group for which the zone player 11(n) is the master device, to play the audio program associated with the audio information in synchrony with the zone player 11(n).

Figure 4:
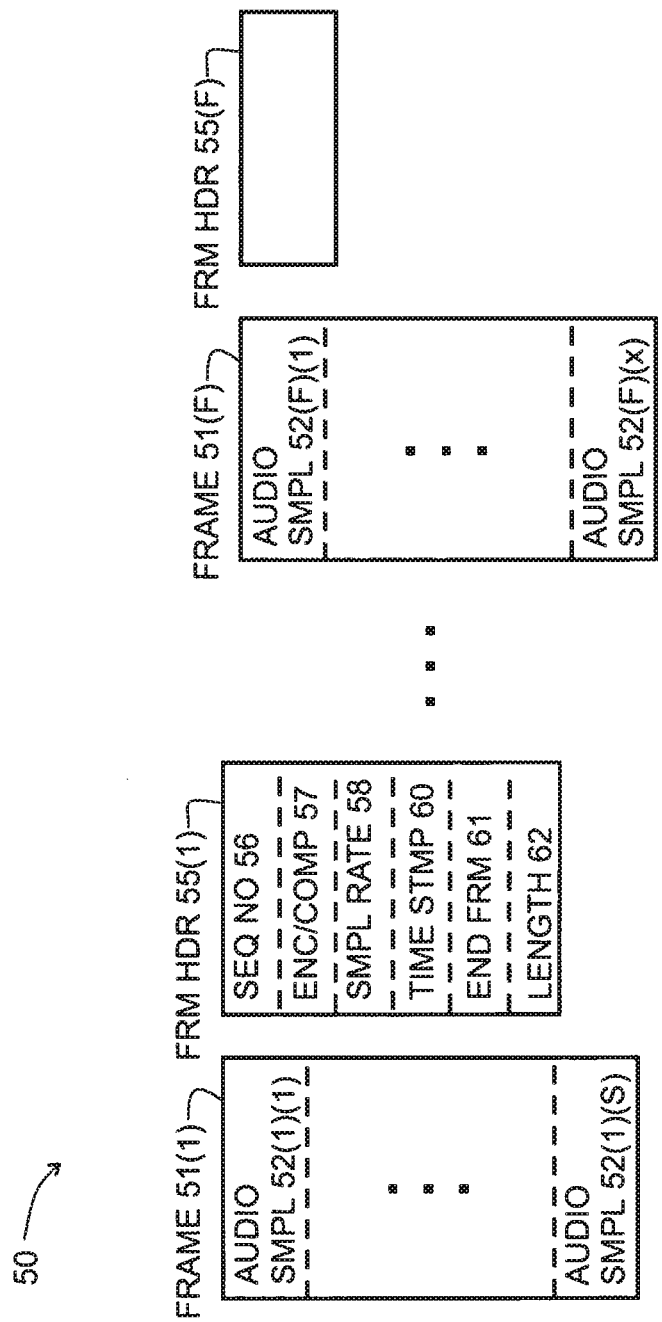
FIG. 4 is useful in understanding an digital audio information framing methodology useful in the network audio system depicted in FIG. 1.

In one particular embodiment, the audio information source interface 30 divides the audio information associated with an audio work into a series of frames, with each frame comprising digital audio information for a predetermined period of time. As used herein, an audio track may comprise any unit of audio information that is to be played without interruption. On the other hand, an audio program may comprise a series of one or more audio tracks that are to be played in succession. It will be appreciated that the tracks comprising the audio program may also be played without interruption, or alternatively playback between tracks may be interrupted by a selected time interval. FIG. 4 schematically depicts an illustrative framing strategy used in connection with one embodiment of the invention for a digital audio stream comprising an audio work. More specifically, FIG. 4 depicts a framed digital audio stream 50 comprising a sequence of frames 51(1) through 51(F) (generally identified by reference numeral 51(f)). Each frame 51(f), in turn, comprises a series of audio samples 52(f)(1) through 52(f)(S) (generally identified by reference numeral 52(f)(s)) of the audio track. Preferably all of the frames will have the same number "S" of audio samples, although it will be appreciated from the following that that is primarily for convenience. On the other hand, it will be appreciated that, the number of audio samples may differ from "S"; this may particularly be the case if the frame 51(f) contains the last audio samples for the digital audio stream for a particular audio work. In that case, the last frame 51(F) will preferably contain samples 52(F)(1) through 52(F)(x), where "x" is less than "S." Generally, it is desirable that the number of samples be consistent among all frames 51(f), and in that case padding, which will not be played, can be added to the last frame 51(F).

Associated with each frame 51(f) is a header 55(f) that includes a number of fields for storing other information that is useful in controlling playback of the audio samples in the respective frame 51(f). In particular, the header 55(f) associated with a frame 51(f) includes a frame sequence number field 56, an encoding type field 57, a sampling rate information field 58, a time stamp field 60, an end of track flag 61, and a length flag field 62. The header 55(f) may also include fields (not shown) for storing other information that is useful in controlling playback. Generally, the frame sequence number field 56 receives a sequence number "f" that identifies the relative position of the frame 51(f) in the sequence of frames 51(1) . . . 51(f) . . . 51(F) containing the digital audio stream 50. The encoding type field 57 receives a value that identifies the type of encoding and/or compression that has been used in generating the digital audio stream. Conventional encoding or compression schemes include, for example, the well-known MP3 and WAV encoding and/or compression schemes, although it will be appreciated that other schemes may be provided for as well. The sampling rate information field 58 receives sampling rate information that indicates the sampling rate for the audio samples 52(f)(s). As will be apparent to those skilled in the art, the sampling rate determines the rate at which the zone player 11(n) is to play the audio samples 52(f)(s) in the frame, and, as will be described below, determines the period of the digital to analog converter clock 34.

The condition of the end of work flag 61 indicates whether the frame 51(f) contains the last digital audio samples for the audio track associated with the framed digital audio work 50. If the frame 51(f) does not contain the audio samples that are associated with the end of the digital audio stream 50 for a respective audio work, the end of work flag will be clear. On the other hand, if the frame 51(f) does contain the audio samples that are associated with the end of the digital audio stream 50 for a respective audio work, the end of work flag 61 will be set. In addition, since the number of valid audio samples 52(F)(s) in the frame 51(F), that is, the samples that are not padding, may be less than "S," the default number of audio samples in a frame 51(f), the length flag field 62 will contain a value that identifies the number of audio samples in 52(F)(s) in the last frame 51(F) of the audio work 50. If, as noted above, the frames have a consistent number "S" of samples, the samples 52(F)(x+1) through 52(F)(S) will contain padding, which will not be played.

The time stamp field 60 stores a time stamp that identifies the time at which the zone player 11(n) is to play the respective frame. More specifically, for each frame of a framed digital audio stream 50 that is buffered in the audio information buffer 21, the audio information source interface 30, using timing information from the digital to analog converter clock 34, will determine a time at which the zone player 11(n) is to play the respective frame, and stores a time stamp identifying the playback time in the time stamp field 60. The time stamp associated with each frame will later be used by the playback scheduler 32 to determine when the portion of the digital audio stream stored in the frame is to be coupled to the digital to analog converter 33 to initiate play back. It will be appreciated that the time stamps that are associated with frames in sequential frames 51(1), 51(2), . . . , 51(F), will be such that they will be played back in order, and without an interruption between the sequential frames comprising the digital audio stream 50. It will further be appreciated that, after a time stamp has been determined for the first frame, stored in frame 51(1), of a digital audio stream 50, the audio information source interface 30 can determine time stamps for the subsequent frame 51(2), 51(3), . . . , 51(F) in relation to the number of samples "S" in the respective frames and the sample rate. The time stamps will also preferably be such that frames will be played back after some slight time delay after they have been buffered in the audio information buffer 21; the purpose for the time delay will be made clear below.

Returning to FIG. 3, in addition to dividing the digital audio information into frames, the audio information source interface 30 also aggregates and/or divides the frames 51(f) as necessary into packets, each of which will be of a length that would fit into a message for transmission over the network, and associates each packet with a packet sequence number. For example, if a packet will accommodate multiple frames 51(f), 51(f+1), . . . 51 (f+y−1), it will aggregate them into a packet and associate them with a packet number, for example p(x). If the entire frames 51(0 and 51(f+y−1) was accommodated in packet p(x), where "x" is the sequence number, which will occur if the size of a packet is an exact multiple of the frame size, the next packet, p(x+1) will begin with frame 51(f+y) and will include frames 51(f+y), . . . , 51(f+2y−1). Subsequent packets p(x+2), . . . will be formed in a similar manner. On the other hand, if the packet length will not accommodate an exact multiple of the frame size, the last frame in the packet will be continued at the beginning of the next packet.

If the audio information source interface 30 is aware of track boundaries, which may be the case if the tracks are divided into files, the packets will reflect the track boundaries, that is, the packets will not contain frames from two tracks. Thus, if the last frames associated with a track are insufficient to fill a packet, the packet will contain padding from the last frame associated with the track to the end of the packet, and the next packet will begin with the first frames associated with the next track.

In one embodiment, the audio information source interface 30 stores the packets in the audio information buffer 31 in a ring buffer. As is conventional, a ring buffer includes a series of storage locations in the buffer. Each entry will be sufficient to store one packet. Four pointers are used in connection with the ring buffer, a first pointer pointing to the beginning of the ring buffer, a second pointer pointing to the end of the ring buffer, an third "write" pointer pointing to the entry into which a packet will be written and a fourth "read" pointer pointing to the entry from which packet will be read for use in playback. When a packet is read from the ring buffer for playback, it will be read from the entry pointed to by the read pointer. After the packet has been read, the read pointer will be advanced. If the read pointer points beyond the end of the ring buffer, as indicated by the end pointer, it will be reset to point to the entry pointed to by the beginning pointer, and the operations can be repeated.

On the other hand, when the audio information source interface 30 stores a packet in the ring buffer, first determine whether the entry pointed to by the write pointer points to the same entry as the entry pointed to by the read pointer. If the write pointer points to the same entry as the entry pointed to by the read pointer, the entry contains at least a portion of a packet that has not yet been read for playback, and the audio information source interface 30 will delay storage of the packet until the entire packet has been read and the read pointer advanced. After the read pointer has been advanced, the audio information source interface 30 can store the packet in the entry pointed to by the write pointer. After the packet has been stored, the audio information source interface 30 will advance the write pointer. If the write pointer points beyond the end of the ring buffer, as indicated by the end pointer, it will be reset to point to the entry pointed to by the beginning pointer, and the operations can be repeated.

As noted above, the zone player 11(n) can operate both as an audio information channel device 23 and a member of the synchrony group 20 of which it is a member. In that case, the audio information buffer 31 can contain one ring buffer. On the other hand, the zone player 11(n) can operate as an audio information channel device 23 for one synchrony group 20(1) (FIG. 2A) and a member of another synchrony group 20(2). In that case, the audio information buffer 31 would maintain two ring buffers, one for the audio and timing information associated with synchrony group 20(1), and the other for the audio and timing information associated with synchrony group 20(2). It will be appreciated that, in the latter case, the zone player 11(n) will only use the audio and timing information that is associated with synchrony group 20(2) for playback.

The playback scheduler 32 schedules playback of the audio information that is buffered in the audio information buffer 31 that is to be played by the zone player 11(n). Accordingly, under control of the playback scheduler 32, the digital audio information that is buffered in the audio information buffer 21 that is to be played by the zone player 11(n) is transferred to the digital to analog converter 33 for playback. As noted above, if the zone player 11(n) is operating as an audio information channel device 23 for a synchrony group 20 for which it is not a member, the playback scheduler 32 will not schedule the digital audio information that is to be played by that synchrony group 20 for playback. The playback scheduler 32 only schedules the digital audio information, if any, that is buffered in the audio information buffer 31 that is associated with a synchrony group for which the zone player 11(n) is a member, whether as master device 21 or a slave device 22(g).

Essentially, the playback scheduler 32 makes use of the read pointer associated with the circular buffer that contains the audio and playback timing information that is to be played by the zone player 11(n). The playback scheduler 32 retrieves the packet information from the entry of the ring buffer pointed to by the read pointer, and then advances the ring pointer as described above. The playback scheduler 32 determines the boundaries of the frames in the packet and uses the time stamps in the time stamp fields 60 associated with the respective frame 51(f), along with timing information provided by the zone player 11(n)'s digital to analog converter clock 34, to determine when the respective frame is to be transferred to the digital to analog converter 33. Generally, when the time stamp associated with a buffered digital audio information frame corresponds to the current time as indicated by the digital to analog converter clock 34, the playback scheduler 32 will enable the respective frame to be transferred to the digital to analog converter 33.

The digital to analog converter 33, also under control of the digital to analog converter clock 34, converts the buffered digital audio information to analog form, and provides the analog audio information to the audio amplifier 35 for amplification. The amplified analog information, in turn, is provided to the audio reproduction devices 15(n)(r) through the audio reproduction device interface 36. The audio reproduction devices 15(n)(r) transform the analog audio information signal to sound thereby to provide the audio program to a listener. The amount by which the audio amplifier 35 amplifies the analog signal is controlled by the control module 42, in response to volume control information provided by the user through the user interface module 13.

The network communications manager 40 controls network communications over the network 12, and the network interface 41 transmits and receives message packets over the network 12. The network communications manager 40 generates and receives messages to facilitate the transfer of the various types of information described above in connection with FIG. 2, including the channel device control information, slave device control information, audio and playback timing information and the audio information channel device's clock timing information. In connection with the channel device control information and the slave device control information, the network communications manager 40 will generate messages for transfer over the network 12 in response to control information from the control module 42. Similarly, when the network communications manager 40 receives messages containing channel device control information and slave device control information, the network communications manager will provide the information to the control module 42 for processing.

With regards to the audio information channel device's clock timing information, as noted above, the master device 21 and slave devices 22(g) of the synchrony group 20 obtain the clock timing information from the audio information channel device 23 using the well-known SNTP. If the zone player 11(n) is operating as the audio information channel device 23 for a synchrony group, during the SNTP operation, it will provide its current time, particularly a current time as indicated by its digital to analog converter clock 34. On the other hand, if the zone player 11(n) is operating as the master device 21 or slave device 22(g) of a synchrony group 20, it will receive the clock timing information from the audio information channel device 23. After the respective device 21, 22(g) has obtained the audio information channel device's clock timing information, it will generate a differential time value $\Delta T$ representing the difference between the time T indicated by its digital to analog converter clock 34 and the current time information from the audio information channel device 23. The differential time value will be used to update the time stamps for the frames of the digital audio stream 50 (FIG. 4) that are received from the audio information channel device.

With regards to the audio and playback timing information, operations performed by the network communications manager 40 will depend on whether (i) the audio and playback timing information has been buffered in the audio information buffer 31 for transmission, as audio information channel device 23, over the network 12 to the master device 21 and/or slave devices 22(g) of a synchrony group, or (ii) the audio and playback timing information has been received from the network 12 to be played by the zone player 11(n) as either the master device 21 for a synchrony group or a slave device in a synchrony group.

It will be appreciated that the network communications manager 40 may be engaged in both (i) and (ii) contemporaneously, since the zone player 11(n) may operate both as the audio information channel device 23(1) for a synchrony group 20(1) (reference FIG. 2A) of which it is not a member, and a member of another synchrony group 20(2) for which another zone player 11(n') is the audio information channel device 23(2). With reference to item (i) above, after a packet that is to be transmitted has been buffered in the respective ring buffer, the network communications manager 40 retrieves the packet, packages it into a message and enables the network interface 41 to transmit the message over the network 12. If the control module 42 receives control information from the user interface module 13 (if the master device 21 is also the audio information channel device 23 for the synchrony group 20) or from the master device (if the master device 21 is not the audio information channel device 23 for the synchrony group 20) that would require the transmission of a "resynchronize" command as described above, the control module 42 of the audio information channel device 23 enables the network communications manager 40 to insert the command into a message containing the audio and playback timing information. Details of the operations performed in connection with the "resynchronize" command will be described below. As noted above, the "resynchronize" command is used if the user enables a synchrony group to terminate the playback of a track that is currently being played, or cancel playback of a track whose playback has not begun.

On the other hand, with reference to item (ii) above, if network interface 41 receives a message containing a packet containing frames of audio and playback timing information that the zone player 11(n) is to play either as a master device 21 or a slave device for a synchrony group 20, the network interface 41 provides the audio and playback timing information to the network communications manager 40. The network communications manager 40 will determine whether the packet contains a resynchronize command and, if so, notify the control module 42, which will enable operations to be performed as described below. In any case, the network communications manager 40 will normally buffer the various frames comprising the audio and playback timing information in the audio information buffer 31, and in that operation will generally operate as described above in connection with the audio information source interface 30. Before buffering them, however, the network communications manager 40 will update their time stamps using the time differential value described above. It will be appreciated that the network communications manager 40 will perform similar operations whether the messages that contain the packets were multi-cast messages or unicast messages as described above The updating of the time stamps by the master device 21 and the slave devices 22(g) in the synchrony group 20 will ensure that they all play the audio information synchronously. In particular, after the network communications manager 40 has received a frame 51(f) from the network interface 41, it will also obtain, from the digital to analog converter clock 34, the zone player 11(n)'s current time as indicated by its digital to analog converter clock 34. The network communications manager 40 will determine a time differential value that is the difference between the slave device's current clock time, as indicated by its digital to analog converter 34, and the audio information channel device's time as indicated by the audio information channel device's clock timing information. Accordingly, if the master or slave device's current time has a value $T_S$ and the audio information channel device's current time, as indicated by the clock timing information, has a value $T_C$, the time differential value $\Delta T = T_S - T_C$. If the current time of the master or slave device in the synchrony group 20, as indicated by its digital to analog converter clock 34, is ahead of the audio information channel device's clock time as indicated by the clock timing information received during the SNTP operation, the time differential value will have a positive value. On the other hand, if the master or slave device's current time is behind the audio information channel device's clock time, the time differential value $\Delta T$ will have a negative value. If the zone player 11($n$) obtains clock timing information from the audio information channel device 23 periodically while it is a member of the synchrony group 20, the network communications manager 40 can generate an updated value for the time differential value $\Delta T$ when it receives the clock timing information from the audio information channel device 23, and will subsequently use the updated time differential value.

The network communications manager 40 uses the time differential value $\Delta T$ that it generates from the audio information channel device timing information and zone player 11($n$)'s current time to update the time stamps that will be associated with the digital audio information frames that the zone player 11($n$) receives from the audio information channel device. For each digital audio information frame that is received from the audio information channel device, instead of storing the time stamp that is associated with the frame as received in the message in the audio information buffer 21, the network communications manager 40 will store the updated time stamp with the digital audio information frame. The updated time stamp is generated in a manner so that, when the zone player 11($n$), as a member of the synchrony group plays back the digital audio information frame, it will do so in synchrony with other devices in the synchrony group.

More specifically, after the zone player 11($n$)'s network interface 41 receives a message containing a packet that, in turn, contains one or more frames 51($f$), it will provide the packet to the network communications manager 40. For each frame 51($f$) in the packet that the network communications manager 40 receives from the network interface 41, the network communications manager 40 will add the time differential value $\Delta T$ to the frame's time stamp, to generate the updated time stamp for the frame 51($f$), and store the frame 51($f$), along with the header 55($f$) with the updated time stamp in the audio information buffer 31. Thus, for example, if a frame's time stamp has a time value $T_F$, the network communications manager 40 will generate an updated time stamp $T^U_F$ having a time value $T^U_F = T_F + \Delta T$. Since time value $T^U_F$ according to the slave device's digital to analog converter clock 34 is simultaneous to the time value $T_F$ according to the audio information channel device's digital to analog converter clock 34, the zone player 11($n$) device will play the digital audio information frame at the time determined by the audio information channel device 23. Since all of the members of the synchrony group 20 will perform the same operations, generating the updated time stamps $T^U_F$ for the various frames 51($f$) in relation to their respective differential time values, all of the zone players 11($n$) in the synchrony group 20 will play them synchronously. The network communications manager 40 will generate updated time stamps $T^U_F$ for all of the time stamps 60 in the packet, and then store the packet in the audio information buffer 31.

It will be appreciated that, before storing a packet in the audio information buffer 21, the network communications manager 40 can compare the updated time stamps $T^U_F$ associated with the frames in the packet to the slave device's current time as indicated by its digital to analog converter clock 34. If the network communications manager 40 determines the time indicated by the updated time stamps of frames 51($f$) in the packet are earlier than the zone player's current time, it can discard the packet instead of storing it in the audio information buffer 21, since the zone player 11($n$) will not play them. That is, if the updated time stamp has a time value $T^U_F$ that identifies a time that is earlier than the zone player's current time $T_S$ as indicated by the zone player's digital to analog converter clock 34, the network communications manager 40 can discard the packet.

If the zone player 11($n$) is operating as the master device 21 of a synchrony group 20, when the user, through the user interface module 13, notifies the zone player 11($n$) that another zone player 11($n'$) is to join the synchrony group 20 as a slave device 22($g$), the control module 42 of the zone player 11($n$) enables the network communications manager 40 to engage in an exchange of messages, described above in connection with FIG. 2, to enable the other zone player 11($n'$) to join the synchrony group 20 as a slave device. As noted above, during the message exchange, the messages generated by the network communications manager 40 of the zone player 11($n$) will provide the network communications manager of the zone player 11($n'$) that is to join the synchrony group 20 with information such as the multi-cast address being used by the audio information channel device 23 that is providing the audio program to the synchrony group 20, as well as a unicast network address for the audio information channel device 23. After receiving that information, the network communications manager and network interface of the zone player 11($n'$) that is to join the synchrony group 20 can begin receiving the multi-cast messages containing the audio program for the synchrony group, engage in SNTP transactions with the audio information channel device 23 to obtain the latter's current time, and also enable the audio information channel device 23 to send the zone player 11($n'$) frames 51($f$) that it had previously broadcast using the unicast message transmission methodology as described above.

On the other hand, if the network communications manager 40 and network interface 41 of the zone player 11($n$) receive a message over the network 12 indicating that it is to become a slave device 22($g$) of a synchrony group for which another zone player 11($n'$) is the master device, the network communications manager 40 for zone player 11($n$) will provide a notification to the control module 42 of zone player 11($n$). Thereafter, the control module 42 of zone player 11($n$) can enable the network communications manager 40 of zone player 11($n$) to perform the operations described above to enable it to join the synchrony group 20.

As noted above, the user, using user interface module 13, can enable the synchrony group to terminate playback of a track of an audio program that is currently being played. After playback of a track that is currently being played has been terminated, playback will continue in a conventional manner with the next track that has been buffered in the audio information buffer 31. It will be appreciated that that could be the next track that is on the original play list, or a previous track. In addition, the user can enable the synchrony group 20 to cancel playback of a track that it has not yet begun to play, but for which buffering of packets has begun in the synchrony group 20. Both of these operations make use of the "resynchronize" command that the master device 21 of the synchrony group 20 can enable the audio information channel device 23 to include in the multi-cast message stream that it transmits to the synchrony group 20. Generally, in response to receipt of the resynchronize command, the members of the synchrony group 20 flush the ring buffer containing the packets that they are to play in the future. In addition, if the members of the synchrony group provide separate buffers for their respective digital to analog converters 33, the members will also flush those buffers as well. After the audio information channel device transmits a packet containing the resynchronize command:

(i) in the case of the use of the resynchronize command to terminate playing of a track that is currently being played, the audio information channel device 23 will begin multi-casting packets for the next track, to begin play immediately, and will continue through the play list in the manner described above; and (ii) in the case of the use of the resynchronize command to cancel play of a track for which buffering has begun, but which is to be played in the future, the audio information channel device 23 will begin multi-casting packets for the track after the track that has been cancelled, to be played beginning at the time the cancelled track was to begin play, and will also continue through the play list in the manner described above.

It will be appreciated that, (a) in the first case (item (i) directly above), the resynchronize command can enable the read pointer to be set to point to the entry in the circular buffer into which the first packet for the next track will be written, which will correspond to the entry to which the write pointer points, but (b) in the second case (item (ii) directly above), the resynchronize command can enable the write pointer for the circular buffer to be set to point to the entry that contains the first packet for the track whose play is being cancelled.

It will further be appreciated that, if a track is cancelled for which buffering has not begun, the resynchronize command will generally not be necessary, since the audio information channel device 23 for the synchrony group 20 need only delete that track from the play list.

Operations performed in connection with use of the resynchronize command to cancel playback of a track that is currently being played will be described in connection with Packet Sequence A below, and operations performed in connection with the use of the resynchronize command to cancel playback of a track that is has not yet begun to play, but for which buffering of packets has begun, will be described in connection with Packet Sequence B below.

Packet Sequence A
(A1.0) [packet 57]
(A1.1 [continuation of frame 99]
(A1.2) [frame 100, time=0:00:01, type=mp3 audio]
(A1.3) [frame 101, time=0:00:02, type=mp3 audio]
(A1.4) [frame 102, time=0:00:03, type=mp3 audio]
(A2.0) [packet 58]
(A2.1) [continuation of frame 102]
(A2.2) [frame 103, time=0:00:04, type=mp3 audio]
(A2.3) [frame 104, time=0:00:05, type=mp3 audio]
(A2.4) [frame 105, time=0:00:06, type=mp3 audio]
(A3.0) [packet 59]
(A3.1) [continuation of frame 105]
(A3.2) [frame 106, time=0:00:07, type=mp3 audio]
(A3.3) [frame 107, time=0:00:08, type=mp3 audio]
(A3.4) [frame 108, time=0:00:09, type=mp3 audio]
(A4.0) [packet 60]
(A4.1) [continuation of frame 108]
(A4.2) [frame 109, time=0:00:10, type=mp3 audio]
(A4.3) [Resynchronize command]
(A4.4) [Padding, if necessary]
(A5.0) [packet 61]
(A5.1) [frame 1, time=0:00:07, type=mp3 audio]
(A5.2) [frame 2, time=0:00:08, type=mp3 audio]
(A5.3) [frame 3, time=0:00:09, type=mp3 audio]
(A5.4) [frame 4, time=0.00.10, type=mp3 audio]
(A6.0) [packet 62]
(A6.1) [continuation of frame 4]
(A6.2) [frame 5, time=0:00:11, type=mp3 audio]
(A6.3) [frame 6, time=0:00:12, type=mp3 audio]
(A6.4) [frame 7, time=0:00:13, type=mp3 audio]

Packet Sequence A comprises a sequence of six packets, identified by packet 57 through packet 62, that the audio information channel device 23 multi-casts in respective messages to the members of a synchrony group 20. It will be appreciated that the series of messages that the audio information channel device 23 may multi-cast to the synchrony group 20 may include a messages prior to the packet 57, and may also include messages after packet 62. Each packet comprises a packet header, which is symbolized by lines (A1.0), (A2.0), . . . (A6.0) in Packet Sequence A, and will generally also include information associated with at least a portion of a frame. In the packets represented in Packet Sequence A, each packet includes information associated with a plurality of frames. Depending on the lengths of the packets, each packet may contain information associated with a portion of a frame, an entire frame, or multiple frames. In the illustration represented by Packet Sequence A, it is assumed that each packet may contain information associated with multiple frames. In addition, it is assumed that a packet does not necessarily contain information associated with an integral number of frames; in that case, a packet may contain information associated with a portion of a frame, and the next packet will contain the information associated with the rest of a frame.

The frames and associated header playback timing information contained in the various packets are symbolized by lines (A1.1), (A1.2), . . . , (A1.4), (A2.1), . . . (A6.4) of Packet Sequence A. Thus, for example, line (A1.2) of packet 57 represents the one-hundredth frame, that is, frame 51(100) (reference FIG. 4), of the track whose audio information is being transmitted in the sequence of packets that includes packet 57. The frame 51(100) is to be played at an illustrative time, according to the audio information channel device's digital to analog converter clock, of "time=0:00:01," and the frame is encoded and/or compressed using the well-known MP3 encoding and compression methodology. In that case, the legend"time=0:00:01" represents the time stamp that would be included in field 60 (FIG. 4) of the header associated with the frame 50(100) as multi-cast by the audio information channel device for the synchrony group. It will be appreciated that the playback time and encoding/compression methodology will be referred in the header 55(100) that is associated with the frame 51(100). It will also be appreciated that the header may also contain additional information as described above.

Similarly, line (A1.3) of packet 57 represents the one-hundred and first frame, that is, frame 51(101), of the track whose audio information is being transmitted in the sequence of packets that includes packet 57. The frame 51(101) is to be played at an illustrative time, according to the audio information channel device's digital to analog converter clock, of "0:00:02," and the frame is also encoded and/or compressed using the MP3 encoding and compression methodology. Line (A1.4) of packet 57 represents similar information, although it will be appreciated that, depending on the length of packet 57, the line may not represent the information for an entire frame 51(102) and/or its associated header. If the length of packet 57 is not sufficient to accommodate the information for the entire frame 51(102) and/or associated header, the information will continue in packet 58, as represented by line (A2.1) in Packet Sequence A. Similarly, if the length of packet 56 was not sufficient to contain the information for an entire frame 51(99) preceding frame 51(100), packet 57 (lines (A1.0) through 1.4) may contain any information from frame 51(99) that packet 56 was unable to accommodate.

As noted above, when the master device 21 or a slave device 22(*g*) in the synchrony group 20 receives the packet 57, its respective network communications manager 40 will update the time stamps associated with the various frames 51(*f*) as described above before buffering the respective frames in the respective audio information buffer 31.

Packets 58 and 59 contain information that is organized along the lines described above in connection with packet 57.

Packet 60 also contains, as represented by lines (A4.1) and (A4.2), information that is organized along the lines of the information represented by lines (Ax.1) and (Ax.2) ("x" equals an integer) described above in connection with packets 57 through 59. On the other hand, packet 60 contains a resynchronize command, as represented by line (A4.3). Packet 60 also may contain padding, as represented by line 4.4, following the resynchronize command. As noted above, the master device 21 of a synchrony group 20 will enable the audio information channel device 23 that is providing audio information to the synchrony group 20 to multi-cast a message containing the resynchronize command when it receives notification from the user interface module 13 that the user wishes to cancel playback of a track that is currently being played. In the example depicted in Packet Sequence A, as will be described below, the audio information channel device 23 receives notification from the master device 21 that the user wishes to cancel playback of a track at a time corresponding to "time=0:00:07" according to its digital to analog converter clock 34, and, in line (A4.3) of packet 60 it will provide the resynchronize command, followed by padding, if necessary.

As will be apparent from examining lines (A3.1) through (A3.4) of packet 59 and lines (A4.1) and (A4.2) of packet 60, although the audio information channel device 23 has received the notification from the synchrony group's master device 21 to multi-cast the resynchronize command at a time corresponding to "time=0:00:07" according to the clock time indicated by its digital to analog converter clock 34, it (that is, the audio information channel device 23) has already multi-cast messages containing frames that are to be played at that time and subsequently. That is, the audio information channel device 23 has, multi-cast in packet 59, frames 51(106) through 51(108) that contain time stamps "time=0:00:07," "time=0:00:08" and "time=0:00:09," respectively, and, in packet 60, in addition to the continuation of frame 51(108), frame 51(109) that contains time stamp "time=0:00:10." (It will be appreciated that the times indicated by the illustrative time stamps are for illustration purposes only, and that in an actual embodiment the time stamps may have different values and differentials.)

As noted above, the audio information channel device 23 multi-casts a message containing a packet that, in turn, contains the resynchronize command when it receives the notification from the master device 21 to do so. In the example depicted in Packet Sequence A, the packet will be multi-cast when the audio information channel device's digital to analog converter clock time corresponds to "0:00:07." Subsequently, two things happen. In one, aspect, when the master device 21 and slave devices 22(*g*) receive the packet that contains the resynchronize command, they will stop playing the audio program that they are playing.

In addition, the audio information channel device 23 will begin transmitting frames containing audio information for the next track, including therewith time stamps immediately following the digital to analog converter clock time at which the packet including the resynchronize command was transmitted. Accordingly, and with further reference to Packet Sequence A, the audio information channel device 23 will multi-cast a message containing packet 61. As indicated above, packet 61 contains, as represented in lines (A5.1) through (A5.3), frames 51(1) through 51(3), which are the first three frames of the next track of the audio program that is to be played. It is also compressed and encoded using the MP3 encoding and compression scheme, and it is accompanied by time stamps "time=0:00:07," "time=0:00:08" and "time=0:00:10." As noted above, the time stamp "time=0:00:07" corresponds to the clock time at which the audio information channel device 23 multi-casts the resynchronize command, and, when the master device 21 and slave devices 22(*g*) receive these frames, they would be expected to begin playing them very shortly, if not immediately after the audio information channel device 23 multi-casts the message containing the packet that, in turn, contains the resynchronize command. Packet 61 also includes at least a portion of the next frame, that is, frame 51(4), for that track. In addition, Packet Sequence A depicted above further includes a subsequent packet, namely, packet 62, that contains any necessary continuation of frame 51(4), as well as three subsequent frames. If any additional packets are required for the track, as well as for subsequent tracks, they can be multi-cast in a similar manner.

As further noted above, the resynchronize command can also be used to cancel playing of one or more tracks for which playback has begun. This will be illustrated in connection with Packet Sequence B:

Packet Sequence B
(B1.0) [packet 157]
(B1.1) [continuation of frame 99]
(B1.2) [frame 100, time=0:00:01, type=mp3 audio]
(B1.3) [frame 101, time=0:00:02, type=mp3 audio]
(B1.4) [frame 102, time=0:00:03, type=mp3 audio]
(B2.0) [packet 158]
(B2.1) [continuation of frame 102]
(B2.2) [frame 103, time=0:00:04, type=mp3 audio]
(B2.3) [frame 104, time=0:00:05, type=mp3 audio]
(B2.4) [frame 105, time=0:00:06, type=mp3 audio]
(B3.0) [packet 159]
(B3.1) [continuation of frame 105]
(B3.2) [frame 106, time=0:00:07, type=mp3 audio]
(B3.3) [track boundary notification]
(B3.4) [Padding, if necessary]
(B4.0) [packet 160]
(B4.1) [frame 1, time=0:00:08, type=mp3 audio]
(B4.2) [frame 2, time=0:00:09, type=mp3 audio]
(B4.3) [frame 3, time=0:00:10, type=mp3 audio]
(B5.0) [packet 161]
(B5.1) [continuation of frame 3]
(B5.2) [frame 4, time=0:00:11, type=mp3 audio]
(B5.3) [Resynchronize, after packet 159]
(B5.4) [Padding, if necessary]
(B6.0) [packet 162]
(B6.1) [frame 1, time=0:00:08, type=mp3 audio]
(B6.2) [frame 2, time=0:00:09, type=mp3 audio]
(B6.3) [frame 3, time=0:00:10, type=mp3 audio].
(B6.4) [frame 4, time=0:00:11, type=mp3 audio]
(B7.0) [packet 163]
(B7.1) [continuation of frame 4]
(B7.2) [frame 5, time=0:00:12, type=mp3 audio]

(B7.3) [frame 6, time=0:00:13, type=mp3 audio]
(B7.4) [frame 7, time=0:00:14, type=mp3 audio]

Packet Sequence B comprises a series of seven packets, identified by packet 157 through 163 that the audio information channel device 23 multi-casts to the members of a synchrony group 20. As with Packet Sequence A, it will be appreciated that the series of packets that the audio information channel device 23 may multi-cast to the synchrony group 20 may include packets prior to the packet 157, and may also include packets after packet 162. Each packet comprises a packet header, which is symbolized by lines (B1.0), (B2.0), . . . (B7.0) in Packet Sequence B. As in Packet Sequence A, each packet will also generally include information associated with at least a portion of a frame 51(*f*) along with its associated frame 55(*f*). As in the packets represented in Packet Sequence A, each packet includes information associated with a plurality of frames. Depending on the lengths of the packets, each packet may contain information associated with a portion of a frame, an entire frame, or multiple frames. Further, as with Packet Sequence A, it is assumed that each packet may contain information associated with multiple frames. In addition, it is assumed that a packet does not necessarily contain information associated with an integral number of frames; in that case, a packet may contain information associated with a portion of a frame, and the next packet will contain the information associated with the rest of a frame.

The structures of the packets represented by Packet Sequence B are similar to those described above in connection with Packet Sequence A, and will not be repeated here. Generally, Packet Sequence B illustratively contains a sequence of packets that represent at least portions of three tracks that may have been selected from, for example, a play list. In particular, packets 157 through 159 represent frames from a portion of one track, packets 160 and 161 represent frames from a second track and packets 162 and 163 represent frames from a third track. The play list indicated that the first, second and third tracks were to be played in that order. With particular reference to Packet Sequence B, it should be noted that line (B3.3) indicates that packet 159 includes an indication that that packet contains the last frame for the track, and line (B3.4) provides for padding to the end of the packet. The first frame of the next track begins in packet 160.

In connection with the use of the resynchronize command to cancel playback of a track, at least a portion of which the audio information channel device 23 has multi-cast to the members of the synchrony group, packet 161, in line (B5.3) represents a resynchronize command that indicates that resynchronization is to occur after packet 159, that is, immediately after the packet that contains the last frame of the first of the three tracks represented by the packets in Packet Sequence B. It should be noted that the resynchronize command is in the packet 161, while the resynchronization is to occur at packet 160, that is, the synchrony group is to not play the track starting with packet 160, but instead is to begin playing the track frames for which begin with the next packet, that is, packet 162. As with Packet Sequence A, in Packet Sequence B the audio information channel device 23, in packet 162 and 163, multi-casts frames whose time stamps indicate that they are to be played when the frames that were multi-cast in packets 160 and 161 were to be played. By use of the resynchronize command and specifying a packet in this manner, the audio information channel device can cancel playback of a track for which playback has not yet begun.

It will be appreciated that the resynchronize command is generally not necessary for cancelling play back of a track that the audio information channel device 23 has not started multi-casting to the synchrony group 20, since the audio information channel device 23 itself can re-order the play list to accommodate the cancellation.

The invention provides a number of advantages. In particular, the invention provides a network audio system in which a number of devices share information can reproduce audio information synchronously, notwithstanding the fact that packets, which may contain digital audio information, transmitted over the network to the various zone players connected thereto may have differing delays and the zone players operate with independent clocks. Moreover, although the invention has been described in connection with audio information, it will be appreciated that the invention will find utility in connection with any type of isochronous information for which synchrony among devices is desired. The system is such that synchrony groups are created and destroyed dynamically, and in such a manner as to avoid requiring a dedicated device as the master device.

It will be appreciated that a number of changes and modifications may be made to the network audio system 10 as described above. For example, although the invention has been described as providing that the audio information channel device 23 provides digital audio information to the members synchrony group 20 that has been encoded using particular types of encoding and compression methodologies, it will be appreciated that the audio information channel device 23 can provide digital audio information to various members of the synchrony group 20 that have been encoded and compressed using different types of encoding and compression methodologies, and, moreover, for which different sampling rates have been used. For example, the audio information channel device 23 may provide digital audio information to the master device 21 and slave devices 22(1) through 22($g_1$) using the MP3 methodology at a specified sampling rate, the digital audio information for the same program to slave devices 22($g_1$+1) through 22($g_2$) using the WAV methodology at one specified sampling rate, and to slave devices 22($g_2$+1) through 22(G) using the WAV methodology at another specified sampling rate. In that case, the audio information channel device 23 can specify the particular encoding and compression methodology that has been used in the encoding type field 57 associated with each frame and the sampling rate in the sampling rate field 58. Moreover, since the encoding and compression type and sampling rate are specified for each frame, the encoding and compression type and sampling rate can be changed from frame to frame. The audio information channel device 23 may use different multi-cast addresses for the different encoding and compression types and sampling rates, but it will be appreciated that that would not be required.

It will be appreciated that two advantages of providing that the encoding and compression methodology and the sampling rate is provided on a frame-by-frame basis, instead of on, for example, a track-by-track basis, is that that would facilitate a slave device joining the synchrony group 20 at a frame mid-track, without requiring, for example, the master device 21 or the audio information channel device 23 to notify it of the encoding and compression methodology or the sampling rate.

Another modification is that, instead of the network communications manager 40 of a member of a synchrony group 20 generating the updated time stamp $T^U_F$ for a digital audio information frame by adding the time differential value $\Delta T$ to the time stamp $T_F$ associated with a frame, the network communications manager 40 may instead generate the updated time stamp $T^U_F$ by subtracting the differential time value ΔT from the member's current time $T_S$ as indicated by the member's digital to analog converter clock 34 at the time at which the digital audio information is received. It will be appreciated, however, that there may be variable time delays in processing of messages by the slave device's network communications manager 40, and so it may be preferable to generate the time differential value ΔT using the time stamp $T_F$ provided by the audio information channel device 23.

In addition, instead of the network communications manager 40 of a member of a synchrony group generating an updated time stamp to reflect the difference between the times indicated by the member's digital to analog converter clock and the audio information channel device's digital to analog converter clock, the network communications manager 40 can generate the time differential value ΔT and provide it to the member's playback scheduler 32. In that case, the member's network communications manager 40 can store each digital audio information frame along with the time stamp $T_F$ as received from the master device in the audio information buffer 21. The playback scheduler 32 can utilize the time differential value ΔT, and the time stamps $T_F$ associated with the digital audio information frames, to determine when the respective digital audio information frames are to be played. In determining when a digital audio information frame is to be played, the playback scheduler can add the time differential value to the time stamp $T_F$ associated with the digital audio frame, and enable the digital audio frame to be coupled to the digital to analog converter 33 when the time indicated by the sum corresponds to the current time as indicated by the slave device's digital to analog converter clock 34. Alternatively, when the member's digital to analog converter clock 34 updates its current time $T_S$, the playback scheduler can generate an updated current time $T'_S$ by subtracting the differential time value ΔT from the current time $T_S$, and using the updated current time $T'_S$ to determine when to play a digital audio information frame.

As described above, the members of a synchrony group 20 periodically obtain the audio information channel device's current time value and uses the current time value that it receives from the audio information channel device to periodically update the time differential value ΔT that it uses in updating the time stamps associated with the various frames. It will be appreciated that, if the digital to analog converter clock(s) associated with the member(s) of a synchrony group 20 are ensured to have the same rate as the digital to analog converter clock, a member need only obtain the current time value from the audio information channel device once, at the beginning of playback.

As another alternative, if the zone players are provided with digital to analog converter clock 34 whose time and rate can be set by an element such as the network communications manager 40, when a zone player 11(*n*) is operating as a member of a synchrony group 20, its network communications manager 40 can use the various types of timing information that it receives from the audio information channel device 23, including the current time information and the playback timing information indicated by the time stamps that are associated with the various frames 51(*f*) comprising the audio and playback timing information that it receives, to adjust the synchrony group member's digital to analog converter clock's time value and/or the clock rate that it uses for playback. If the clock's time value is to be adjusted, when the synchrony group member's network communications manager 40 initially receives the current time information from the audio information channel device 23 for the synchrony group 20, the network communications manager 40 can set the synchrony group member's digital to analog converter clock 34 to the current time value as indicated by the audio information channel device's current time information. The network communications manager 40 can set the clock 34 to the current time value indicated by the audio information channel device's current time information once, or periodically as it receives the current time information.

Alternatively or in addition, the synchrony group member's network communications manager 40 can use one or both of the current time information and/or the playback timing information in the time stamps associated with the respective frames 51(*f*) to adjust the clock rate of the clock 34 that it uses for playback. For example, when the synchrony group member's network communications manager 40 receives a frame 51($f_x$) having a time stamp having a time value $T_{f_x}$ it can generate the updated time value $T^U_{f_x} = T_{f_x} + \Delta T$ as described above, and store the frame with the time stamp with the updated time value in the audio information buffer 30. In addition, since both the number of samples in a frame and the sampling rate, which determines the rate at which the frame is to be played, are known to the network communications manager 40, it can use that information, along with the updated time value $T^U_{f_x}$ that is to be used for frame 51($f_x$) to generate an expected updated time value $T^E_{f_{x+1}}$ that is expected for the updated time stamp of the next frame 51($f_{x+1}$). After the synchrony group member's network communications manager 40 receives the next frame 51($f_{x+1}$), it can generate the updated time value $T^U_{f_{x+1}}$ and compare that value to the expected updated time value $T^E_{f_{x+1}}$. If the two time values do not correspond, or if the difference between them is above a selected threshold level, the clock that is used by the audio information channel device 23 to generate the time stamps is advancing at a different rate than the synchrony group member's digital to analog converter clock 34, and so the network communications manager 40 can adjust the rate of the digital to analog converter clock 34 to approach that of the clock used by the audio information channel device 23 so that the differential time value ΔT is constant. On the other hand, if the two time values do correspond, then the time differential value ΔT is constant, or the difference is below a threshold level, and the network communications manager 40 need not change the clock rate of the digital to analog converter clock 34. It will be appreciated that, if the clock rate is to be adjusted, the rate adjustment can be fixed, or it can vary based on, for example, the difference between the updated time value $T^U_{f_{x+1}}$ and the expected updated time value $T^E_{f_{x+1}}$.

It will also be appreciated that, if no rate adjustment is performed for one frame 51($f_{x+1}$), the synchrony group member's network communications manager 40 can generate an expected updated time value $T^E_{f_{x+1}}$ that is expected for the updated time stamp of the next frame 51($f_{x+2}$) using the updated time value $T^U_{f_x}$ determined for frame 51($f_x$), along with the number of samples in a frame and the sampling rate, and compare the expected updated time value $T^E_{f_{x+2}}$ to the updated time value $T^U_{f_{x+2}}$ that it generates when it receives frame 51($f_{x+2}$). At that point, if the network communications manager 41 determines that two time values do not correspond, or if the difference between them is above a selected threshold level, it can adjust the rate of the digital to analog converter clock 34. Similar operations can be performed if no rate adjustment is performed for several successive frames 51($f_{x+1}$), 51($f_{x+2}$), . . . . This will accommodate the possibility that the rate differential between the clock 34 and the clock used by the audio information channel device 23 in generating the time stamps have rates that differ by an amount sufficiently small that it cannot be detected using time stamps of two or more successive frames.

Instead or in addition to adjusting the clock rate as described above, the synchrony group member's network communications manager 40 can perform similar operations in connection with adjusting the clock rate in connection with the current time information that it receives from the audio information channel device 23.

Furthermore, although the network audio system 10 has been described such that the master device 21 of a synchrony group 20 can, in response to control information provided thereto by a user through the user interface module 13, provide a notification to a zone player 11($n$) that it is to become a member of its synchrony group 20 as a slave device 22($g$), it will be appreciated that the user interface module 13 can provide the notification directly to the zone player 11($n$) that is to become a member of the synchrony group 20. In that case, the zone player 11($n$) can notify the master device 21 that it is to become a slave device 22($g$) in the synchrony group 20, after which the master device 21 can provide information regarding the synchrony group 20, including the multi-cast and unicast addresses of the audio information channel device and other information as described above.

Similarly, although the network audio system 10 has been described such that the master device 21 of a synchrony group 20 can, in response to control information provided thereto by a user through the user interface module 13, provide a command to a slave device 22($g$) to enable the slave device 22($g$) to adjust its volume, it will be appreciated that the user interface module 13 can provide control information directly to the slave device 22($g$) to enable the slave device 22($g$) to adjust its volume.

In addition, although the network audio system 10 has been described such that each frames 51($f$) is associated with a frame sequence number (reference field 56, FIG. 4), it will be appreciated that, if the packets described above in connection with Packet Sequence A and Packet Sequence B are provided with packet sequence numbers, the frame sequence numbers need not be provided, since the packet sequence numbers can suffice for defining the frame sequencing.

Furthermore, although the network audio system 10 has been described such that the zone players 11($n$) are provided with an audio amplifier 35 for amplifying the analog signal provided by the respective digital to analog converters 33, it will be appreciated that a zone player may be provided that does not itself include an audio amplifier. In that case, the analog signal may be coupled to an external amplifier for amplification as necessary before being provided to the audio reproduction device(s) 15($n$)($r$). It will be appreciated that a single zone player 11($n$) may be provided with multiple audio amplifiers and audio reproduction device interfaces, and, if necessary, multiple digital to analog converters 33, to provide audio programs for corresponding numbers of synchrony groups.

Similarly, although the zone players 11($n$) have been described such that they may be connected to one or more audio information sources, it will be appreciated that an audio information source may form part of and be integrated into a zone player 11($n$). For example, a zone player may include a compact disk player, cassette tape player, broadcast radio receiver, or the like, that has been integrated into it. In addition, as noted above, an individual zone player 11($n$) may be connected to multiple audio information sources and may contemporaneously operate as the audio information channel device 23 for multiple synchrony groups.

In addition, although FIG. 1 shows the network audio system 10 as including one user interface module 13, it will be appreciated that the system 10 may include a plurality of user interface modules. Each user interface module be useful for controlling all of the zone players as described above, or alternatively one or more of the user interface modules may be useful for controlling selected subsets of the zone players.

Moreover, it will be appreciated that, although the invention has been described in connection with audio information, it will be appreciated that the invention will find utility in connection with any type of information for which synchrony among devices connected to a network is desired.

As noted above, while a zone player 11($n$) is operating as audio information channel device 23 for a synchrony group 20, when the zone player 11($n$)'s audio information source interface 30 or network communications manager 40 stores digital audio information frames based on audio information from an audio information source 14($n$)($s$) in the audio information buffer 31, it will provide time stamps for the respective frames to schedule them for playback after some time delay after they have been buffered in the audio information buffer 31. The delay is provided so that, for other zone players 11($n'$), 11($n''$), . . . that are operating as members of a synchrony group, there will be sufficient time for the audio and playback timing information to be transferred over the network 12 to those other zone players 11($n'$), 11($n''$), . . . so that it can be processed and played by them at the appropriate time as described above. The time period that is selected for the time delay may be fixed or variable, and in either case may be based on a number of factors. If the time period selected for the time delay is fixed, it may be based on, for example, factors such as an estimate of the maximum latency in the network 12, the estimated maximum loading of the various components comprising the zone players 11($n$), and other estimates as will be appreciated by those skilled in the art.

The time delay may be the same for audio information from all types of audio information sources, and may be constant over the entire period that the synchrony group 20 is playing an audio work. Alternatively, different time delays may be utilized based on various criteria. For example, if the audio information is to be played independently of information associated with other types of media, the time delay may be selected to be relatively long, on the order of a significant fraction of a second, or longer. On the other hand, if the audio information is to be played contemporaneously with, for example, video information, which may be supplied by, for example, a video disk, video tape cassette, over cable, satellite, or broadcast television, which may not be buffered or which may be displayed independently of the network audio system 10, it may be undesirable to provide for such a lengthy delay, since the time delay of the audio playback, in relation to the video display, may be noticeable. In that case, the zone player 11($n$) may provide for a much shorter time delay. In one embodiment, the time delay provided for audio information to be played concurrently with video information is selected to be generally on the order of fifty milliseconds, which would barely, if at all, be perceptible to someone viewing the video. Other desirable time delays for information from other types of sources will be apparent to those skilled in the art.

As yet a further possibility, the zone player 11($n$), when operating as an audio information channel device 23 for a synchrony group 20, can dynamically determine the time delay based on a number of conditions in the network audio system 10, including, for example, the message transfer latency in network 12, the loading of microprocessors or other components that are used in the various zone players 11(n'), 11(n"), . . . that may comprise a synchrony group 20, as well as other factors. For example, if the audio information channel device 23 determines that the latency in the network 12 has increased beyond a selected threshold, the audio information channel device 23 can adjust the delay to increase the likelihood that the members of the synchrony group 20 will be able to receive the packets and process the frames so that they will be able to play them at the appropriate times. Similarly, if the audio information channel device 23 is notified that a member of the synchrony group 20 to which it provides audio information requires additional time to receive and process the frames that it transmits, the audio information channel device 23 can adjust the delay accordingly. It will be appreciated that, to reduce or minimize possible discontinuities in the audio playback by the members of the synchrony group, the audio information channel device 23 can, instead of adjusting the time delay during a particular audio track, adjust the time delay between tracks, during silent periods of a track or otherwise as will be appreciated by those skilled in the art. In addition, the audio information channel device 23 can use conventional audio compression methodologies to facilitate a speeding up and/or slowing down of playback of an audio track while it is in the process of providing additional time delay. Generally, the members of the synchrony group 20 can provide notifications to the audio information channel device 23 if they determine that they will need an additional time delay, and the audio information channel device 23 can adjust the time delay in accordance with the notifications from the members of the synchrony group 20.

It will be appreciated that a system in accordance with the invention can be constructed in whole or in part from special purpose hardware or a general purpose computer system, or any combination thereof, any portion of which may be controlled by a suitable program. Any program may in whole or in part comprise part of or be stored on the system in a conventional manner, or it may in whole or in part be provided in to the system over a network or other mechanism for transferring information in a conventional manner. In addition, it will be appreciated that the system may be operated and/or otherwise controlled by means of information provided by an operator using operator input elements (not shown) which may be connected directly to the system or which may transfer the information to the system over a network or other mechanism for transferring information in a conventional manner.

The foregoing description has been limited to a specific embodiment of this invention. It will be apparent, however, that various variations and modifications may be made to the invention, with the attainment of some or all of the advantages of the invention. It is the object of the appended claims to cover these and such other variations and modifications as come within the true spirit and scope of the invention.

What is claimed as new and desired to be secured by Letters Patent of the United States is:

1. A method comprising:
    receiving, by a first playback device from a network device configured to control the first playback device and communicatively coupled to the first playback device over a network, first control information identifying a first audio information source, wherein the first audio information source is accessible by the first playback device via a wide area network (WAN);
    after receiving the first control information, (i) obtaining, by the first playback device from the first audio information source, first audio information; (ii) transmitting, by the first playback device to a second playback device, the first audio information, playback timing information associated with the first audio information, and device clock information of the first playback device; and (iii) playing back by the first playback device the first audio information in synchrony with the second playback device by using the playback timing information associated with the first audio information and the device clock information of the first playback device to play back the first audio information, wherein the first and second playback devices remain independently clocked during synchronous playback of the first audio information;
    receiving, by the first playback device from a second network device configured to control the first playback device and communicatively coupled to the first playback device, second control information identifying a second audio information source; and
    after receiving the second control information, (i) obtaining, by the first playback device from the second audio information source, second audio information and (ii) playing back, by the first playback device, the second audio information.

2. The method of claim 1, further comprising:
    after receiving the first control information, additionally (i) generating, by the first playback device, the playback timing information associated with the first audio information; and (ii) generating, by the first playback device, the device clock information of the first playback device.

3. The method of claim 1, wherein the first control information further comprises one or more instructions for the first playback device and the second playback device to playback audio information.

4. The method of claim 3, wherein the first and second playback devices are members of a synchrony group, and wherein the method further comprises:
    transmitting, by the first playback device to the network device, status information that comprises a status of the synchrony group.

5. The method of claim 4, wherein the status information further comprises an identification of each playback device in the synchrony group.

6. The method of claim 5, wherein the status information further comprises an identification of a master playback device of the synchrony group.

7. The method of claim 6, wherein the first playback device is the master playback device of the synchrony group.

8. A first playback device comprising:
    one or more processors;
    a network interface; and
    tangible, non-transitory computer-readable memory comprising program instructions that, when executed by the one or more processors, cause the first playback device to:
    receive, via the network interface from a first network device configured to control the first playback device and communicatively coupled to the first playback device over a network, first control information identifying a first audio information source, wherein the first audio information source is accessible by the first playback device via a wide area network (WAN);
    after receiving the first control information, (i) obtain, via the network interface from the first audio information source, first audio information; (ii) transmit, via the network interface of the first playback device to a second playback device, the first audio information, playback timing information associated with the first audio information, and device clock information of the first playback device; and (iii) play back the first audio information in synchrony with the second playback device by using the playback timing information associated with the first audio information and the device clock information of the first playback device to play back the first audio information, wherein the first and second playback devices remain independently clocked during synchronous playback of the first audio information;

receive, via the network interface from a second network device configured to control the first playback device and communicatively coupled to the first playback device, second control information identifying a second audio information source; and after receiving the second control information, (i) obtain, via the network interface from the second audio information source, second audio information and (ii) play back the second audio information.

9. The first playback device of claim 8, wherein the program instructions, when executed by the one or more processors, further cause the first playback device to:
generate the playback timing information associated with the first audio information; and
generate the device clock information of the first playback device.

10. The first playback device of claim 8, wherein the first control information further comprises one or more instructions for the first playback device and the second playback device to playback audio information.

11. The first playback device of claim 10, wherein the first and second playback devices are members of a synchrony group, and wherein the program instructions, when executed by the one or more processors, further cause the first playback device to:
transmit, to the first network device, status information that comprises a status of the synchrony group.

12. The first playback device of claim 11, wherein the status information further comprises an identification of each playback device in the synchrony group.

13. The first playback device of claim 11, wherein the status information further comprises an identification of a master playback device of the synchrony group.

14. The first playback device of claim 8, wherein the network is a local area network (LAN).

15. The first playback device of claim 8 wherein the program instructions, when executed by the one or more processors, further cause the first playback device to:
transmit, via the network interface of the first playback device to the second playback device, the second audio information, playback timing information associated with the second audio information, and device clock information of the first playback device.

16. The first playback device of claim 15, wherein the network comprises the WAN.

17. The first playback device of claim 8, wherein the first audio information source and the second audio information source are accessible via a same network location.

18. The first playback device of claim 8, wherein the first audio information source is an Internet-accessible audio information source, and wherein obtaining, from the first audio information source, the first audio information, comprises obtaining the first audio information from the Internet-accessible audio information source.

19. The first playback device of claim 8, wherein obtaining, from the first audio information source, the first audio information, comprises sending, to the first audio information source, a request for the first audio information.

20. A tangible non-transitory computer-readable medium having instructions stored thereon that, when executed, cause a first playback device to:
receive, via a network interface from a first network device configured to control the first playback device and communicatively coupled to the first playback device over a network, first control information identifying a first audio information source, wherein the first audio information source is accessible by the first playback device via a wide area network (WAN);
after receiving the first control information, (i) obtain, via the network interface from the first audio information source, first audio information; (ii) transmit, via the network interface of the first playback device to a second playback device, the first audio information, playback timing information associated with the first audio information, and device clock information of the first playback device; and (iii) play back the first audio information in synchrony with the second playback device by using the playback timing information associated with the first audio information and the device clock information of the first playback device to play back the first audio information, wherein the first and second playback devices remain independently clocked during synchronous playback of the first audio information;
receive, via the network interface from a second network device configured to control the first playback device and communicatively coupled to the first playback device, second control information identifying a second audio information source; and
after receiving the second control information, (i) obtain, via the network interface from the second audio information source, second audio information and (ii) play back the second audio information.

* * * * *